US012178093B2

(12) United States Patent
Yamazaki et al.

(10) Patent No.: US 12,178,093 B2
(45) Date of Patent: Dec. 24, 2024

(54) DISPLAY APPARATUS, DISPLAY MODULE, AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Koji Kusunoki, Kanagawa (JP); Kazunori Watanabe, Tokyo (JP); Susumu Kawashima, Kanagawa (JP); Daisuke Kubota, Kanagawa (JP); Taisuke Kamada, Saitama (JP); Ryo Hatsumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 377 days.

(21) Appl. No.: 17/642,425

(22) PCT Filed: Sep. 9, 2020

(86) PCT No.: PCT/IB2020/058348
§ 371 (c)(1),
(2) Date: Mar. 11, 2022

(87) PCT Pub. No.: WO2021/053459
PCT Pub. Date: Mar. 25, 2021

(65) Prior Publication Data
US 2022/0344443 A1 Oct. 27, 2022

(30) Foreign Application Priority Data
Sep. 20, 2019 (JP) .................................. 2019-171525

(51) Int. Cl.
*H01L 29/08* (2006.01)
*H10K 50/11* (2023.01)
(Continued)

(52) U.S. Cl.
CPC ........... *H10K 59/131* (2023.02); *H10K 50/11* (2023.02); *H10K 50/15* (2023.02); *H10K 50/16* (2023.02);
(Continued)

(58) Field of Classification Search
CPC ............. H10K 59/131; H10K 59/1213; H10K 59/1216; H10K 50/16; H10K 50/11; H10K 50/15; H10K 77/111; H10K 2101/40
(Continued)

(56) References Cited

U.S. PATENT DOCUMENTS

| 7,348,946 B2 | 3/2008 | Booth, Jr. et al. |
| 7,545,350 B2 | 6/2009 | Nakamura et al. |

(Continued)

FOREIGN PATENT DOCUMENTS

| CN | 001608281 A | 4/2005 |
| JP | 2001-203078 A | 7/2001 |

(Continued)

OTHER PUBLICATIONS

International Search Report (Application No. PCT/IB2020/058348) Dated Dec. 8, 2020.

(Continued)

*Primary Examiner* — Phuc T Dang
(74) *Attorney, Agent, or Firm* — Fish & Richardson P.C.

(57) ABSTRACT

The resolution of a display apparatus having a light detection function is increased. A display apparatus includes a plurality of transistors and a light-emitting and light-receiving device in a subpixel. The light-emitting and light-receiving device has a function of emitting light of a first color and a function of receiving light of a second color. One of a source and a drain of a first transistor is electrically connected to a first wiring, and the other thereof is electrically
(Continued)

cally connected to a gate of a second transistor. One electrode of the light-emitting and light-receiving device is electrically connected to one of a source and a drain of the second transistor, one of a source and a drain of a third transistor, and one of a source and a drain of a fifth transistor. One of a source and a drain of a fourth transistor is electrically connected to a second wiring, and the other thereof is electrically connected to the other of the source and the drain of the third transistor.

13 Claims, 23 Drawing Sheets

(51) Int. Cl.
    *H10K 50/15*          (2023.01)
    *H10K 50/16*          (2023.01)
    *H10K 59/121*        (2023.01)
    *H10K 59/131*        (2023.01)
    *H10K 77/10*          (2023.01)
    *H10K 101/40*        (2023.01)

(52) U.S. Cl.
    CPC ..... *H10K 59/1213* (2023.02); *H10K 59/1216* (2023.02); *H10K 77/111* (2023.02); *H10K 2101/40* (2023.02)

(58) Field of Classification Search
    USPC .......................................................... 257/40
    See application file for complete search history.

(56) References Cited

U.S. PATENT DOCUMENTS

| | | |
|---|---|---|
| 8,026,879 B2 | 9/2011 | Booth, Jr. et al. |
| 8,963,817 B2 | 2/2015 | Booth, Jr. et al. |
| 9,088,006 B2 | 7/2015 | Yamazaki et al. |
| 9,627,648 B2 | 4/2017 | Yamazaki et al. |
| 9,665,211 B2 | 5/2017 | Booth et al. |
| 10,003,047 B2 | 6/2018 | Yamazaki et al. |
| 10,032,834 B2 | 7/2018 | Udaka et al. |
| 10,241,624 B2 | 3/2019 | Booth et al. |
| 10,381,599 B2 | 8/2019 | Yamazaki et al. |
| 10,431,164 B2 | 10/2019 | Okamoto |
| 10,903,453 B2 | 1/2021 | Yamazaki et al. |
| 2003/0122749 A1 | 7/2003 | Booth, Jr. et al. |
| 2004/0165102 A1 | 8/2004 | Komatsu et al. |
| 2005/0099372 A1 | 5/2005 | Nakamura et al. |
| 2005/0195318 A1 | 9/2005 | Komatsu et al. |
| 2005/0264227 A1 | 12/2005 | Tateuchi |
| 2009/0079345 A1 | 3/2009 | Inuiya |
| 2014/0055042 A1 | 2/2014 | Tateuchi |
| 2015/0243217 A1 | 8/2015 | Park et al. |
| 2017/0365224 A1 | 12/2017 | Okamoto |
| 2018/0226466 A1* | 8/2018 | Yamamoto ............. H10K 59/35 |
| 2019/0164491 A1* | 5/2019 | Kim .................... H10K 59/131 |
| 2019/0363310 A1* | 11/2019 | Nakamura ............. H10K 71/00 |
| 2020/0395576 A1 | 12/2020 | Yamazaki et al. |

FOREIGN PATENT DOCUMENTS

| | | |
|---|---|---|
| JP | 2003-338372 A | 11/2003 |
| JP | 2004-260798 A | 9/2004 |
| JP | 2005-148285 A | 6/2005 |
| JP | 2005-165251 A | 6/2005 |
| JP | 2005-268354 A | 9/2005 |
| JP | 2005-338428 A | 12/2005 |
| JP | 2005-539247 | 12/2005 |
| JP | 2009-081296 A | 4/2009 |
| JP | 2014-197522 A | 10/2014 |
| JP | 2017-227896 A | 12/2017 |
| JP | 7488825 | 5/2024 |
| KR | 2005-0045851 A | 5/2005 |
| KR | 2015-0101504 A | 9/2015 |
| TW | 556137 | 10/2003 |
| TW | 200527354 | 8/2005 |
| WO | WO-2003/058588 | 7/2003 |
| WO | WO-2014/024582 | 2/2014 |

OTHER PUBLICATIONS

Written Opinion (Application No. PCT/IB2020/058348) Dated Dec. 8, 2020.

\* cited by examiner

FIG. 3A  Image display

FIG. 7A
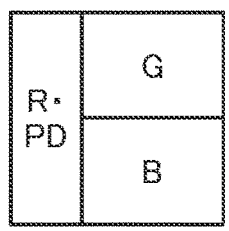
FIG. 7B
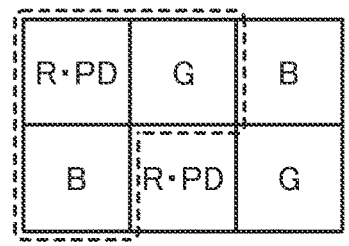
FIG. 7C
FIG. 7D
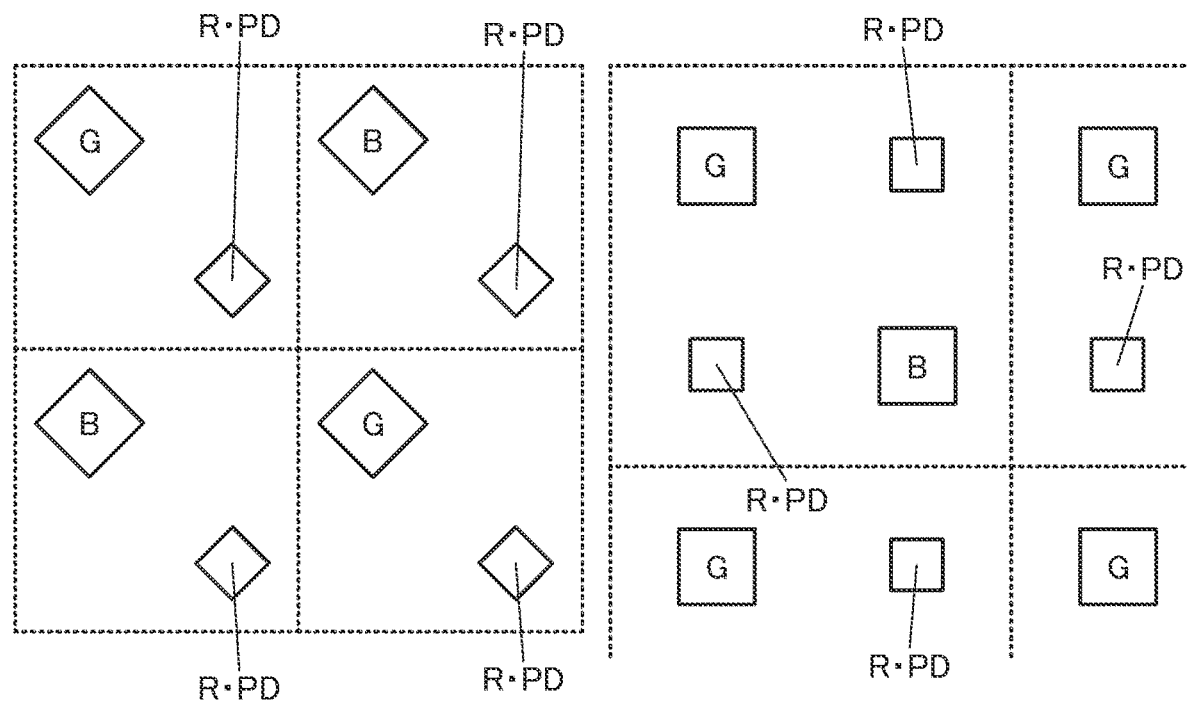

DISPLAY APPARATUS, DISPLAY MODULE, AND ELECTRONIC DEVICE

CROSS REFERENCE TO RELATED APPLICATIONS

This application is a U.S. National Phase Application under 35 U.S.C. § 371 of International Application PCT/IB2020/058348, filed on Sep. 9, 2020, which is incorporated by reference and claims the benefit of a foreign priority application filed in Japan on Sep. 20, 2019, as Application No. 2019-171525.

TECHNICAL FIELD

One embodiment of the present invention relates to a display apparatus, a display module, and an electronic device. One embodiment of the present invention relates to a display apparatus including a light-emitting and light-receiving device (also referred to as a light-emitting and light-receiving element) and a light-emitting device (also referred to as a light-emitting element).

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

Recent display apparatuses have been expected to be applied to a variety of uses. Examples of uses for large-size display apparatuses include television devices for home use (also referred to as a TV or a television receiver), digital signage, and PIDs (Public Information Display). In addition, a smartphone and a tablet terminal including a touch panel are being developed as portable information terminals.

Light-emitting apparatuses including light-emitting devices have been developed as display apparatuses. Light-emitting devices (also referred to as EL devices or EL elements) utilizing electroluminescence (hereinafter referred to as EL) have features such as ease of reduction in thickness and weight, high-speed response to input signals, and driving with a direct-current low voltage source, and have been used in display apparatuses. For example, Patent Document 1 discloses a flexible light-emitting apparatus using an organic EL device (also referred to as organic EL element).

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display apparatus having a light detection function. An object of one embodiment of the present invention is to increase the resolution of a display apparatus having a light detection function. An object of one embodiment of the present invention is to provide a highly convenient display apparatus. An object of one embodiment of the present invention is to provide a multifunctional display apparatus. An object of one embodiment of the present invention is to provide a display apparatus with a high aperture ratio. An object of one embodiment of the present invention is to provide a novel display apparatus.

An object of one embodiment of the present invention is to improve the manufacturing yield of a display apparatus having a light detection function. An object of one embodiment of the present invention is to reduce the number of steps for a display apparatus having a light detection function. An object of one embodiment of the present invention is to reduce the manufacturing cost of a display apparatus having a light detection function.

Note that the description of these objects does not preclude the existence of other objects. One embodiment of the present invention does not need to achieve all these objects. Other objects can be derived from the description of the specification, the drawings, and the claims.

Means for Solving the Problems

One embodiment of the present invention is a display apparatus including a pixel, a first wiring, a second wiring, and a third wiring. The pixel includes a first subpixel. The first subpixel includes first to eighth transistors, a first capacitor, and a light-emitting and light-receiving device. One of a source and a drain of the first transistor is electrically connected to the first wiring, and the other of the source and the drain of the first transistor is electrically connected to a gate of the second transistor and one electrode of the first capacitor. One electrode of the light-emitting and light-receiving device is electrically connected to one of a source and a drain of the second transistor, one of a source and a drain of the third transistor, and one of a source and a drain of the fifth transistor. One of a source and a drain of the fourth transistor is electrically connected to the second wiring, and the other of the source and the drain of the fourth transistor is electrically connected to the other of the source and the drain of the third transistor and the other electrode of the first capacitor. The other of the source and the drain of the fifth transistor is electrically connected to one of a source and a drain of the sixth transistor and a gate of the seventh transistor. One of a source and a drain of the seventh transistor is electrically connected to one of a source and a drain of the eighth transistor. The other of the source and the drain of the eighth transistor is electrically connected to the third wiring. The light-emitting and light-receiving device has a function of emitting light of a first color and a function of receiving light of a second color.

The first wiring is preferably supplied with a first data potential. The second wiring is preferably supplied with a second data potential in a first period and a reset potential in a second period. The third wiring is preferably supplied with a potential corresponding to charge generated in the light-emitting and light-receiving device.

The display apparatus of one embodiment of the present invention preferably further includes fourth to eighth wirings. It is preferable that a gate of the first transistor and a gate of the third transistor be electrically connected to the fourth wiring. It is preferable that a gate of the fourth transistor be electrically connected to the fifth wiring. It is preferable that a gate of the fifth transistor be electrically connected to the sixth wiring. It is preferable that a gate of the sixth transistor be electrically connected to the seventh wiring. It is preferable that a gate of the eighth transistor be electrically connected to the eighth wiring.

The first subpixel preferably further includes a second capacitor. It is preferable that one electrode of the second capacitor be electrically connected to the other of the source and the drain of the first transistor, the gate of the second transistor, and the one electrode of the first capacitor. It is preferable that the other electrode of the second capacitor be electrically connected to the one electrode of the light-emitting and light-receiving device, the one of the source and the drain of the second transistor, the one of the source and the drain of the third transistor, and the one of the source and the drain of the fifth transistor.

The display apparatus of one embodiment of the present invention preferably further includes a ninth wiring. The pixel preferably further includes a second subpixel. The second subpixel preferably includes ninth to eleventh transistors and a light-emitting device. It is preferable that one of a source and a drain of the ninth transistor be electrically connected to the ninth wiring and the other of the source and the drain of the ninth transistor be electrically connected to a gate of the tenth transistor. It is preferable that one electrode of the light-emitting device be electrically connected to one of a source and a drain of the tenth transistor and one of a source and a drain of the eleventh transistor. The light-emitting device preferably has a function of emitting light of the second color.

It is preferable that the other of the source and the drain of the eleventh transistor be electrically connected to the second wiring. Alternatively, the second subpixel preferably further includes a twelfth transistor. It is preferable that one of a source and a drain of the twelfth transistor be electrically connected to the second wiring and the other of the source and the drain of the twelfth transistor be electrically connected to the other of the source and the drain of the eleventh transistor.

The light-emitting device preferably includes a hole-injection layer, a light-emitting layer, and an electron-transport layer. The hole-injection layer preferably contains a first compound and a second compound. The electron-transport layer preferably contains an electron-transport material. The first compound preferably has a property of accepting an electron from the second compound. The second compound preferably has a HOMO level higher than or equal to $-5.7$ eV and lower than or equal to $-5.4$ eV. It is preferable that the electron-transport material have a HOMO level higher than or equal to $-6.0$ eV and an electron mobility higher than or equal to $1\times10^{-7}$ cm$^2$/Vs and lower than or equal to $5\times10^{-5}$ cm$^2$/Vs when the square root of electric field strength [V/cm] is 600.

Alternatively, the light-emitting device preferably includes a light-emitting layer and an electron-transport layer. The electron-transport layer preferably contains an electron-transport material and a first substance. The first substance is preferably a metal, a metallic salt, a metal oxide, or an organometallic complex. The electron-transport layer preferably includes a first region and a second region. The first region and the second region preferably differ in a concentration of the first substance.

The light-emitting and light-receiving device and the light-emitting device are preferably provided on the same plane.

A display apparatus of one embodiment of the present invention preferably has flexibility. For example, the first to eighth transistors are preferably positioned over a substrate having flexibility.

One embodiment of the present invention is a module that includes the display apparatus having any of the above structures. For example, the module is a module provided with a connector such as a flexible printed circuit (hereinafter referred to as an FPC) or a TCP (Tape Carrier Package) or a module mounted with an integrated circuit (IC) by a COG (Chip On Glass) method, a COF (Chip On Film) method, or the like.

One embodiment of the present invention is an electronic device including the above module and at least one of an antenna, a battery, a housing, a camera, a speaker, a microphone, and an operation button.

Effect of the Invention

One embodiment of the present invention can provide a display apparatus having a light detection function. One embodiment of the present invention can increase the resolution of a display apparatus having a light detection function. One embodiment of the present invention can provide a highly convenient display apparatus. One embodiment of the present invention can provide a multifunctional display apparatus. One embodiment of the present invention can provide a display apparatus with a high aperture ratio. One embodiment of the present invention can provide a novel display apparatus.

One embodiment of the present invention can improve the manufacturing yield of a display apparatus having a light detection function. One embodiment of the present invention can reduce the number of steps for a display apparatus having a light detection function. One embodiment of the present invention can reduce the manufacturing cost of a display apparatus having a light detection function.

Note that the description of these effects does not preclude the existence of other effects. One embodiment of the present invention does not need to have all these effects. Other effects can be derived from the description of the specification, the drawings, and the claims.

BRIEF DESCRIPTION OF THE DRAWINGS

FIG. 3A and FIG. 3B are diagrams showing examples of a driving method of a display apparatus.

FIG. 7A to FIG. 7D are top views illustrating examples of pixels.

MODE FOR CARRYING OUT THE INVENTION

Figure 1:
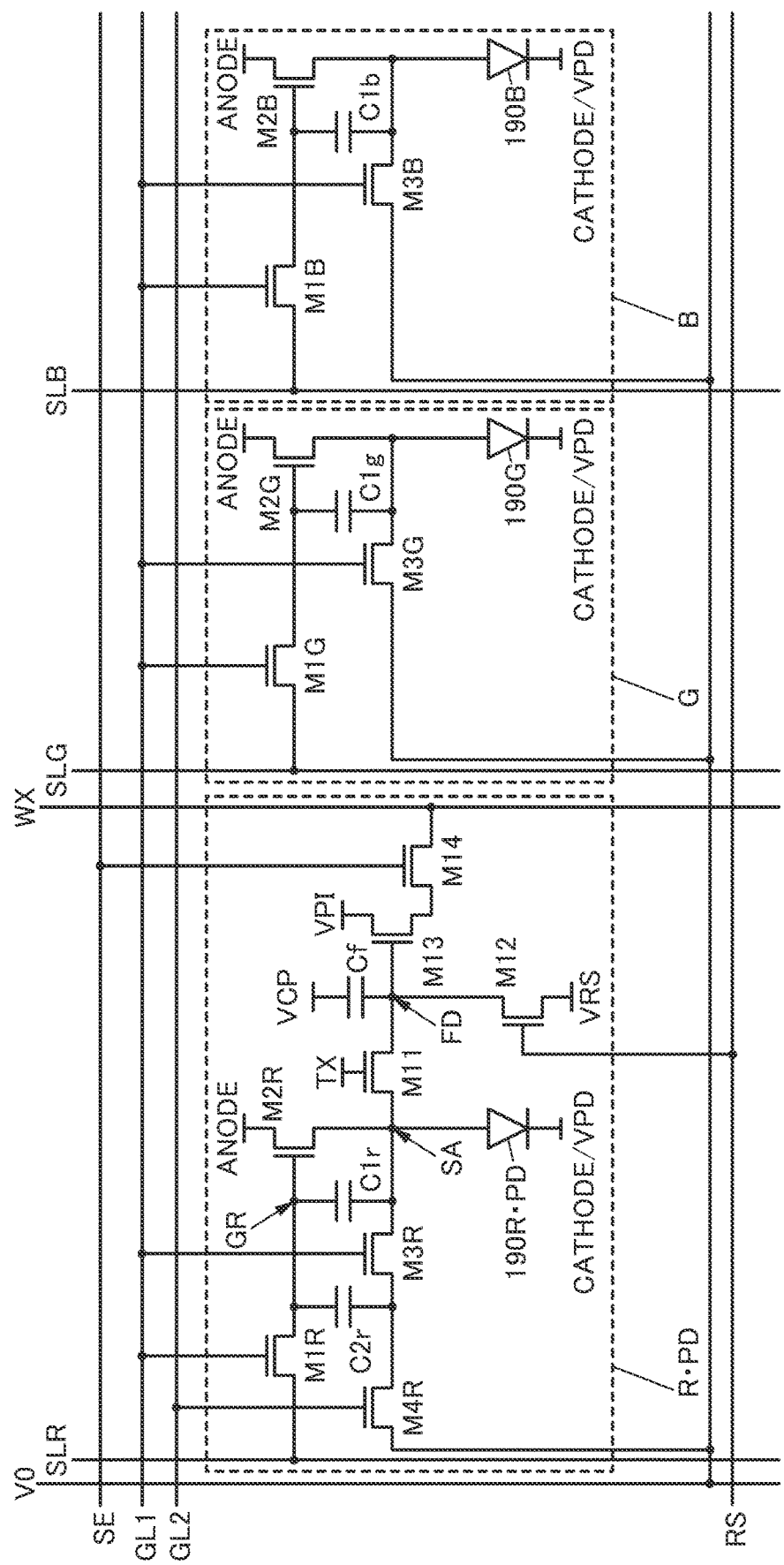
FIG. 1 is a circuit diagram illustrating an example of a pixel circuit.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure shown in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display apparatus of one embodiment of the present invention and a driving method thereof will be described with reference to FIG. 1 to FIG. 5.

A display portion of the display apparatus of one embodiment of the present invention has a function of displaying an image with the use of a light-emitting device. Furthermore, the display portion also has one or both of an image capturing function and a sensing function.

In the display apparatus of one embodiment of the present invention, a pixel includes a plurality of subpixels exhibiting different colors. A subpixel exhibiting one color includes a light-emitting and light-receiving device instead of a light-emitting device, and subpixels exhibiting the other colors each include a light-emitting device. The light-emitting and light-receiving device has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving device, and the other subpixels each include a light-emitting device. Thus, the display portion of the display apparatus of one embodiment of the present invention has a function of displaying an image using both a light-emitting and light-receiving device and a light-emitting device.

The light-emitting and light-receiving device functions as both a light-emitting device and a light-receiving device, whereby the pixel can have a light-receiving function without an increase in the number of subpixels included in the pixel. Thus, the display portion of the display apparatus can be provided with one or both of an image capturing function and a sensing function while keeping the aperture ratio of the pixel (aperture ratio of each subpixel) and the resolution of the display apparatus. Accordingly, in the display apparatus of one embodiment of the present invention, the aperture ratio of the pixel can be more increased and the resolution can be increased more easily than in a display apparatus provided with a subpixel including a light-receiving device separately from a subpixel including a light-emitting device In the display apparatus of one embodiment of the present invention, two kinds of data potentials (e.g., the potential of image data and the potential of correction data) can be combined, so that a potential supplied to a gate of a driving transistor of the light-emitting and light-receiving device can be generated. When two kinds of data potentials are combined, for example, grayscale correction can be performed. In addition, a potential higher than the maximum potential that can be supplied from a driver circuit (a source driver circuit) for supplying a first data potential and a second data potential can be generated in the subpixel. Accordingly, the power supply voltage of the driver circuit can be lowered, and the power consumption of the driver circuit can be reduced.

Note that in the display apparatus of one embodiment of the present invention, a structure in which two kinds of data potentials are combined to generate a potential supplied to a gate of a driving transistor of the light-emitting device can also be applied to the subpixel including the light-emitting device.

Pixel Structure Example 1

FIG. 1 illustrates a circuit diagram of one pixel of a display apparatus.

The pixel illustrated in FIG. 1 includes a subpixel (RPD) that exhibits red light and has a light-receiving function, a subpixel (G) that exhibits green light, and a subpixel (B) that exhibits blue light. The pixel illustrated in FIG. 1 is connected with a wiring GL1, a wiring GL2, a wiring SE, a wiring V0, a wiring SLR, a wiring SLG, a wiring SLB, a wiring WX, a wiring RS, a wiring TX, a wiring VCP, a wiring VRS, a wiring VPI, a wiring ANODE, and a wiring CATHODE/VPD.

The subpixel (RPD) that exhibits red light and has a light-receiving function includes a transistor M1R, a transistor M2R, a transistor M3R, a transistor M4R, a transistor M11, a transistor M12, a transistor M13, a transistor M14, a capacitor C1r, a capacitor C2r, a capacitor Cf, and a light-emitting and light-receiving device 190R•PD. The transistor M1R, the transistor M3R, the transistor M4R, the transistor M11, the transistor M12, and the transistor M14 each function as a switch.

The light-emitting device and light-receiving 190R•PD has a function of emitting red light and a function of receiving one or both of green light and blue light. Although an example in which the subpixel that exhibits red light includes the light-emitting and light-receiving device is described in this embodiment, the subpixel that exhibits green light or blue light may include a light-emitting and light-receiving device.

A gate of the transistor M1R is electrically connected to the wiring GL1, one of a source and a drain of the transistor M1R is electrically connected to the wiring SLR, and the other thereof is electrically connected to a gate of the transistor M2R, one electrode of the capacitor C1r, and one electrode of the capacitor C2r. One of a source and a drain of the transistor M2R is electrically connected to one of a source and a drain of the transistor M3R, one of a source and a drain of the transistor M11, the other electrode of the capacitor C1r, and an anode of the light-emitting and light-receiving device 190R•PD, and the other thereof is electrically connected to the wiring ANODE. A gate of the transistor M3R is electrically connected to the wiring GL1, and the other of the source and the drain of the transistor M3R is electrically connected to one of a source and a drain of the transistor M4R and the other electrode of the capacitor C2r. A gate of the transistor M4R is electrically connected to the wiring GL2, and the other of the source and the drain of the transistor M4R is electrically connected to the wiring V0. A gate of the transistor M11 is electrically connected to the wiring TX, and the other of the source and the drain of the transistor M11 is electrically connected to one of a source and a drain of the transistor M12, a gate of the transistor M13, and one electrode of the capacitor Cf. A gate of the transistor M12 is electrically connected to the wiring RS, and the other of the source and the drain of the transistor M12 is electrically connected to the wiring VRS. One of a source and a drain of the transistor M13 is electrically connected to one of a source and a drain of the transistor M14, and the other thereof is electrically connected to the wiring VPI. A gate of the transistor M14 is electrically connected to the wiring SE, and the other of the source and the drain of the transistor M14 is electrically connected to the wiring WX. The other electrode of the capacitor Cf is electrically connected to the wiring VCP. A cathode of the light-emitting and light-receiving device 190R•PD is electrically connected to the wiring CATHODE/VPD.

The subpixel (G) that exhibits green light includes a transistor M1G, a transistor M2G, a transistor M3G, a capacitor C1g, and a light-emitting device 190G. The transistor M1G and the transistor M3G each function as a switch.

A gate of the transistor M1G is electrically connected to the wiring GL1, one of a source and a drain of the transistor M1G is electrically connected to the wiring SLG, and the other thereof is electrically connected to a gate of the transistor M2G and one electrode of the capacitor C1g. One of a source and a drain of the transistor M2G is electrically connected to one of a source and a drain of the transistor M3G, the other electrode of the capacitor C1g, and an anode of the light-emitting device 190G, and the other thereof is electrically connected to the wiring ANODE. A gate of the transistor M3G is electrically connected to the wiring GL1, and the other of the source and the drain of the transistor M3G is electrically connected to the wiring V0. A cathode of the light-emitting device 190G is electrically connected to the wiring CATHODE/VPD.

The subpixel (B) that exhibits blue light includes a transistor M1B, a transistor M2B, a transistor M3B, a capacitor C1b, and a light-emitting device 190B. The transistor M1B and the transistor M3B each function as a switch.

A gate of the transistor M1B is electrically connected to the wiring GL1, one of a source and a drain of the transistor M1B is electrically connected to the wiring SLB, and the other thereof is electrically connected to a gate of the transistor M2B and one electrode of the capacitor C1b. One of a source and a drain of the transistor M2B is electrically connected to one of a source and a drain of the transistor M3B, the other electrode of the capacitor C1b, and an anode of the light-emitting device 190B, and the other thereof is electrically connected to the wiring ANODE. A gate of the transistor M3B is electrically connected to the wiring GL1, and the other of the source and the drain of the transistor M3B is electrically connected to the wiring V0. A cathode of the light-emitting device 190B is electrically connected to the wiring CATHODE/VPD.

Selection signals for controlling operations of the transistors are supplied to the wiring GL1, the wiring GL2, the wiring SE, the wiring TX, and the wiring RS. The selection signals each include a potential for bringing a transistor into a conduction state (also referred to as an on state) and a potential for bringing a transistor into a non-conduction state (also referred to as an off state).

An image signal is supplied to each of the wiring SLR, the wiring SLG, and the wiring SLB. For example, a first data potential D is supplied to the wiring SLR (see FIG. 4A).

Figure 4A:
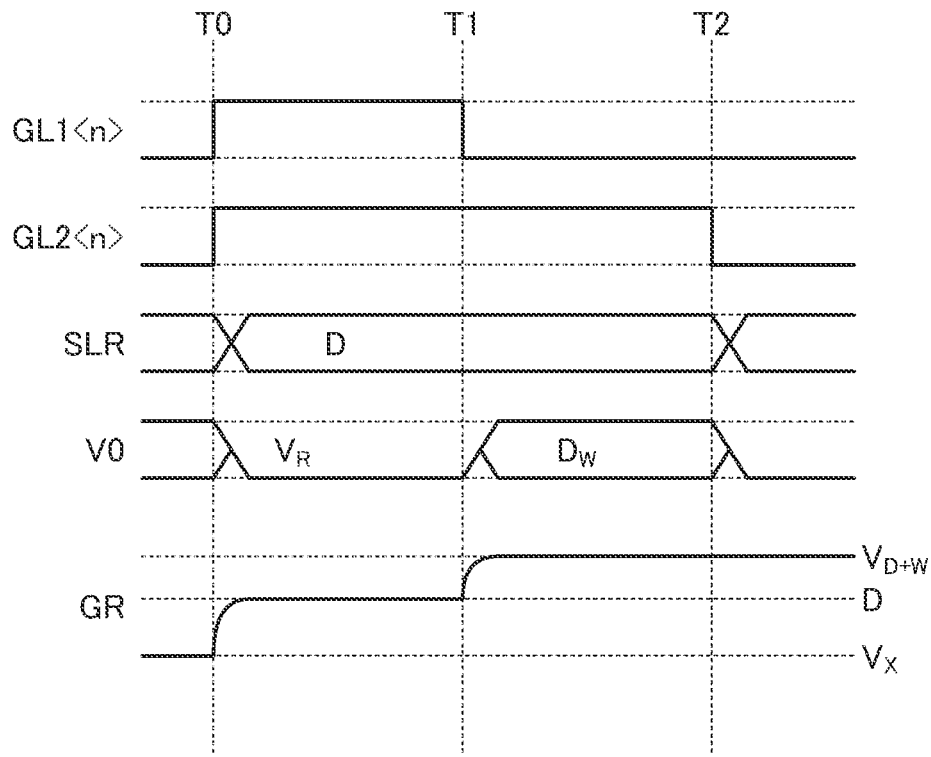
FIG. 4A and FIG. 4B are timing charts showing an example of a driving method of a display apparatus.

A second data potential $D_w$ and a reset potential $V_R$ are supplied to the wiring V0 in different periods (see FIG. 4A).

Predetermined potentials are supplied to the wiring VPI, the wiring VCP, the wiring VRS, the wiring ANODE, and the wiring CATHODE/VPD. A potential higher than the maximum value of a potential applied to the gate of the transistor M13 is supplied to the wiring VPI. An arbitrary potential (e.g., 0 V) can be supplied to the wiring VCP. A potential lower than that of the wiring CATHODE/VPD is supplied to the wiring VRS. A potential higher than that of the wiring CATHODE/VPD is supplied to the wiring ANODE.

The transistor M1R, the transistor M1G, the transistor M1B, the transistor M3R, the transistor M3G, and the transistor M3B are controlled by a signal supplied to the wiring GL1 and function as selection transistors for controlling the selection states of the pixels.

The transistor M2R functions as a driving transistor that controls a current flowing through the light-emitting and light-receiving device 190R•PD in accordance with a potential supplied to the gate. Similarly, the transistor M2G and the transistor M2B each function as a driving transistor that controls a current flowing through the light-emitting device 190G or the light-emitting device 190B in accordance with a potential supplied to the gate.

The transistor M1R functions as a switch for controlling the conduction and non-conduction between the wiring SLR and the gate of the transistor M2R. When the transistor M1R is in a conduction state, the first data potential D supplied to the wiring SLR is supplied to the gate of the transistor M2R.

When the transistor M1R is in the conduction state, the transistor M3R is also in a conduction state at the same time. The transistor M3R functions as a switch for supplying the reset potential to the anode of the light-emitting and light-receiving device 190R•PD. When the transistor M1R and the transistor M3R are in the conduction states, the transistor M4R is in a conduction state at the same time. At this time, the reset potential is supplied to the wiring V0. Thus, the reset potential can be supplied to the anode of the light-emitting and light-receiving device 190R•PD.

When the first data potential D and the reset potential are supplied in the same period, the gate—source voltage of the transistor M2R can be determined regardless of the electrical characteristics of the light-emitting and light-receiving device 190R•PD. Accordingly, the display quality of the display apparatus can be improved.

The one electrode of the capacitor C2r is electrically connected to the gate of the transistor M2R. The transistor M4R functions as a switch for controlling the conduction and non-conduction between the other electrode of the capacitor C2r and the wiring V0. When the second data potential is supplied to the wiring V0, the transistor M1R and the transistor M3R are in non-conduction states and the transistor M4R is in the conduction state. When the transistor M4R is in the conduction state, the second data potential can be supplied to the other electrode of the capacitor C2r through the transistor M4R.

After the first data potential is supplied to the gate of the transistor M2R, the transistor M1R is in the non-conduction state so that the gate of the transistor M2R is in a floating state, and the second data potential is supplied to the other electrode of the capacitor C2r through the transistor M4R. The potential of the gate of the transistor M2R (the potential of a node GR) is changed from the first data potential in accordance with the second data potential by capacitive coupling through the capacitor C2r. The light-emitting and light-receiving device 190R•PD can emit light with a luminance corresponding to the potential of the node GR.

The wiring V0 can function as a wiring for supplying the second data potential and a wiring for supplying the reset potential. Accordingly, even in a multifunctional display apparatus, the number of wirings can be reduced, so that higher resolution can be achieved.

In addition, the wiring V0 may be a wiring for supplying the second data potential and the reset potential to two or more subpixels. This is preferable because the number of wirings included in the display apparatus can be further reduced.

When the transistor M1G is in a conduction state, the transistor M3G is also in a conduction state at the same time; thus, a potential supplied to the wiring SLG is supplied to the gate of the transistor M2G and the reset potential supplied to the wiring V0 is supplied to the source or the drain of the transistor M3G. The light-emitting device 190G can emit light with a luminance corresponding to the gate potential of the transistor M2G. When the transistor M1B is in a conduction state, the transistor M3B is also in a conduction state at the same time; thus, a potential supplied to the wiring SLB is supplied to the gate of the transistor M2B and the reset potential supplied to the wiring V0 is supplied to the source or the drain of the transistor M3B. The light-emitting device 190B can emit light with a luminance corresponding to the gate potential of the transistor M2B.

The transistor M11 is controlled by a signal supplied to the wiring TX and has a function of controlling the timing at which the potential of a node FD changes, in accordance with a current flowing through the light-emitting and light-receiving device 190R•PD. The transistor M12 is controlled by a signal supplied to the wiring RS and has a function of resetting the potential of the node FD by setting the potential of the node FD connected to the gate of the transistor M13 to a potential supplied to the wiring VRS. The transistor M13 functions as an amplifier transistor that performs output corresponding to the potential of the node FD. The transistor M14 is controlled by a signal supplied to the wiring SE and functions as a selection transistor for reading an output corresponding to the potential of the node FD by an external circuit connected to the wiring WX.

In the display apparatus of one embodiment of the present invention, it is preferable to use transistors including a metal oxide (also referred to as an oxide semiconductor) in their semiconductor layers where channels are formed (such transistors are hereinafter also referred to as OS transistors) as all the transistors included in the pixel illustrated in FIG. 1. An OS transistor has an extremely low off-state current and enables charge accumulated in a capacitor that is connected in series with the transistor to be retained for a long time. Furthermore, power consumption of the display apparatus can be reduced with an OS transistor.

Alternatively, in the display apparatus of one embodiment of the present invention, it is preferable to use transistors including silicon in their semiconductor layers where channels are formed (such transistors are hereinafter also referred to as Si transistors) as all the transistors included in the pixel illustrated in FIG. 1. As silicon, single crystal silicon, polycrystalline silicon, amorphous silicon, and the like can be given. It is particularly preferable to use transistors including low temperature poly-silicon (LTPS) in their semiconductor layers (such transistors are hereinafter also referred to as LTPS transistors). An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display apparatus can be simplified, and costs of parts and mounting costs can be reduced.

Alternatively, in the display apparatus of one embodiment of the present invention, two kinds of transistors are preferably used in the subpixel (RPD) including the light-emitting and light-receiving device. Specifically, the subpixel preferably includes an OS transistor and an LTPS transistor. Changing the material of the semiconductor layer depending on the desired function of the transistor can increase the quality of the pixel circuit of the subpixel (RPD) including the light-emitting and light-receiving device and increase the accuracy of sensing and image capturing. In that case, in the subpixel (G) and the subpixel (B) that include the light-emitting devices, one or both of OS transistors and LTPS transistors may be used.

Furthermore, even when two kinds of transistors (e.g., OS transistors and LTPS transistors) are used in the pixels, with the use of the LTPS transistors, a variety of circuits formed using CMOS circuits and a display portion can be easily formed on the same substrate. Thus, external circuits mounted on the display apparatus can be simplified, and costs of parts and mounting costs can be reduced.

A transistor using a metal oxide having a wider band gap and a lower carrier density than silicon can achieve an extremely low off-state current. Thus, such a low off-state current enables charge accumulated in a capacitor that is connected in series with the transistor to be retained for a long time. Therefore, it is preferable to use OS transistors especially as the transistor M1R, the transistor M1G, the transistor M1B, the transistor M3R, the transistor M3G, the transistor M3B, the transistor M4R, the transistor M11, and the transistor M12 that are connected in series to the capacitor C1r, the capacitor C1g, the capacitor C1b, the capacitor C2r, or the capacitor Cf.

An Si transistor is preferably used as the transistor M13. This enables high-speed reading operation of imaging data.

Although n-channel transistors are shown as the transistors in FIG. 1, p-channel transistors can be used.

Although FIG. 1 illustrates an example in which each transistor includes one gate, at least one of the plurality of transistors included in the subpixels may include a back gate. A pair of gates of a transistor may be electrically connected to each other. Thus, the on-state current of the transistor can be increased and saturation characteristics can be improved, so that a display apparatus with higher reliability can be achieved. Alternatively, the back gate may be electrically connected to a wiring to which a constant potential is applied. Thus, the transistor can have stable electrical characteristics. Alternatively, the back gate may be electrically connected to a wiring to which a potential for controlling the threshold voltage of the transistor is applied.

One or more layers including one or both of the transistor and the capacitor are preferably provided at a position overlapping with the light-emitting and light-receiving device 190R•PD, the light-emitting device 190G, or the light-emitting device 190B. Thus, the effective area of each pixel circuit can be reduced, and a high-resolution display portion can be achieved.

Pixel Structure Example 2

Figure 2:
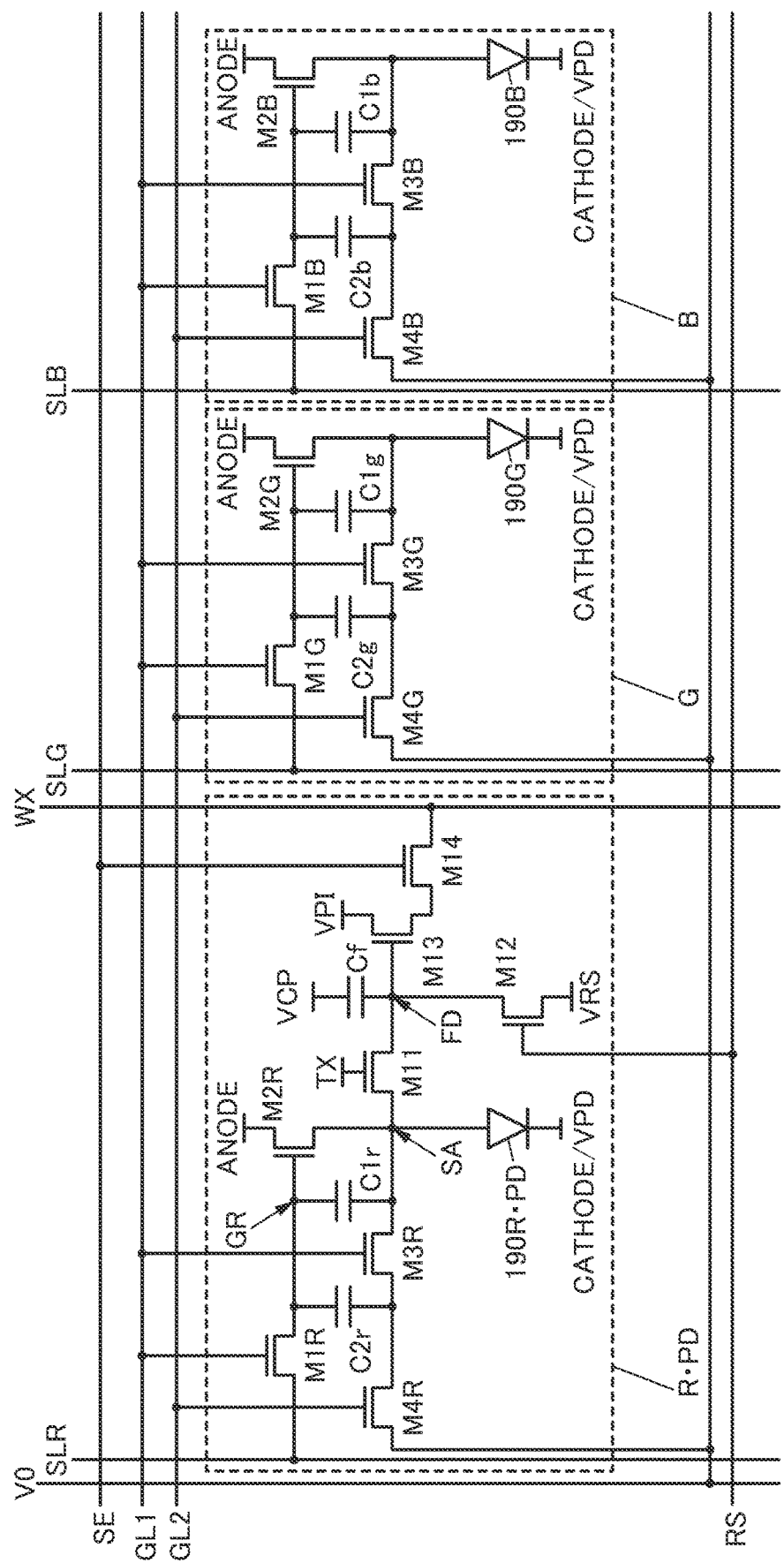
FIG. 2 is a circuit diagram illustrating an example of a pixel circuit.

FIG. 2 illustrates a circuit diagram of one pixel of a display apparatus.

A subpixel (G) that is illustrated in FIG. 2 and exhibits green light is different from the subpixel (G) illustrated in FIG. 1 in including a transistor M4G and a capacitor C2g. Similarly, a subpixel (B) that is illustrated in FIG. 2 and exhibits blue light is different from the subpixel (B) illustrated in FIG. 1 in including a transistor M4B and a capacitor C2b. Note that a subpixel (RPD) that is illustrated in FIG. 2, exhibits red light, and has a light-receiving function is the same as the subpixel (RPD) illustrated in FIG. 1.

In FIG. 2, the other of the source and the drain of the transistor M3G is electrically connected, not to the wiring V0, to one of a source and a drain of the transistor M4G and the other electrode of the capacitor C2g. A gate of the transistor M4G is electrically connected to the wiring GL2, and the other of the source and the drain of the transistor M4G is electrically connected to the wiring V0. One electrode of the capacitor C2g is electrically connected to the other of the source and the drain of the transistor M1G, the gate of the transistor M2G, and the one electrode of the capacitor C1g.

Similarly, in FIG. 2, the other of the source and the drain of the transistor M3B is electrically connected, not to the wiring V0, to one of a source and a drain of the transistor M4B and the other electrode of the capacitor C2b. A gate of the transistor M4B is electrically connected to the wiring GL2, and the other of the source and the drain of the transistor M4B is electrically connected to the wiring V0. One electrode of the capacitor C2b is electrically connected to the other of the source and the drain of the transistor M1B, the gate of the transistor M2B, and the one electrode of the capacitor C1b.

With such a structure, also in the subpixel (G) and the subpixel (B), a data potential supplied from the wiring SLG or the wiring SLB and a data potential supplied from the wiring V0 can be combined to generate a potential supplied to the gate of the driving transistor (the transistor M2G or M2B) of the light-emitting device. Thus, grayscale correction can be performed and a voltage higher than or equal to an output voltage of a source driver can be applied as a gate voltage of the driving transistor.

[Driving Method of Display Apparatus]

Figure 3B:
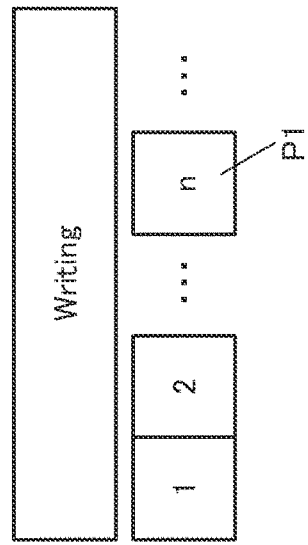
Figure 3B:
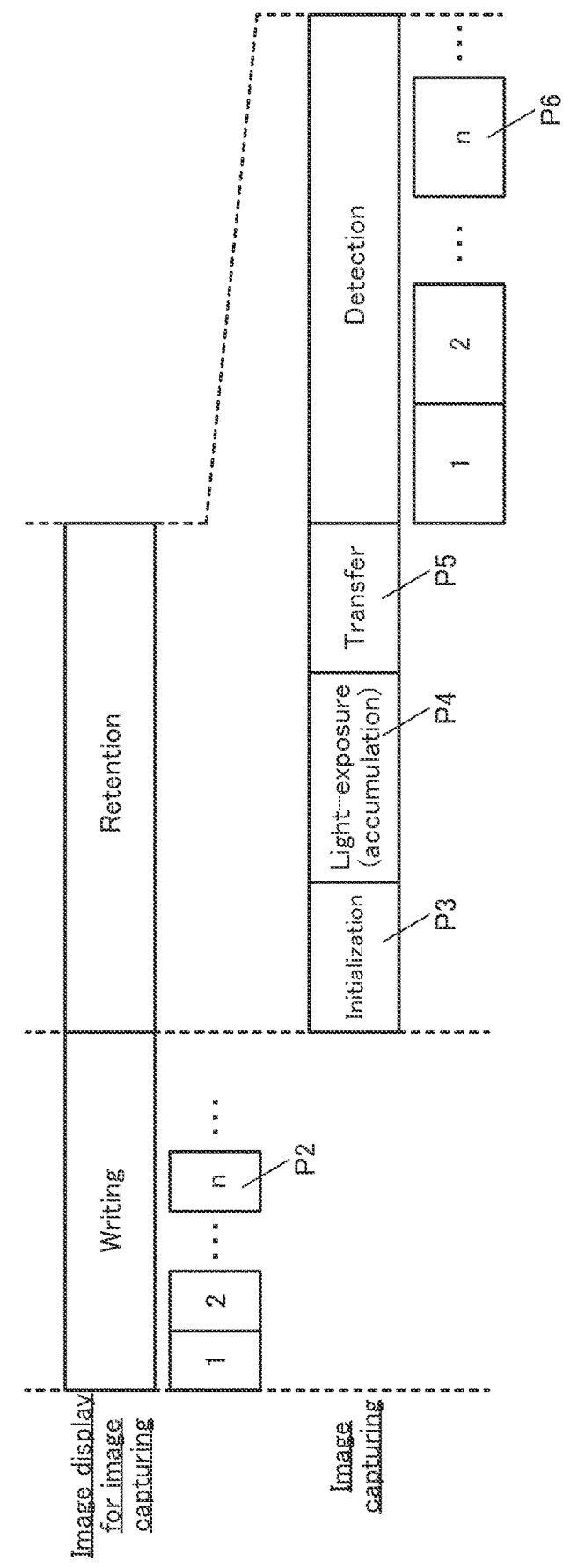

FIG. 3A and FIG. 3B show an example of a driving method of a display apparatus.

Furthermore, FIG. 4A, FIG. 4B, and FIG. 5A to FIG. 5D show timing charts of each operation.

As shown in FIG. 3A, when image display is performed, an operation of writing an image signal is performed row by row. As shown in FIG. 3A, writing is performed sequentially, a first row, a second row. FIG. 4A shows a timing chart of an operation P1 of writing an image signal in a pixel in the n-th row shown in FIG. 3A.

The following description is given using the subpixel (RPD) that exhibits red light and has a light-receiving function illustrated in FIG. 1 and FIG. 2 as an example. FIG. 4A shows an example of signals input to the wiring GL1<n> in the n-th row, the wiring GL2<n> in the n-th row, the wiring SLR, and the wiring V0 and changes in the potential of the node GR.

Note that the image signal can be written to the subpixel (G) that exhibits green light and the subpixel (B) that exhibits blue light, which are illustrated in FIG. 2, in the similar manner.

Note that in the following description, the influence of the threshold voltage of the transistor, the on-state resistance of the transistor, the gate capacitance of the transistor, wiring resistance, parasitic capacitance, and the like is not considered for simplification of the description.

Before Time T0, a potential for bringing the transistor into a non-conduction state (here, a low-level potential) is applied to the wiring GL1<n> and the wiring GL2<n>. Data to be written to pixels in the previous row is applied to the wiring SLR and the wiring V0. Furthermore, the node GR is in the state where a potential $V_X$ that is written in the previous frame is applied.

At Time T0, a potential for bringing the transistor into a conduction state (here, a high-level potential) is applied to the wiring GL1<n> and the wiring GL2<n>, the data potential D is applied to the wiring SLR, and the reset potential $V_R$ is applied to the wiring V0.

In the period T0-T1, the transistor M1R, the transistor M3R, and the transistor M4R are in their conduction states. The reset potential $V_R$ is supplied to the other electrode of the capacitor C2r through the transistor M4R. Furthermore, the reset potential $V_R$ is supplied to the anode of the light-emitting and light-receiving device 190R•PD and the other electrode of the capacitor C1r through the transistor M4R and the transistor M3R. The data potential D is supplied to the node GR through the transistor M1R.

As described above, when the data potential D is written to the node GR, the reset potential $V_R$ is written to a node SA to which the anode of the light-emitting and light-receiving device 190R•PD is connected, so that a potential difference between the node SA and the node GR, that is, the gate—source voltage of the transistor M2R can be determined regardless of the electrical state of the light-emitting and light-receiving device 190R•PD. Specifically, the gate—source voltage of the transistor M2R is $D-V_R$ with the reset potential $V_R$ used as a reference.

In addition, the capacitor C2r is charged depending on a potential difference between the data potential D and the reset potential $V_R$.

Note that at this time, the reset potential $V_R$ is applied to the anode of the light-emitting and light-receiving device 190R•PD. The reset potential $V_R$ is set such that the voltage between the pair of electrodes of the light-emitting and light-receiving device 190R•PD does not exceed the threshold voltage of the light-emitting and light-receiving device 190R•PD, whereby the light-emitting and light-receiving device 190R•PD does not emit light.

Then, at Time T1, a low-level potential is applied to the wiring GL1<n>, a high-level potential is applied to the wiring GL2<n>, and the data potential $D_W$ is applied to the wiring V0.

When the wiring GL1 has a low-level potential, the transistor M1R and the transistor M3R are in their non-conduction states. Accordingly, the node GR is brought into a floating state.

The data potential $D_W$ is applied to the other electrode of the capacitor C2r through the transistor M4R. Since the voltage D–$V_R$ is charged in the capacitor C2r, the potential of the node GR changes from the potential D into a potential $V_{D+W}$ by capacitive coupling when the potential of the other electrode of the capacitor C2r changes from the reset potential $V_R$ into the data potential $D_W$. Here, the amount of change in the potential of the node GR (i.e., a difference between the potential $V_{D+W}$ and the potential D) is substantially determined by the capacitance value of the capacitor C2r and the capacitance value of the capacitor C1r. In the case where the capacitance value of the capacitor C2r is much larger than the capacitance value of the capacitor C1r, the amount of change in the potential of the node GR is a value closer to a difference between the data potential $D_W$ and the reset potential $V_R$.

Thus, the potential $V_{D+W}$ is applied to the gate of the transistor M2R. When a current corresponding to the potential flows to the light-emitting and light-receiving device 190R•PD through the transistor M2R, the light-emitting and light-receiving device 190R•PD can emit light.

For example, by supplying a high-level potential as the data potential $D_W$, the emission luminance of the light-emitting and light-receiving device 190R•PD can be increased. In contrast, by supplying a low-level potential as the data potential $D_W$, the emission luminance of the light-emitting and light-receiving device 190R•PD can be decreased.

With such a driving method, emission luminance can be adjusted for each subpixel, so that what is called pixel dimming can be achieved. Luminance is optimally corrected in accordance with an image to be displayed, so that high-quality display can be achieved. Furthermore, data for display and data for correction can be individually supplied to the pixel, so that video data in which the data for display and the data for correction are added together is not necessarily generated. Accordingly, the structure of a driving circuit or the like can be simplified.

At Time T2, a low-level potential is applied to the wiring GL2<n>. Accordingly, the operation is completed in which data is written to the subpixel (RPD) that is included in the pixel in the n-th row, exhibits red light, and has a light-receiving function. After Time T2, writing operation for the next row is performed.

FIG. 3B shows a sequence in the case of performing image capturing by a global shutter method with the use of the light-emitting and light-receiving device 190R•PD. As shown in FIG. 3B, in the case where image capturing is performed using the light-emitting and light-receiving device 190R•PD, first, an operation of writing an image signal for image capturing is performed row by row; an initialization (reset) operation, a light-exposure (accumulation) operation, and a transfer operation are performed in this order in the subpixel having a light-receiving function while the written data is retained; and then, detection is performed by reading imaging data row by row.

Figure 4B:
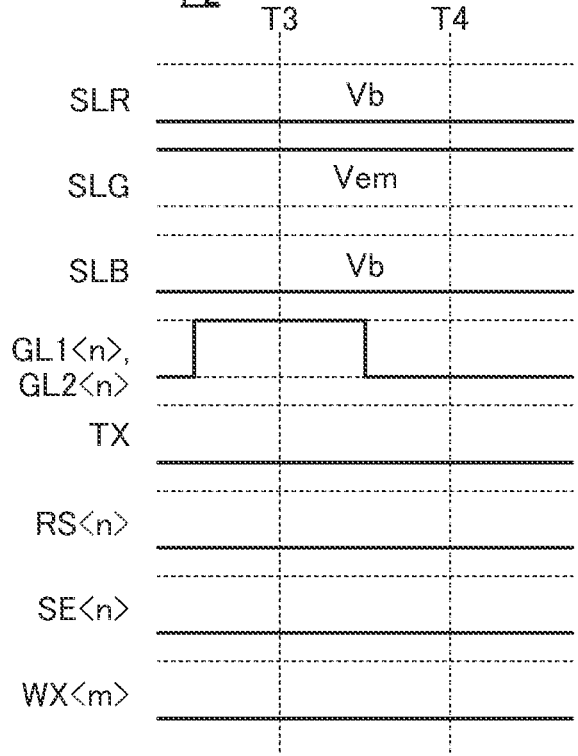

FIG. 4B shows a timing chart of an operation P2 of writing an image signal for image capturing in the pixel in the n-th row. In the example described here, image capturing is performed with the light-emitting and light-receiving device 190R•PD using the light-emitting device 190G as a light source in the pixel circuit illustrated in FIG. 1.

First, before Time T3, the potential of the wiring GL1<n> and the potential of the wiring GL2<n> are set to high-level potentials and the potentials of the wiring TX, the wiring RS<n>, and the wiring SE<n> are each set to a low-level potential. Accordingly, the transistor M1R, the transistor M3R, and the transistor M4R are turned on, so that charge corresponding to a potential difference (a voltage Vb–$V_R$) between a potential Vb of the wiring SLR and the reset potential $V_R$ of the wiring V0 is accumulated in the capacitors C1r and C2r. Furthermore, the transistor M1G and the transistor M3G are turned on, so that charge corresponding to a potential difference (a voltage Vem–$V_R$) between a potential Vem of the wiring SLG and the reset potential $V_R$ of the wiring V0 is accumulated in the capacitor C1g. Moreover, the transistor M1B and the transistor M3B are turned on, so that charge corresponding to a potential difference (the voltage Vb–$V_R$) between the potential Vb of the wiring SLB and the reset potential $V_R$ of the wiring V0 is accumulated in the capacitor C1g. At this time, the potential of the wiring WX<m> is a low-level potential.

Here, the potential Vb of the wiring SLR is a potential such that the gate-source voltage (Vgs) and the threshold voltage (Vth) of the transistor M2R satisfy Vgs=Vb–$V_R$<Vth. Consequently, the transistor M2R can be turned off completely.

The potential Vem of the wiring SLG is set to a potential for making the light-emitting device 190G emit light. A potential that makes light emission of the light-emitting device 190G have a sufficient luminance for image capturing is preferably supplied as the potential Vem.

A potential that makes the light-emitting device 190B not emit light is supplied to the wiring SLB. Although the potential Vb is supplied to the wiring SLB in the example shown in FIG. 4B, one embodiment of the present invention is not limited to the example. The potential supplied to the wiring SLB may be the same as or different from the potential supplied to the wiring SLR. Note that in the case where the light-emitting device 190B is also used as a light source at the time of image capturing, a potential for making the light-emitting device 190B emit light is supplied to the wiring SLB.

Next, in a period between Time T3 and Time T4, the potential of the wiring GL1<n> and the potential of the wiring GL2<n> are set to low-level potentials, so that the transistors M1R, M1G, M1B, M3R, M3G, M3B, and M4R are turned off, the charge accumulated in the capacitors C1r, C1g, C1b, and C2r are retained, and the operation of writing the image signal for image capturing is terminated. The light-emitting device 190G emits light on the basis of the gate potential of the transistor M2G.

Figure 5A:
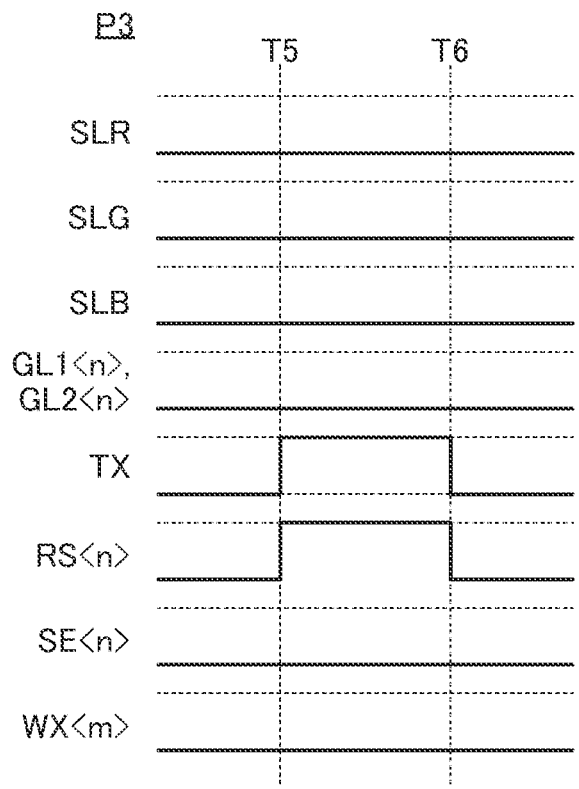
FIG. 5A to FIG. 5D are timing charts showing an example of the driving method of the display apparatus.

FIG. 5A shows a timing chart of an initialization (reset) operation P3.

At Time T5, the potentials of the wiring TX and the wiring RS<n> are set to high-level potentials, so that the transistor M11 and the transistor M12 are turned on. Thus, the potential of the anode of the light-emitting and light-receiving device 190R•PD and the potential of the node FD can be set to the potential supplied to the wiring VRS and the potential of the node FD can be reset. Since the node GR is in the floating state, Vgs is stored and the transistor M2R remains off regardless of the potential of the node SA. When a potential lower than that of the wiring CATHODE/VPD is supplied to the wiring VRS, a reverse bias can be applied to the light-emitting and light-receiving device 190R•PD.

At Time T6, the potentials of the wiring TX and the wiring RS<n> are set to low-level potentials, so that the transistor M11 and the transistor M12 are turned off and the initialization operation is terminated.

Figure 5B:
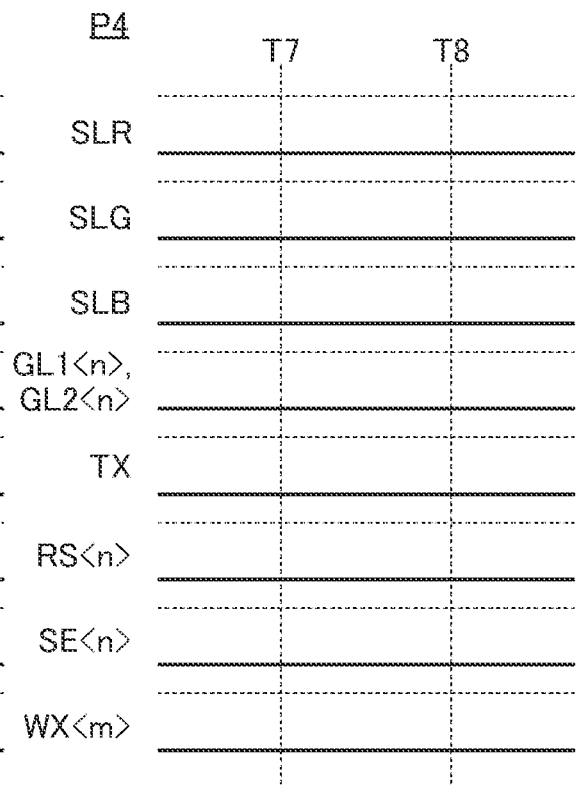

FIG. 5B shows a timing chart of a light-exposure (accumulation) operation P4.

In a period from Time T7 to Time T8, the light-emitting and light-receiving device 190R•PD generates charge by receiving light emitted from the light-emitting device 190G. Thus, charge is accumulated in the capacitor of the light-emitting and light-receiving device 190R•PD, and the potential of the node SA becomes a potential corresponding to the charge generated in the light-emitting and light-receiving device 190R•PD.

Note that during the period from Time T7 to Time T8, the wiring SLR, the wiring SLG, the wiring SLB, the wiring GL1<n>, the wiring GL2<n>, the wiring TX, the wiring RS<n>, the wiring SE<n>, and the wiring WX<m> can have low-level potentials.

Figure 5C:
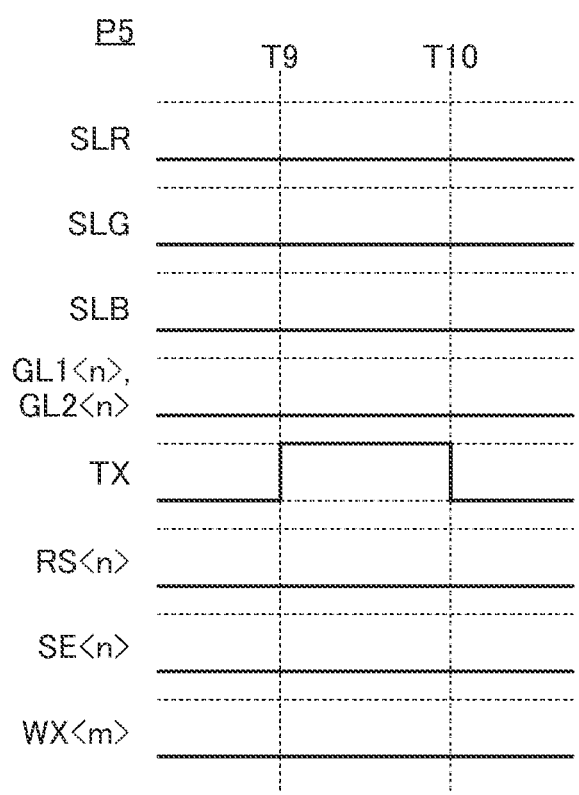

FIG. 5C shows a timing chart of a transfer operation P5.

At the time T9, the potential of the wiring TX is set to a high-level potential, so that the transistor M11 is turned on. Accordingly, charge is transferred from the node SA to the node FD. In other words, the potential of the node FD becomes the potential corresponding to the charge generated in the light-emitting and light-receiving device 190R•PD.

At Time T10, the potential of the wiring TX is set to a low-level potential, so that the transistor M11 is turned off and the transfer operation is terminated.

Figure 5D:
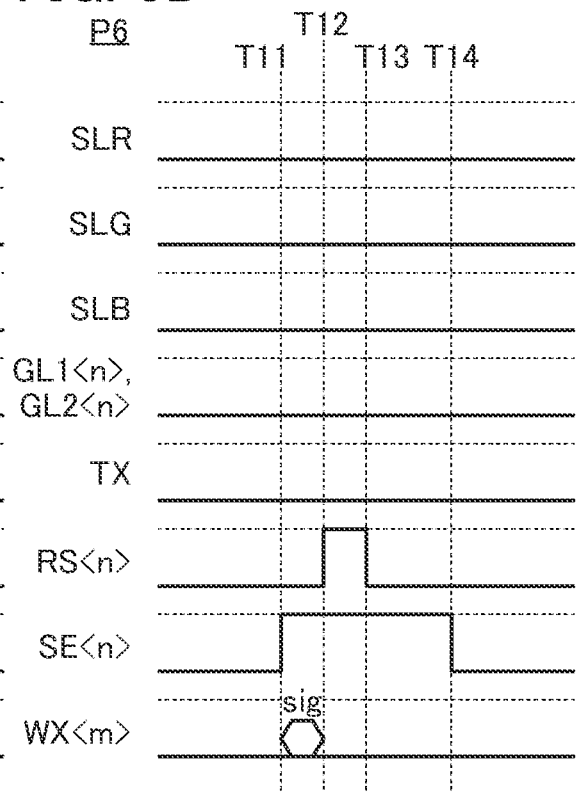

FIG. 5D shows a timing chart of a detection operation P6.

At Time T11, the potential of the wiring SE<n> is set to a high-level potential, so that the transistor M14 is turned on and the potential of the wiring WX<m> can be set to the potential corresponding to the charge generated in the light-emitting and light-receiving device 190R•PD. Accordingly, an output sig corresponding to the charge generated in the light-emitting and light-receiving device 190R•PD can be read out with the external circuit connected to the wiring WX<m>. Note that the transistor M13 can also be referred to as a transistor included in a source follower circuit.

At Time T12, the potential of the wiring RS<n> is set to a high-level potential while the potential of the wiring SE<n> remains as a high-level potential, so that the transistor M12 is turned on and the potential of the wiring WX<m> is reset to a potential corresponding to the potential of the wiring VRS. Accordingly, a background potential can be read out. Therefore, fixed pattern noise caused by the transistor M13 can be removed from the output signal read out with the external circuit at Time T11. This can reduce influence of variations in the characteristics of the transistors M13 among the pixels.

At Time T13, the potential of the wiring RS<n> is set to a low-level potential, so that the transistor M12 is turned off.

At Time T14, the potential of the wiring SE<n> is set to a low-level potential, so that the transistor M14 is turned off and the detection operation is terminated.

When the operations of Time T3 to Time T14 are performed repeatedly, image capturing can be performed repeatedly. In the case where OS transistors are used as the transistors M1R, M2R, M1G, M2G, M1B, and M2B, the image signal for image capturing can be retained for a long term; therefore, the frequency of performing the operation P2 of writing the image signal for image capturing can be low. Therefore, after the operations of Time T3 to Time T14 are performed once, the operations of Time T5 to Time T14 may be repeated predetermined times, and then the operation may return to Time T3.

Note that the display apparatus of this embodiment can be driven in any of an image display mode, an image capturing mode, and a mode of simultaneously performing image display and image capturing. In the image display mode, a full-color image can be displayed, for example. In the image capturing mode, an image for image capturing (e.g., a green monochromatic image or a blue monochromatic image) can be displayed and image capturing can be performed with the light-emitting and light-receiving device, for example. Fingerprint identification can be performed in the image capturing mode, for example. In the mode of simultaneously performing image display and image capturing, an image for image capturing can be displayed with the light-emitting device (the light-emitting device 190G or the light-emitting device 190B) and image capturing can be performed with the light-emitting and light-receiving device 190R•PD in some pixels, and a full-color image can be displayed with the light-emitting and light-receiving device and the light-emitting device in the other pixels, for example.

As described above, in the display apparatus of this embodiment, the subpixels (RPD) that exhibit red light and have a light-receiving function can be used for both image display and light detection. Alternatively, some of the plurality of subpixels (RPD) can be used for image display, and the others can be used for light detection. Accordingly, the display apparatus of this embodiment can be driven in any of an image display mode, an image capturing mode, and a mode of simultaneously performing image display and image capturing.

In the display apparatus of this embodiment, two kinds of data potentials (e.g., the potential of image data and the potential of correction data) can be combined, so that the potential supplied to the gate of the driving transistor of the light-emitting and light-receiving device can be generated. Thus, grayscale correction for the time when the light-emitting and light-receiving device emits light can be performed. Furthermore, a voltage higher than or equal to the output voltage of a source driver can be applied as the gate voltage of the driving transistor, so that the power consumption of the source driver can be reduced.

This embodiment can be combined with the other embodiments as appropriate. In this specification, in the case where a plurality of structure examples are shown in one embodiment, the structure examples can be combined as appropriate.

Embodiment 2

In this embodiment, the display apparatus of one embodiment of the present invention will be described with reference to FIG. 6 to FIG. 17.

The display apparatus of one embodiment of the present invention includes a light-emitting device and a light-emitting and light-receiving device.

The light-emitting and light-receiving device can be manufactured by combining an organic EL device that is a light-emitting device and an organic photodiode that is a light-receiving device. For example, by adding an active layer of an organic photodiode to a layered structure of an organic EL device, the light-emitting and light-receiving device can be manufactured. Furthermore, in the light-emitting and light-receiving device manufactured by combining an organic EL device and an organic photodiode, concurrently depositing layers that can be shared with the organic EL device can inhibit an increase in the number of deposition steps.

For example, one of a pair of electrodes (a common electrode) can be a layer shared by the light-emitting and light-receiving device and the light-emitting device. In another example, at least one of a hole-injection layer, a hole-transport layer, an electron-transport layer, and an electron-injection layer is preferably a layer shared by the light-emitting and light-receiving device and the light-emitting device. In another example, the light-emitting and light-receiving device and the light-emitting device can have the same structure except for the presence or absence of an active layer of the light-receiving device. In other words, the light-emitting and light-receiving device can be manufactured by only adding the active layer of the light-receiving device to the light-emitting device. When the light-emitting and light-receiving device and the light-emitting device include a common layer in such a manner, the number of deposition steps and the number of masks can be reduced, thereby reducing the number of manufacturing steps and the manufacturing cost of the display apparatus. Furthermore, the display apparatus including the light-emitting and light-receiving device can be manufactured using an existing manufacturing apparatus and an existing manufacturing method for the display apparatus.

Note that a layer included in the light-emitting and light-receiving device might have a different function between the case where the light-emitting and light-receiving device functions as the light-receiving device and the case where the light-emitting and light-receiving device functions as the light-emitting device. In this specification, the name of a component is based on its function in the case where the light-emitting and light-receiving device functions as a light-emitting device. For example, a hole-injection layer functions as a hole-injection layer in the case where the light-emitting and light-receiving device functions as a light-emitting device, and functions as a hole-transport layer in the case where the light-emitting and light-receiving device functions as a light-receiving device. Similarly, an electron-injection layer functions as an electron-injection layer in the case where the light-emitting and light-receiving device functions as a light-emitting device, and functions as an electron-transport layer in the case where the light-emitting and light-receiving device functions as a light-receiving device.

As described above, the display portion of the display apparatus of this embodiment includes a light-emitting and light-receiving device and a light-emitting device. Specifically, light-emitting and light-receiving devices and light-emitting devices are arranged in a matrix in the display portion. Accordingly, the display portion has one or both of an image capturing function and a sensing function in addition to a function of displaying an image.

The display portion can be used as an image sensor or a touch sensor. That is, by detecting light with the display portion, an image can be captured and the approach or touch of an object (e.g., a finger or a stylus) can be detected. Furthermore, in the display apparatus of this embodiment, the light-emitting devices can be used as a light source of the sensor. Accordingly, a light-receiving portion and a light source do not need to be provided separately from the display apparatus; hence, the number of components of an electronic device can be reduced.

In the display apparatus of this embodiment, when an object reflects light emitted from the light-emitting device included in the display portion, the light-emitting and light-receiving device can detect the reflected light; thus, detection of image capturing and touch (or approach) can be performed even in a dark place.

The display apparatus of this embodiment has a function of displaying an image using the light-emitting device and the light-emitting and light-receiving device. That is, the light-emitting device and the light-emitting and light-receiving device functions as a display device (also referred to as a display element).

As the light-emitting device, an EL device such as an OLED (Organic Light Emitting Diode) and a QLED (Quantum-dot Light Emitting Diode) is preferably used. Examples of a light-emitting substance contained in the EL device include a substance exhibiting fluorescence (fluorescent material), a substance exhibiting phosphorescence (phosphorescent material), an inorganic compound (e.g., a quantum dot material), and a substance exhibiting thermally activated delayed fluorescence (Thermally Activated Delayed Fluorescent (TADF) material). Alternatively, an LED such as a micro-LED (Light Emitting Diode) can be used as the light-emitting device.

The display apparatus of this embodiment has a function of detecting light using the light-emitting and light-receiving device. The light-emitting and light-receiving device can detect light having a shorter wavelength than light emitted from the light-emitting and light-receiving device itself.

When the light-emitting and light-receiving device is used as an image sensor, the display apparatus of this embodiment can capture an image using the light-emitting and light-receiving device. For example, the display apparatus of this embodiment can be used as a scanner.

For example, data on a fingerprint, a palm print, or the like can be obtained with the use of the image sensor. That is, a biological authentication sensor can be incorporated in the display apparatus of this embodiment. When the display apparatus incorporates a biological authentication sensor, the number of components of an electronic device can be reduced as compared to the case where a biological authentication sensor is provided separately from the display apparatus; thus, the size and weight of the electronic device can be reduced.

In addition, data on facial expression, eye movement, change of the pupil diameter, or the like of a user can be obtained with the use of the image sensor. By analysis of the data, information on the user's physical and mental state can be obtained. Changing the output contents of one or both of display and sound on the basis of the information allows the user to safely use a device for VR (Virtual Reality), a device for AR (Augmented Reality), or a device for MR (Mixed Reality), for example.

When the light-emitting and light-receiving device is used as a touch sensor, the display apparatus of this embodiment can detect the approach or touch of an object with the use of the light-emitting and light-receiving device.

The light-emitting and light-receiving device functions as a photoelectric conversion device that detects light entering the light-emitting and light-receiving device and generates charge. The amount of generated charge depends on the amount of incident light.

The light-emitting and light-receiving device can be manufactured by adding an active layer of a light-receiving device to the above-described structure of the light-emitting device.

For the light-emitting and light-receiving device, an active layer of a pn photodiode or a pin photodiode can be used, for example.

It is particularly preferable to use, for the light-emitting and light-receiving device, an active layer of an organic photodiode including a layer containing an organic compound. An organic photodiode, which is easily made thin, lightweight, and large in area and has a high degree of freedom for shape and design, can be used in a variety of display apparatuses.

FIG. 6A to FIG. 6D are cross-sectional views of display apparatuses of one embodiment of the present invention.

Figure 6A:
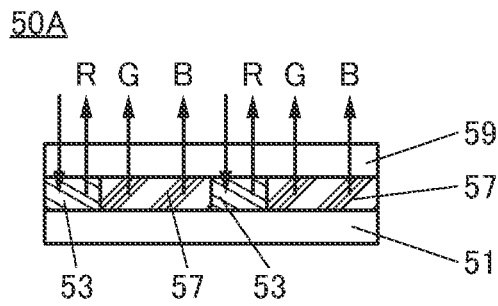
FIG. 6A to FIG. 6D are cross-sectional views each illustrating an example of a display apparatus.

A display apparatus 50A illustrated in FIG. 6A includes a layer 53 including light-emitting and light-receiving devices and a layer 57 including light-emitting devices, between a substrate 51 and a substrate 59.

Figure 6B:
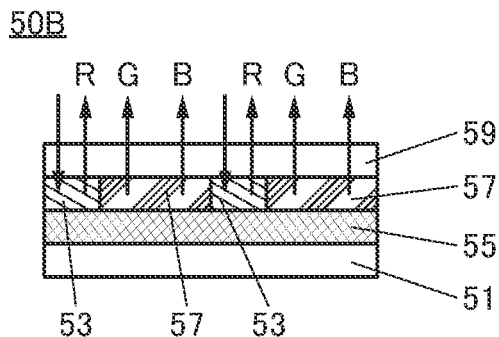

A display apparatus 50B illustrated in FIG. 6B includes the layer 53 including light-emitting and light-receiving devices, a layer 55 including transistors, and the layer 57 including light-emitting devices, between the substrate 51 and the substrate 59.

In the display apparatus 50A and the display apparatus 50B, green (G) light and blue (B) light are emitted from the layer 57 including light-emitting devices, and red (R) light is emitted from the layer 53 including light-emitting and light-receiving devices. In the display apparatus of one embodiment of the present invention, the color of light emitted from the layer 53 including light-emitting and light-receiving devices is not limited to red.

The light-emitting and light-receiving device included in the layer 53 including light-emitting and light-receiving devices can detect light that enters from the outside of the display apparatus 50A or the display apparatus 50B. The light-emitting and light-receiving device can detect one or both of green (G) light and blue (B) light, for example.

The display apparatus of one embodiment of the present invention includes a plurality of pixels arranged in a matrix. One pixel includes one or more subpixels. One subpixel includes one light-emitting and light-receiving device or one light-emitting device. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The subpixel of at least one color includes a light-emitting and light-receiving device. The light-emitting and light-receiving device may be provided in all the pixels or in some of the pixels. In addition, one pixel may include a plurality of light-emitting and light-receiving devices.

The layer 55 including transistors includes a transistor electrically connected to the light-emitting and light-receiving device and a transistor electrically connected to the light-emitting device, for example. The layer 55 including transistors may further include a wiring, an electrode, a terminal, a capacitor, a resistor, or the like.

Figure 6C:
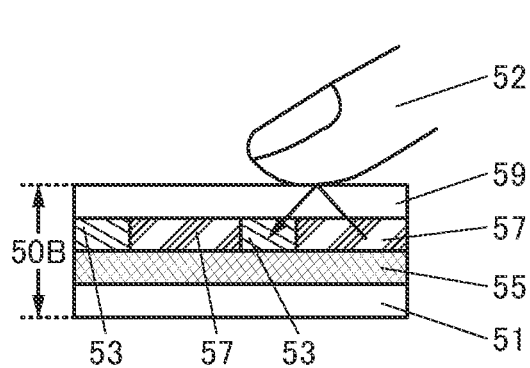
Figure 6D:
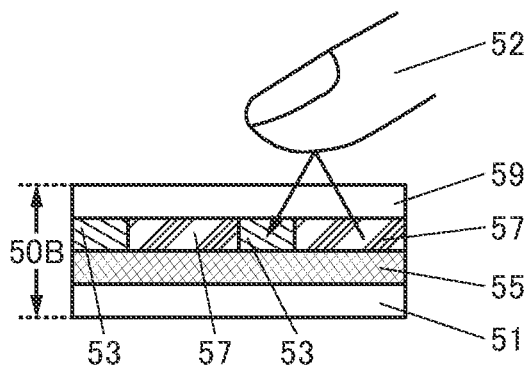

The display apparatus of one embodiment of the present invention may have a function of detecting an object such as a finger that is touching the display apparatus (FIG. 6C). Alternatively, the display apparatus of one embodiment of the present invention may have a function of detecting an object that is approaching (but is not touching) the display apparatus (FIG. 6D). For example, when light emitted from the light-emitting device in the layer 57 including light-emitting devices is reflected by a finger 52 that touches or approaches the display apparatus 50B as illustrated in FIG. 6C and FIG. 6D, the light-emitting and light-receiving device in the layer 53 including light-emitting and light-receiving devices detects the reflected light. Thus, the touch or approach of the finger 52 on/to the display apparatus 50B can be detected.

[Pixel]

FIG. 6E to FIG. 6G and FIG. 7A to FIG. 7D illustrate examples of pixels. Note that the arrangement of subpixels is not limited to the illustrated order. For example, the positions of a subpixel (B) and a subpixel (G) may be reversed.

Figure 6E:
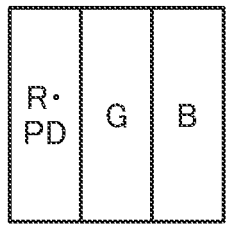
FIG. 6E to FIG. 6G are top views illustrating examples of pixels.

A pixel illustrated in FIG. 6E employs stripe arrangement and includes a subpixel (RPD) that exhibits red light and has a light-receiving function, a subpixel (G) that exhibits green light, and a subpixel (B) that exhibits blue light. In a display apparatus including a pixel composed of three subpixels of R, G, and B, a light-emitting device used in the R subpixel can be replaced with a light-emitting and light-receiving device, so that the display apparatus can have a light-receiving function in the pixel.

Figure 6F:
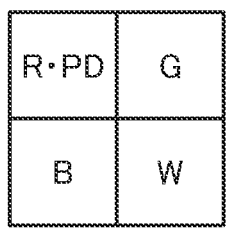

A pixel illustrated in FIG. 6F employs matrix arrangement and includes a subpixel (RPD) that exhibits red light and has a light-receiving function, a subpixel (G) that exhibits green light, a subpixel (B) that exhibits blue light, and a subpixel (W) that exhibits white light. Also in a display apparatus including a pixel composed of four subpixels of R, G, B, and W, a light-emitting device used in the R subpixel can be replaced with a light-emitting and light-receiving device, so that the display apparatus can have a light-receiving function in the pixel.

Figure 6G:
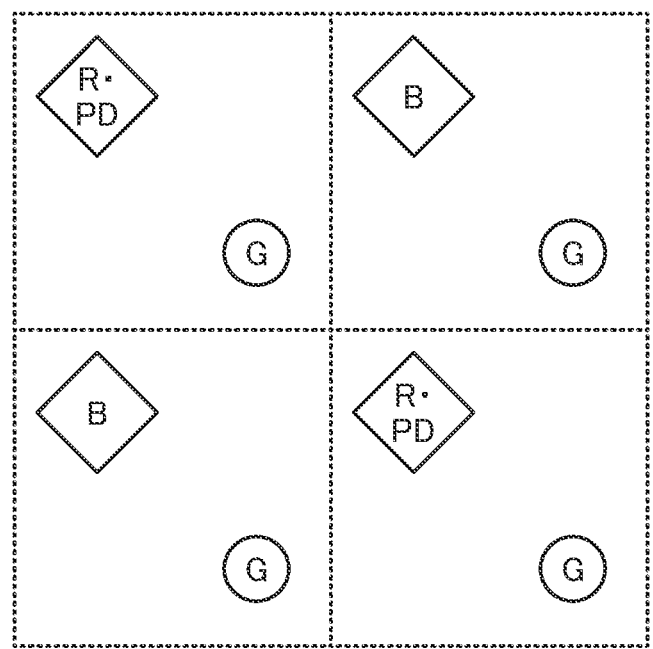

Pixels illustrated in FIG. 6G employ PenTile arrangement and each include subpixels emitting light of two colors that differ among the pixels. The upper-left pixel and the lower-right pixel in FIG. 6G each include a subpixel (RPD) that exhibits red light and has a light-receiving function and a subpixel (G) that exhibits green light. The lower-left pixel and the upper-right pixel in FIG. 6G each include a subpixel (G) that exhibits green light and a subpixel (B) that exhibits blue light. Note that the shapes of the subpixels illustrated in FIG. 6G each indicate a top-surface shape of the light-emitting device or the light-emitting and light-receiving device included in the subpixel.

A pixel illustrated in FIG. 7A includes a subpixel (RPD) that exhibits red light and has a light-receiving function, a subpixel (G) that exhibits green light, and a subpixel (B) that exhibits blue light. The subpixel (RPD) is provided in a column different from a column where the subpixel (G) and the subpixel (B) are positioned. The subpixel (G) and the subpixel (B) are alternately arranged in the same column; one is provided in an odd-numbered row and the other is provided in an even-numbered row. The color of the subpixel positioned in a column different from the column where the subpixels of the other colors are positioned is not limited to red (R) and may be green (G) or blue (B).

FIG. 7B illustrates two pixels, each of which is composed of three subpixels surrounded by dotted lines. A pixel illustrated in FIG. 7B includes a subpixel (RPD) that exhibits red light and has a light-receiving function, a subpixel (G) that exhibits green light, and a subpixel (B) that exhibits blue light. In the pixel on the left in FIG. 7B, the subpixel (G) is positioned in the same row as the subpixel (RPD), and the subpixel (B) is positioned in the same column as the subpixel (RPD). In the pixel on the right in FIG. 7B, the subpixel (G) is positioned in the same row as the subpixel (RPD), and the subpixel (B) is positioned in the same column as the subpixel (G). In every odd-numbered row and every even-numbered row of the pixel layout illustrated in FIG. 7B, the subpixel (RPD), the subpixel (G), and the subpixel (B) are repeatedly arranged. In addition, subpixels of different colors are arranged in the odd-numbered row and the even-numbered row in every column.

FIG. 7C is a modification example of the pixel arrangement of FIG. 6G. The upper-left pixel and the lower-right pixel in FIG. 7C each include a subpixel (RPD) that exhibits red light and has a light-receiving function and a subpixel (G) that exhibits green light. The lower-left pixel and the upper-right pixel in FIG. 7C each include a subpixel (RPD) that exhibits red light and has a light-receiving function and a subpixel (B) that exhibits blue light.

In FIG. 6G, the subpixel (G) that exhibits green light is provided in each pixel. In FIG. 7C, the subpixel (RPD) that exhibits red light and has a light-receiving function is provided in each pixel. The structure illustrated in FIG. 7C achieves higher-resolution image capturing than the structure illustrated in FIG. 6G because a subpixel having a light-receiving function is provided in each pixel. Thus, the accuracy of biometric authentication can be increased, for example.

The top-surface shape of the light-emitting devices and the light-emitting and light-receiving devices is not particularly limited and can be a circular shape, an elliptical shape, a polygonal shape, a polygonal shape with rounded corners, or the like. The top-surface shape of the light-emitting devices included in the subpixels (G) is a circular in the example in FIG. 6G and square in the example in FIG. 7C. The top-surface shape of the light-emitting devices and the light-emitting and light-receiving devices may vary depending on the colors thereof, or may be the same among the light-emitting devices and the light-emitting and light-receiving devices of some colors or all colors.

The aperture ratio of subpixels may vary depending on the colors thereof, or may be the same among the subpixels of some colors or all colors. For example, the aperture ratio of a subpixel provided in each pixel (the subpixel (G) in FIG. 6G, and the subpixel (RPD) in FIG. 7C) may be made lower than that of a subpixel of another color.

FIG. 7D is a modification example of the pixel arrangement of FIG. 7C. Specifically, the structure of FIG. 7D is obtained by rotating the structure of FIG. 7C by 45°. Although one pixel is regarded as being formed of two subpixels in FIG. 7C, one pixel can be regarded as being formed of four subpixels as illustrated in FIG. 7D.

In the description with reference to FIG. 7D, one pixel is regarded as being formed of four subpixels surrounded by dotted lines. A pixel includes two subpixels (RPD), one subpixel (G), and one subpixel (B). The pixel including a plurality of subpixels having a light-receiving function allows high-resolution image capturing. Accordingly, the accuracy of biometric authentication can be increased. For example, the resolution of image capturing can be the square root of 2 times the resolution of display.

A display apparatus which employs the structure illustrated in FIG. 7C or FIG. 7D includes p (p is an integer greater than or equal to 2) first light-emitting devices, q (q is an integer greater than or equal to 2) second light-emitting devices, and r (r is an integer greater than p and greater than q) light-emitting and light-receiving devices. p and r satisfy r=2p. p, q, and r satisfy r=p+q. Either the first light-emitting devices or the second light-emitting devices emits green light, and the other light-emitting devices emit blue light. The light-emitting and light-receiving devices emit red light and have a light-receiving function.

In the case where touch detection is performed with the light-emitting and light-receiving devices, for example, it is preferable that light emitted from a light source be hard for a user to recognize. Since blue light has low visibility than green light, light-emitting devices which emit blue light are preferably used as a light source. Accordingly, the light-emitting and light-receiving devices preferably have a function of receiving blue light.

As described above, the display apparatus of one embodiment of the present invention can employ pixels with a variety of arrangements.

The pixel arrangement in the display apparatus of this embodiment need not be changed when a light-receiving function is incorporated into pixels; thus, the display portion can be provided with one or both of an image capturing function and a sensing function without a reduction in the aperture ratio or resolution.

[Light-Emitting and Light-Receiving Device]

FIG. 8A to FIG. 8E illustrate examples of a stacked-layer structure of the light-emitting and light-receiving device.

The light-emitting and light-receiving device includes at least an active layer and a light-emitting layer between a pair of electrodes.

The light-emitting and light-receiving device may further include, as a layer other than the active layer and the light-emitting layer, a layer containing a substance with a high hole-injection property, a substance with a high hole-transport property, a substance with a high hole-blocking property, a substance with a high electron-transport property, a substance with a high electron-injection property, a substance with a high electron-blocking property, a substance with a bipolar property (a substance with a high electron- and hole-transport property), or the like.

Figure 8A:
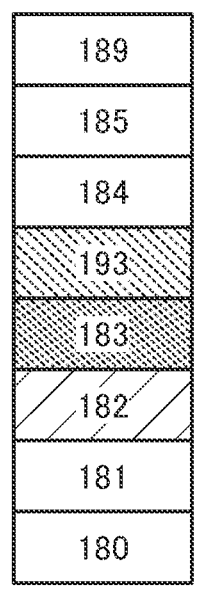
FIG. 8A to FIG. 8E are cross-sectional views illustrating examples of light-emitting and light-receiving devices.
Figure 8B:
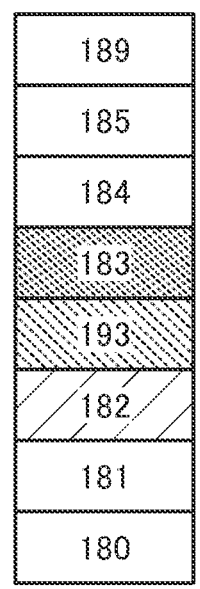
Figure 8C:
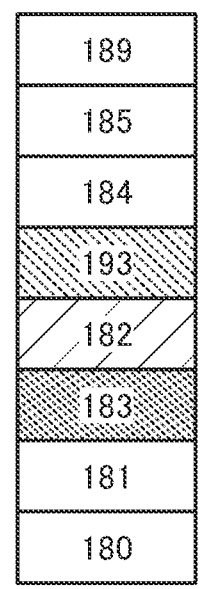

The light-emitting and light-receiving devices illustrated in FIG. 8A to FIG. 8C each include a first electrode 180, a hole-injection layer 181, a hole-transport layer 182, an active layer 183, a light-emitting layer 193, an electron-transport layer 184, an electron-injection layer 185, and a second electrode 189.

Note that each of the light-emitting and light-receiving devices illustrated in FIG. 8A to FIG. 8C can be referred to as a light-emitting device to which the active layer 183 is added. Therefore, the light-emitting and light-receiving device can be formed concurrently with formation of a light-emitting device only by adding a step of depositing the active layer 183 in the manufacturing process of the light-emitting device. The light-emitting device and the light-emitting and light-receiving device can be formed over the same substrate. Thus, the display portion can be provided with one or both of an image capturing function and a sensing function without a significant increase in the number of manufacturing steps.

The stacking order of the light-emitting layer 193 and the active layer 183 is not limited. FIG. 8A illustrates an example in which the active layer 183 is provided over the hole-transport layer 182 and the light-emitting layer 193 is provided over the active layer 183. FIG. 8B illustrates an example in which the light-emitting layer 193 is provided over the hole-transport layer 182 and the active layer 183 is provided over the light-emitting layer 193. The active layer 183 and the light-emitting layer 193 may be in contact with each other as illustrated in FIG. 8A and FIG. 8B.

As illustrated in FIG. 8C, a buffer layer is preferably provided between the active layer 183 and the light-emitting layer 193. As the buffer layer, at least one layer of a hole-injection layer, a hole-transport layer, an electron-transport layer, an electron-injection layer, a hole-blocking layer, an electron-blocking layer, and the like can be used. Alternatively, a layer containing a bipolar material may be used as the buffer layer. FIG. 8C illustrates an example in which the hole-transport layer 182 is used as the buffer layer.

The buffer layer provided between the active layer 183 and the light-emitting layer 193 can inhibit transfer of excitation energy from the light-emitting layer 193 to the active layer 183. Furthermore, the buffer layer can also be used to adjust the optical path length (cavity length) of the microcavity structure. Thus, a high emission efficiency can be obtained from the light-emitting and light-receiving device including the buffer layer between the active layer 183 and the light-emitting layer 193.

Figure 8D:
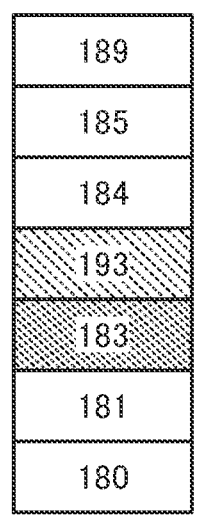

The light-emitting and light-receiving device illustrated in FIG. 8D is different from the light-emitting and light-receiving devices illustrated in FIG. 8A and FIG. 8C in not including the hole-transport layer 182. The light-emitting and light-receiving device may exclude at least one of the hole-injection layer 181, the hole-transport layer 182, the electron-transport layer 184, and the electron-injection layer 185. Furthermore, the light-emitting and light-receiving device may include another functional layer such as a hole-blocking layer or an electron-blocking layer.

Figure 8E:
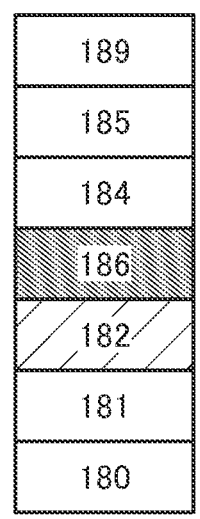

The light-emitting and light-receiving device illustrated in FIG. 8E is different from the light-emitting and light-receiving devices illustrated in FIG. 8A to FIG. 8C in including a layer 186 serving as both a light-emitting layer and an active layer instead of including the active layer 183 and the light-emitting layer 193.

As the layer 186 serving as both a light-emitting layer and an active layer, a layer containing three materials, which are an n-type semiconductor that can be used for the active layer 183, a p-type semiconductor that can be used for the active layer 183, and a light-emitting substance that can be used for the light-emitting layer 193, can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

In the light-emitting and light-receiving device, a conductive film that transmits visible light is used as the electrode through which light is extracted. A conductive film that reflects visible light is preferably used as the electrode through which light is not extracted.

When the light-emitting and light-receiving device is driven as a light-emitting device, the hole-injection layer serves as a layer that injects holes from the anode to the hole-transport layer. The hole-injection layer is a layer containing a material with a high hole-injection property. As the material with a high hole-injection property, an aromatic amine compound and a composite material containing a hole-transport material and an acceptor material (electron-accepting material) can be used.

When the light-emitting and light-receiving device is driven as a light-emitting device, the hole-transport layer serves as a layer that transports holes injected from the anode by the hole-injection layer, to the light-emitting layer. When the light-emitting and light-receiving device is driven as a light-receiving device, the hole-transport layer serves as a layer that transports holes generated in the active layer on the basis of incident light, to the anode. The hole-transport layer is a layer containing a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

When the light-emitting and light-receiving device is driven as a light-emitting device, the electron-transport layer serves as a layer that transports electrons injected from the cathode by the electron-injection layer, to the light-emitting layer. When the light-emitting and light-receiving device is driven as a light-receiving device, the electron-transport layer serves as a layer that transports electrons generated in the active layer on the basis of incident light, to the cathode. The electron-transport layer is a layer containing an electron-transport material. As the electron-transport material, a substance with an electron mobility greater than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

When the light-emitting and light-receiving device is driven as a light-emitting device, the electron-injection layer serves as a layer that injects electrons from the cathode to the electron-transport layer. The electron-injection layer is a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 193 is a layer that contains a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material are a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 193 may contain one or more kinds of organic compounds (e.g., a host material and an assist material) in addition to the light-emitting substance (guest material). As the one or more kinds of organic compounds, one or both of the hole-transport material and the electron-transport material can be used. As the one or more kinds of organic compounds, a bipolar material or a TADF material may be used.

The light-emitting layer 193 preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of an absorption band on the lowest energy side of the light-emitting substance, energy can be transferred smoothly and light emission can be obtained efficiently. With this structure, high efficiency, low-voltage driving, and a long lifetime of the light-emitting device can be achieved at the same time.

In the combination of materials for forming an exciplex, the HOMO level (the highest occupied molecular orbital level) of the hole-transport material is preferably higher than or equal to the HOMO level of the electron-transport material. In addition, the LUMO level (the lowest unoccupied molecular orbital level) of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 183 contains a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 and the active layer 183 can be formed by the same method (e.g., a vacuum evaporation method) and thus the same manufacturing apparatus can be used.

Examples of an n-type semiconductor material included in the active layer 183 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When $\pi$-electron conjugation (resonance) spreads in a plane as in benzene, the electron-donating property (donor property) usually increases. Although $\pi$-electrons widely spread in fullerene having a spherical shape, its electron-accepting property is high. The high electron-accepting property efficiently causes rapid charge separation and is useful for light-receiving devices. Both $C_{60}$ and $C_{70}$ have a wide absorption band in the visible light region, and $C_{70}$ is especially preferable because of having a larger $\pi$-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of the p-type semiconductor material contained in the active layer 183 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of the p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 183 is preferably formed by co-evaporation of an n-type semiconductor and a p-type semiconductor.

The layer 186 serving as both a light-emitting layer and an active layer is preferably formed using the above-described light-emitting material, n-type semiconductor, and p-type semiconductor.

The hole-injection layer 181, the hole-transport layer 182, the active layer 183, the light-emitting layer 193, the electron-transport layer 184, the electron-injection layer 185, and the layer 186 serving as both a light-emitting layer and an active layer may be formed using either a low-molecular compound or a high-molecular compound and may contain an inorganic compound. Each layer can be formed by an evaporation method (including a vacuum evaporation method), a transfer method, a printing method, an inkjet method, a coating method, or the like.

The detailed structures of the light-emitting and light-receiving device and the light-emitting device included in the display apparatus of one embodiment of the present invention will be described below with reference to FIG. 9 to FIG. 11.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

FIG. 9 to FIG. 11 illustrate top-emission display apparatuses as examples.

Structure Example 1

Figure 9A:
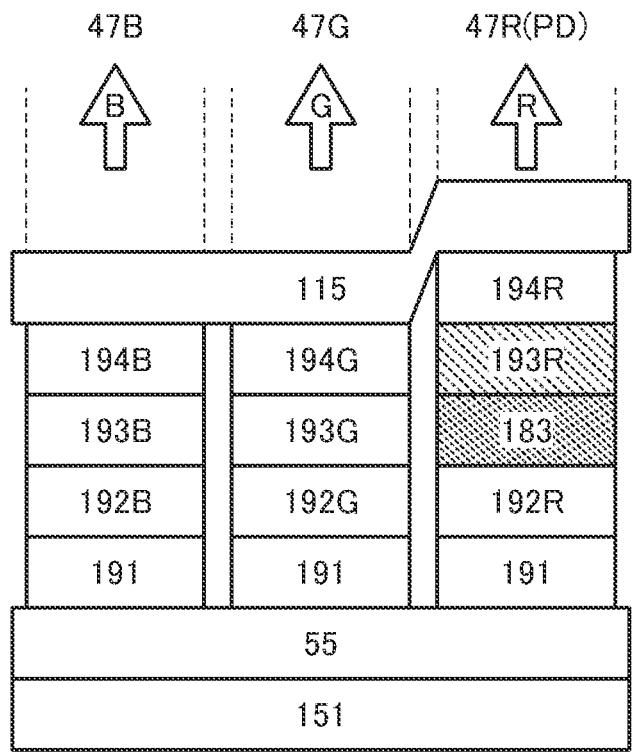
FIG. 9A and FIG. 9B are cross-sectional views illustrating examples of display apparatuses.
Figure 9B:
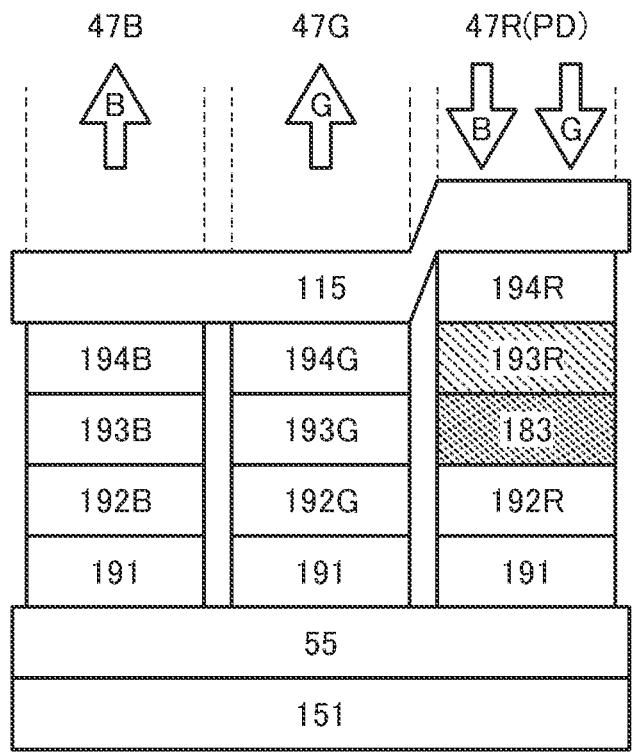

The display apparatus illustrated in FIG. 9A and FIG. 9B includes a light-emitting device 47B that emits blue (B) light, a light-emitting device 47G that emits green (G) light, and a light-emitting and light-receiving device 47R(PD) that emits red (R) light and has a light-receiving function over a substrate 151 with the layer 55 including transistors therebetween.

FIG. 9A illustrates a case where the light-emitting and light-receiving device 47R(PD) functions as a light-emitting device. FIG. 9A illustrates an example in which the light-emitting device 47B emits blue light, the light-emitting device 47G emits green light, and the light-emitting and light-receiving device 47R(PD) emits red light.

FIG. 9B illustrates a case where the light-emitting and light-receiving device 47R(PD) functions as a light-receiving device. FIG. 9B illustrates an example in which the light-emitting and light-receiving device 47R(PD) detects blue light emitted from the light-emitting device 47B and green light emitted from the light-emitting device 47G.

The light-emitting device 47B, the light-emitting device 47G, and the light-emitting and light-receiving device 47R (PD) each include a pixel electrode 191 and a common electrode 115. In this embodiment, the case where the pixel electrode 191 functions as an anode and the common electrode 115 functions as a cathode is described as an example.

In the description made in this embodiment, also in the light-emitting and light-receiving device 47R(PD), the pixel electrode 191 functions as an anode and the common electrode 115 functions as a cathode as in the light-emitting device. In other words, when the light-emitting and light-receiving device 47R(PD) is driven by application of reverse bias between the pixel electrode 191 and the common electrode 115, the light-emitting and light-receiving device 47R(PD) can detect light entering the light-emitting and light-receiving device 47R(PD) and can generate and extract charge as current.

The common electrode 115 is shared by the light-emitting device 47B, the light-emitting device 47G, and the light-emitting and light-receiving device 47R(PD). The pixel electrodes 191 included in the light-emitting device 47B, the light-emitting device 47G, and the light-emitting and light-receiving device 47R(PD) are electrically insulated from one another (also referred to as electrically isolated from one another).

The materials, thicknesses, and the like of the pair of electrodes included in the light-emitting device 47B, the light-emitting device 47G, and the light-emitting and light-receiving device 47R(PD) can be equal to one another. Accordingly, the manufacturing cost of the display apparatus can be reduced and the manufacturing process of the display apparatus can be simplified.

The structures of the display apparatuses illustrated in FIG. 9A and FIG. 9B will be specifically described.

The light-emitting device 47B includes a buffer layer 192B, a light-emitting layer 193B, and a buffer layer 194B in this order over the pixel electrode 191. The light-emitting layer 193B contains a light-emitting substance that emits blue light. The light-emitting device 47B has a function of emitting blue light.

The light-emitting device 47G includes a buffer layer 192G, a light-emitting layer 193G, and a buffer layer 194G in this order over the pixel electrode 191. The light-emitting layer 193G contains a light-emitting substance that emits green light. The light-emitting device 47G has a function of emitting green light.

The light-emitting and light-receiving device 47R(PD) includes a buffer layer 192R, the active layer 183, a light-emitting layer 193R, and a buffer layer 194R in this order over the pixel electrode 191. The light-emitting layer 193R contains a light-emitting substance that emits red light. The active layer 183 contains an organic compound that absorbs light having a shorter wavelength than red light (e.g., one or both of green light and blue light). Note that an organic compound that absorbs ultraviolet light as well as visible light may be used for the active layer 183. The light-emitting and light-receiving device 47R(PD) has a function of emitting red light. The light-emitting and light-receiving device 47R(PD) has a function of detecting at least one of light emission of the light-emitting device 47G and light emission of the light-emitting device 47B and preferably has a function of detecting both of them.

The active layer 183 preferably contains an organic compound that does not easily absorb red light and that absorbs light having a shorter wavelength than red light. Thus, the light-emitting and light-receiving device 47R(PD) can have a function of efficiently emitting red light and a function of accurately detecting light having a shorter wavelength than red light.

The pixel electrode 191, the buffer layer 192R, the buffer layer 192G, the buffer layer 192B, the active layer 183, the light-emitting layer 193R, the light-emitting layer 193G, the light-emitting layer 193B, the buffer layer 194R, the buffer layer 194G, the buffer layer 194B, and the common electrode 115 may each have a single-layer structure or a stacked-layer structure.

In each of the display apparatuses in FIG. 9A and FIG. 9B, the buffer layers, the active layer, and the light-emitting layer are separately formed for the devices.

The buffer layers 192R, 192G, and 192B can each include one or both of a hole-injection layer and a hole-transport layer. Furthermore, the buffer layers 192R, 192G, and 192B may each include an electron-blocking layer. The buffer layers 194B, 194G, and 194R can each include one or both of an electron-injection layer and an electron-transport layer. Furthermore, the buffer layers 194R, 194G, and 194B may each include a hole-blocking layer. Note that the above description of the layers included in the light-emitting and light-receiving device can be referred to for materials or the like of the layers included in the light-emitting devices.

Structure Example 2

Figure 10A:
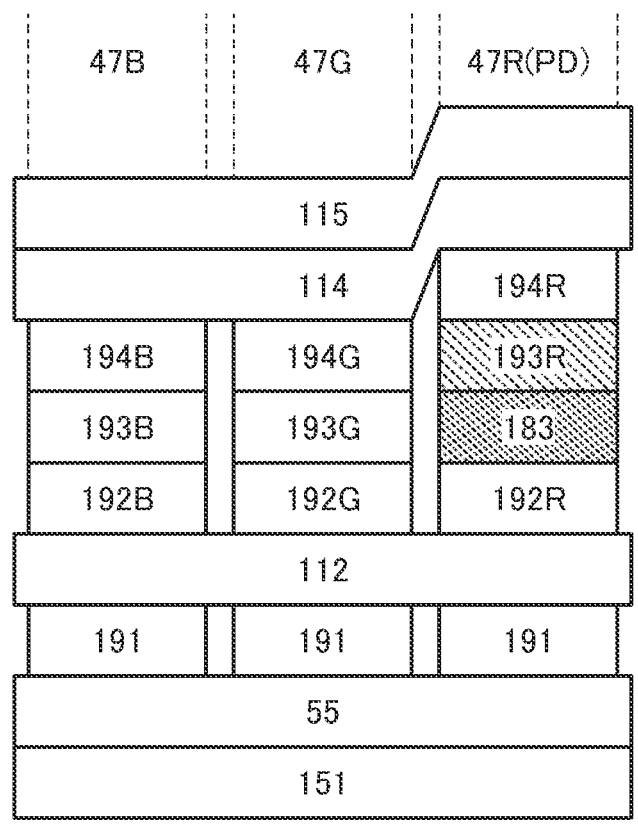
FIG. 10A and FIG. 10B are cross-sectional views illustrating examples of display apparatuses.
Figure 10B:
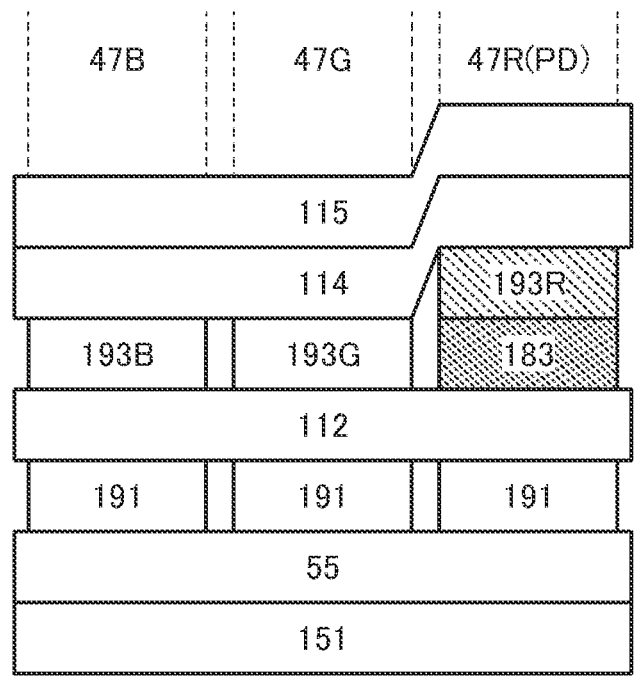

As illustrated in FIG. 10A and FIG. 10B, the light-emitting device 47B, the light-emitting device 47G, and the light-emitting and light-receiving device 47R(PD) may include a common layer between the pair of electrodes. Thus, the light-emitting and light-receiving device can be incorporated into the display apparatus without a significant increase in the number of manufacturing steps.

The light-emitting device 47B, the light-emitting device 47G, and the light-emitting and light-receiving device 47R (PD) illustrated in FIG. 10A include a common layer 112 and a common layer 114 in addition to the components illustrated in FIG. 9A and FIG. 9B.

The light-emitting device 47B, the light-emitting device 47G, and the light-emitting and light-receiving device 47R (PD) illustrated in FIG. 10B are different from those in the structure illustrated in FIG. 9A and FIG. 9B in that the buffer layers 192R, 192G, and 192B and the buffer layers 194R, 194G, and 194B are not included and the common layer 112 and the common layer 114 are included.

The common layer 112 can include one or both of a hole-injection layer and a hole-transport layer. The common layer 114 can include one or both of an electron-injection layer and an electron-transport layer.

The common layer 112 and the common layer 114 may each have a single-layer structure or a stacked-layer structure.

Structure Example 3

Figure 11A:
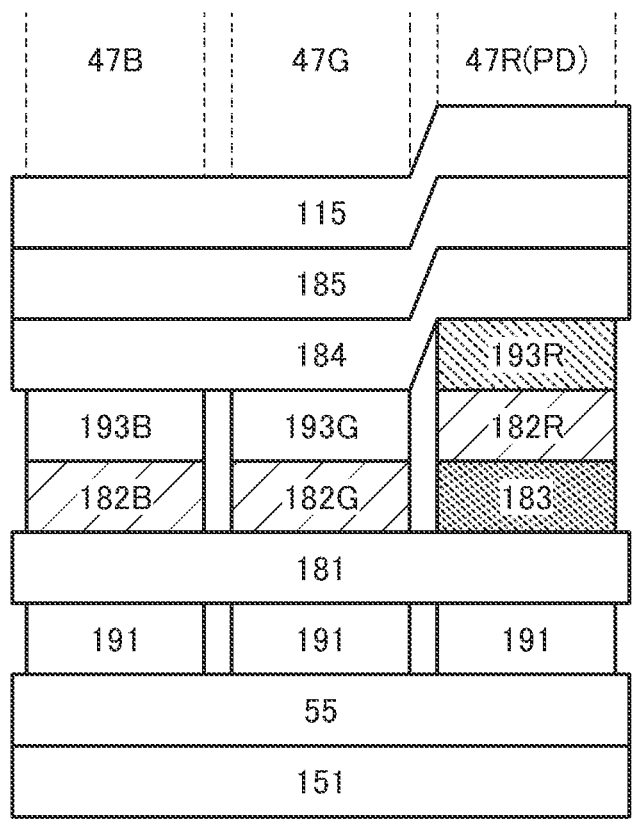
FIG. 11A and FIG. 11B are cross-sectional views illustrating examples of display apparatuses.

A display apparatus illustrated in FIG. 11A is an example in which the stacked-layer structure illustrated in FIG. 8C is used in the light-emitting and light-receiving device 47R (PD).

The light-emitting and light-receiving device 47R(PD) includes the hole-injection layer 181, the active layer 183, a hole-transport layer 182R, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting device 47G and the light-emitting device 47B.

The light-emitting device 47G includes the hole-injection layer 181, a hole-transport layer 182G, the light-emitting layer 193G, the electron-transport layer 184, the electron-injection layer 185, and the common electrode 115 in this order over the pixel electrode 191.

The light-emitting device 47B includes the hole-injection layer 181, a hole-transport layer 182B, the light-emitting layer 193B, the electron-transport layer 184, the electron-injection layer 185, and the common electrode 115 in this order over the pixel electrode 191.

The light-emitting device included in the display apparatus of this embodiment preferably employs a microcavity structure. Therefore, one of the pair of electrodes of the light-emitting device is preferably an electrode having properties of transmitting and reflecting visible light (transflective electrode), and the other is preferably an electrode having a property of reflecting visible light (reflective electrode). When the light-emitting device has a microcavity structure, light obtained from the light-emitting layer can be resonated between the electrodes, whereby light emitted from the light-emitting device can be intensified.

Note that the transflective electrode can have a stacked-layer structure of a reflective electrode and an electrode having a property of transmitting visible light (also referred to as a transparent electrode). In this specification and the like, the reflective electrode functioning as part of a transflective electrode may be referred to as a pixel electrode or a common electrode, and the transparent electrode may be referred to as an optical adjustment layer; however, in some cases, the transparent electrode (optical adjustment layer) can also be regarded as having a function of a pixel electrode or a common electrode.

The light transmittance of the transparent electrode is greater than or equal to 40%. For example, the light-emitting device preferably includes an electrode having a visible light (light at wavelengths greater than or equal to 400 nm and less than 750 nm) transmittance higher than or equal to 40%. The visible light reflectance of the transflective electrode is higher than or equal to 10% and lower than or equal to 95%, preferably higher than or equal to 30% and lower than or equal to 80%. The visible light reflectance of the reflective electrode is higher than or equal to 40% and lower than or equal to 100%, preferably higher than or equal to 70% and lower than or equal to 100%. These electrodes preferably have a resistivity less than or equal to $1 \times 10^{-2}$ Ωcm. Note that in the case where a light-emitting device that emits near-infrared light is used in the display apparatus, the near-infrared light (light at wavelengths greater than or equal to 750 nm and less than or equal to 1300 nm) transmittance and reflectance of these electrodes are preferably in the above ranges.

The hole-transport layers 182B, 182G, and 182R may each have a function of an optical adjustment layer. Specifically, the thickness of the hole-transport layer 182B is preferably adjusted such that the optical distance between the pair of electrodes in the light-emitting device 47B intensifies blue light. Similarly, the thickness of the hole-transport layer 182G is preferably adjusted such that the optical distance between the pair of electrodes in the light-emitting device 47G intensifies green light. The thickness of the hole-transport layer 182R is preferably adjusted such that the optical distance between the pair of electrodes in the light-emitting and light-receiving device 47R(PD) intensifies red light. The layer used as the optical adjustment layer is not limited to the hole-transport layer. Note that when the transflective electrode has a stacked-layer structure of a reflective electrode and a transparent electrode, the optical distance between the pair of electrodes represents the optical distance between a pair of reflective electrodes.

Structure Example 4

Figure 11B:
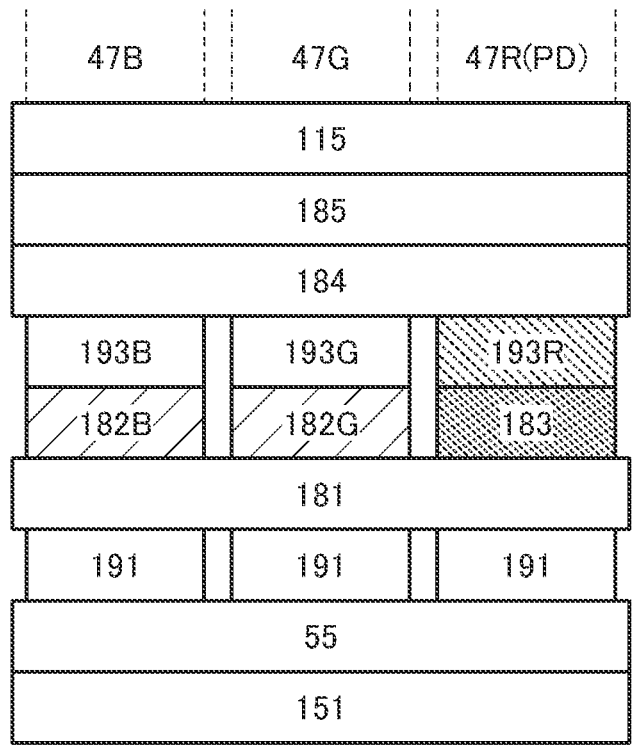

A display apparatus illustrated in FIG. 11B is an example in which the stacked-layer structure illustrated in FIG. 8D is used in the light-emitting and light-receiving device 47R (PD).

The light-emitting and light-receiving device 47R(PD) includes the hole-injection layer 181, the active layer 183, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting device 47G and the light-emitting device 47B.

The light-emitting device 47G includes the hole-injection layer 181, the hole-transport layer 182G, the light-emitting layer 193G, the electron-transport layer 184, the electron-injection layer 185, and the common electrode 115 in this order over the pixel electrode 191.

The light-emitting device 47B includes the hole-injection layer 181, the hole-transport layer 182B, the light-emitting layer 193B, the electron-transport layer 184, the electron-injection layer 185, and the common electrode 115 in this order over the pixel electrode 191.

The hole-transport layer is provided in the light-emitting device 47G and the light-emitting device 47B and is not provided in the light-emitting and light-receiving device 47R(PD). In this manner, a layer provided in only one of the light-emitting devices and the light-emitting and light-receiving device may exist in addition to the active layer and the light-emitting layer.

A detailed structure of the display apparatus of one embodiment of the present invention is described below with reference to FIG. 12 to FIG. 17.

[Display Apparatus 10A]

Figure 12A:
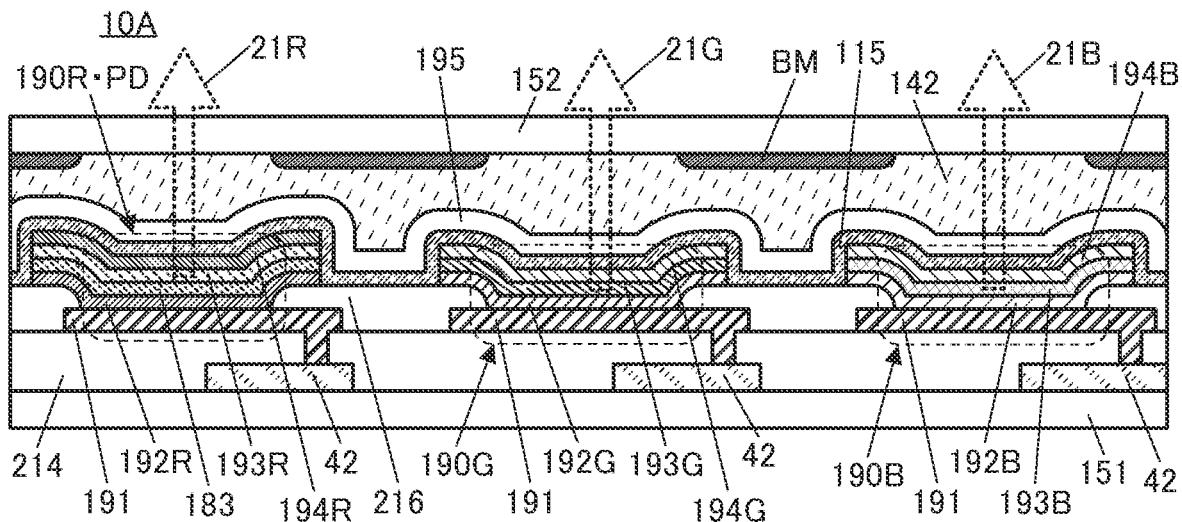
FIG. 12A and FIG. 12B are cross-sectional views illustrating examples of a display apparatus.
Figure 12B:
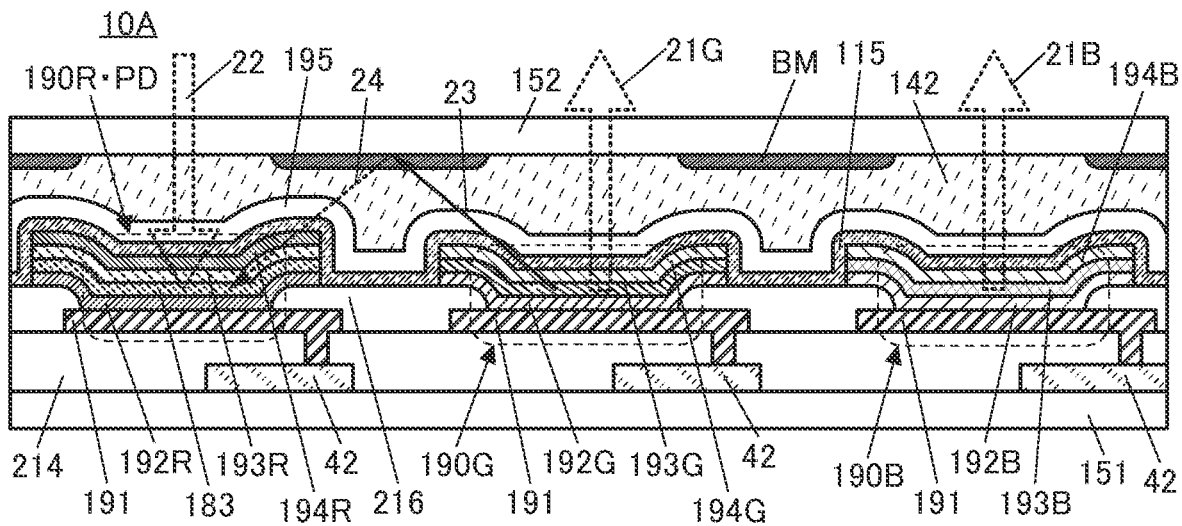

FIG. 12A and FIG. 12B illustrate cross-sectional views of a display apparatus 10A.

The display apparatus 10A includes a light-emitting device 190B, a light-emitting device 190G, and a light-emitting and light-receiving device 190R•PD.

The light-emitting device 190B includes the pixel electrode 191, the buffer layer 192B, the light-emitting layer 193B, the buffer layer 194B, and the common electrode 115. The light-emitting device 190B has a function of emitting blue light 21B.

The light-emitting device 190G includes the pixel electrode 191, the buffer layer 192G, the light-emitting layer 193G, the buffer layer 194G, and the common electrode 115. The light-emitting device 190G has a function of emitting green light 21G.

The light-emitting and light-receiving device 190R•PD includes the pixel electrode 191, the buffer layer 192R, the active layer 183, the light-emitting layer 193R, the buffer layer 194R, and the common electrode 115. The light-emitting and light-receiving device 190R•PD has a function of emitting red light 21R and a function of detecting light 22.

FIG. 12A illustrates a case where the light-emitting and light-receiving device 190R•PD functions as a light-emitting device. FIG. 12A illustrates an example in which the light-emitting device 190B emits blue light, the light-emitting device 190G emits green light, and the light-emitting and light-receiving device 190R•PD emits red light.

FIG. 12B illustrates a case where the light-emitting and light-receiving device 190R•PD functions as a light-receiving device. FIG. 12B illustrates an example in which the light-emitting and light-receiving device 190R•PD detects blue light emitted from the light-emitting device 190B and green light emitted from the light-emitting device 190G.

The pixel electrode 191 is positioned over an insulating layer 214. An end portion of the pixel electrode 191 is covered with a partition 216. Two adjacent pixel electrodes 191 are electrically insulated from each other (also referred to as electrically isolated from each other) by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. Although the details will be described later, a partition 217 that blocks visible light may be provided in place of the partition 216.

The display apparatus 10A includes the light-emitting and light-receiving device 190R•PD, the light-emitting device 190G, the light-emitting device 190B, a transistor 42, and the like between a pair of substrates (the substrate 151 and a substrate 152).

The light-emitting and light-receiving device 190R•PD has a function of detecting light. Specifically, the light-emitting and light-receiving device 190R•PD is a photoelectric conversion device that receives the light 22 entering from the outside of the display apparatus 10A and converts it into an electric signal. The light 22 can also be referred to as light that is emitted from one or both of the light-emitting device 190G and the light-emitting device 190B and then reflected by an object. The light 22 may enter the light-emitting and light-receiving device 190R•PD through a lens.

The light-emitting device 190 has a function of emitting visible light. Specifically, the light-emitting device 190 is an electroluminescent device that emits light toward the substrate 152 (see the light 21G and the light 21B) when voltage is applied between the pixel electrode 191 and the common electrode 115.

The buffer layer 192, the light-emitting layer 193, and the buffer layer 194 can also be referred to as an organic layer (a layer containing an organic compound) or an EL layer. The pixel electrode 191 preferably has a function of reflecting visible light. The common electrode 115 has a function of transmitting visible light.

The pixel electrode 191 is electrically connected to a source or a drain of the transistor 42 through an opening provided in the insulating layer 214. The transistor 42 has a function of controlling the driving of the light-emitting device or the light-emitting and light-receiving device.

At least part of a circuit electrically connected to the light-emitting and light-receiving device 190R•PD is preferably formed using the same material in the same steps as a circuit electrically connected to the light-emitting device 190 of each color. In that case, the thickness of the display apparatus can be reduced compared with the case where the two circuits are separately formed, resulting in simplification of the manufacturing steps.

The light-emitting and light-receiving device 190R•PD and the light-emitting device 190 of each color are preferably covered with a protective layer 195. In FIG. 12A and the like, the protective layer 195 is provided over and in contact with the common electrode 115. Providing the protective layer 195 can inhibit entry of impurities such as the light-emitting and light-receiving device 190R•PD and the light-emitting device of each color, so that the light-emitting and light-receiving device 190R•PD and the light-emitting device of each color can be increased. The protective layer 195 and the substrate 152 are bonded to each other with an adhesive layer 142.

A light-blocking layer BM is provided on a surface of the substrate 152 on the substrate 151 side. The light-blocking layer BM has an opening at the position overlapping with the light-emitting device 190 of each color and an opening at the position overlapping with the light-emitting and light-receiving device 190R•PD. Note that in this specification and the like, the position overlapping with the light-emitting device 190 refers specifically to a position overlapping with a light-emitting region of the light-emitting device 190. Similarly, the position overlapping with the light-emitting and light-receiving device 190R•PD refers specifically to a position overlapping with a light-emitting region and a light-receiving region of the light-emitting and light-receiving device 190R•PD.

As illustrated in FIG. 12B, the light-emitting and light-receiving device 190R•PD can detect light that is emitted from the light-emitting device 190 and then reflected by the object. However, in some cases, light emitted from the light-emitting device 190 is reflected inside the display apparatus 10A and enters the light-emitting and light-receiving device 190R•PD without via an object. The light-blocking layer BM can reduce the influence of such stray light. For example, in the case where the light-blocking layer BM is not provided, light 23 emitted from the light-emitting device 190G is reflected by the substrate 152 and reflected light 24 enters the light-emitting and light-receiving device 190R•PD in some cases. Providing the light-blocking layer BM can inhibit entry of the reflected light 24 into the light-emitting and light-receiving device 190R•PD. Thus, noise can be reduced, and the sensitivity of a sensor using the light-emitting and light-receiving device 190R•PD can be increased.

For the light-blocking layer BM, a material that blocks light emitted from the light-emitting device can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

[Display Apparatus 10B]

Figure 13A:
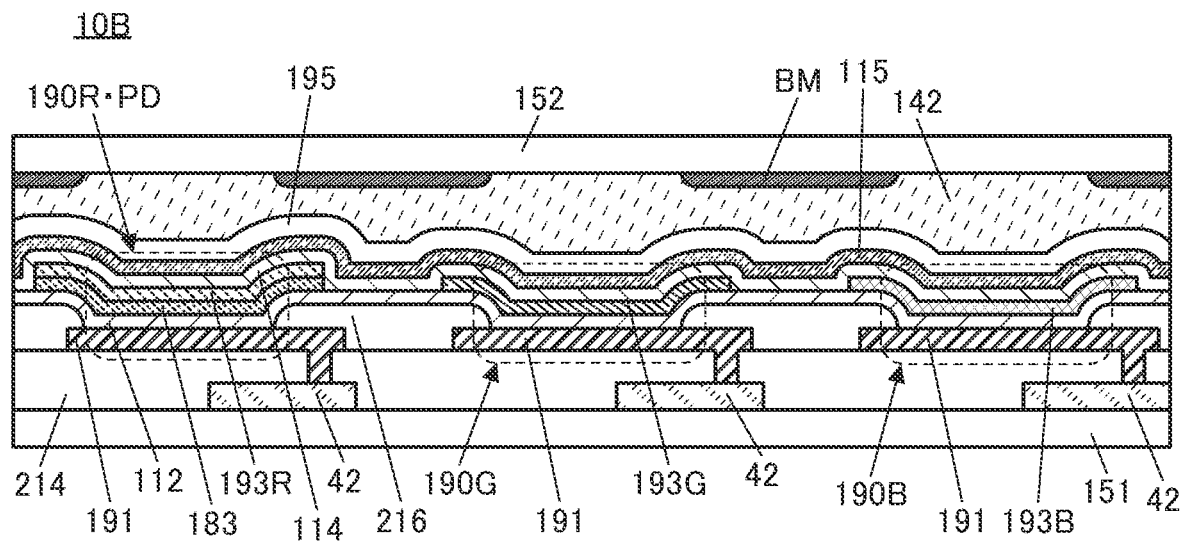
FIG. 13A and FIG. 13B are cross-sectional views illustrating examples of display apparatuses.

A display apparatus 10B illustrated in FIG. 13A is different from the display apparatus 10A in that each of the light-emitting device 190 and the light-emitting and light-receiving device 190R•PD does not include the buffer layer 192 and the buffer layer 194 and includes the common layer 112 and the common layer 114. Note that in the description of the display apparatus below, components similar to those of the above-mentioned display apparatus are not described in some cases.

Note that the stacked-layer structure of the light-emitting device 190B, the light-emitting device 190G, and the light-emitting and light-receiving device 190R•PD is not limited to the structures of the display apparatuses 10A and 10B. For example, any of the stacked-layer structures illustrated in FIG. 8 to FIG. 11 can be used for each device, as appropriate.

[Display Apparatus 10C]

Figure 13B:
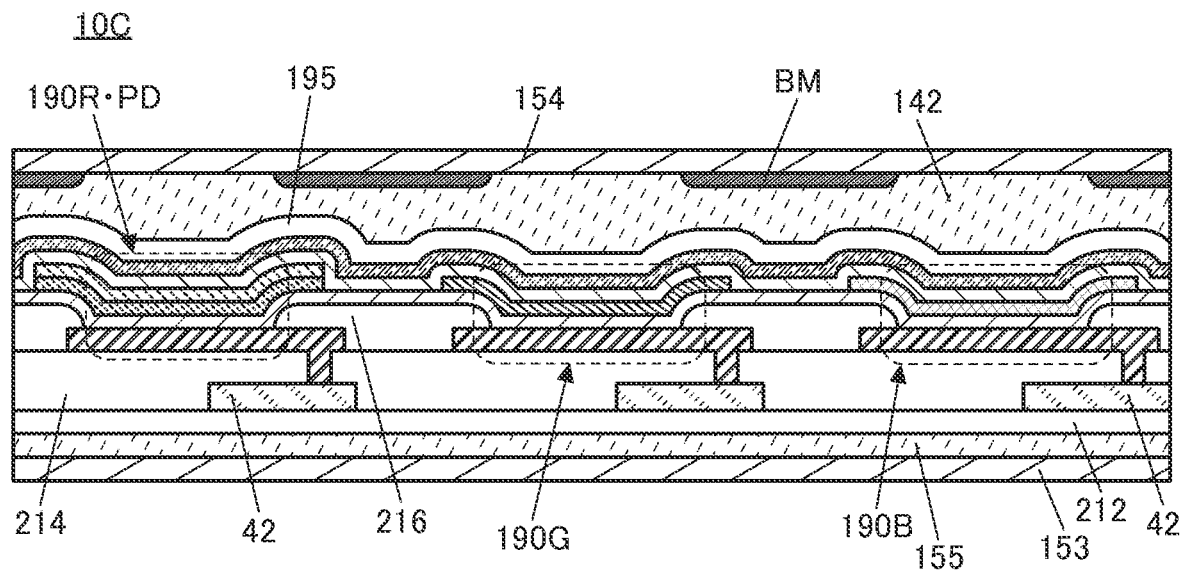

A display apparatus 10C illustrated in FIG. 13B is different from the display apparatus 10B in that the substrate 151 and the substrate 152 are not included but a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display apparatus 10C is formed in such a manner that the insulating layer 212, the transistor 42, the light-emitting and light-receiving device 190R•PD, the light-emitting device 190, and the like that are formed over a formation substrate are transferred onto the substrate 153. The substrate 153 and the substrate 154 preferably have flexibility. Accordingly, the flexibility of the display apparatus 10C can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display device of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

A more detailed structure of the display apparatus of one embodiment of the present invention will be described below with reference to FIG. 14 to FIG. 17.

[Display Apparatus 100A]

Figure 14:
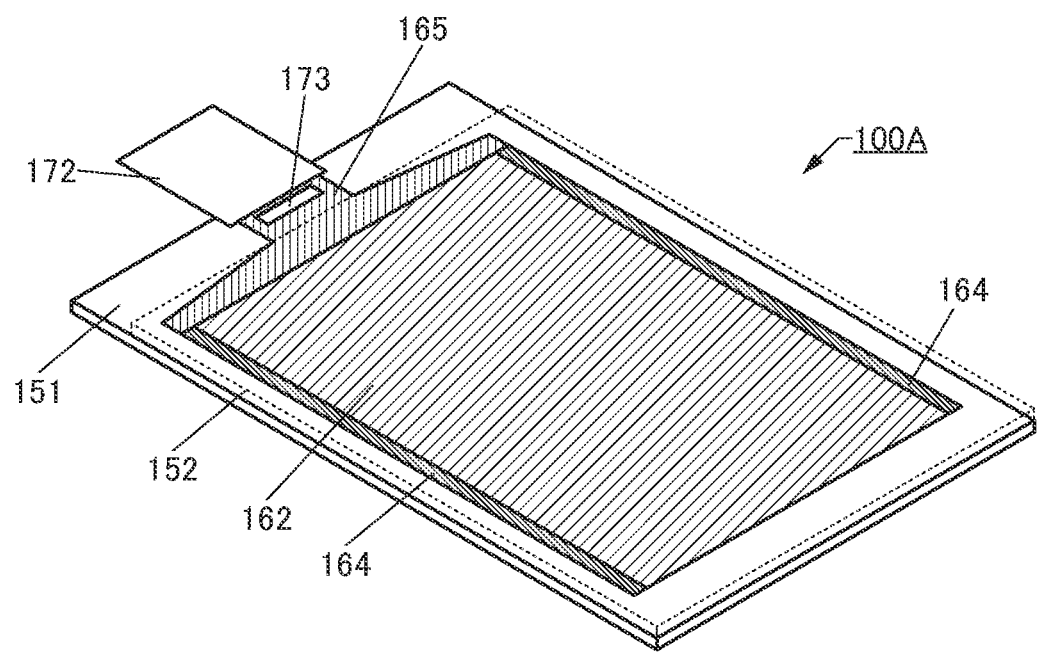
FIG. 14 is a perspective view illustrating an example of a display apparatus.
Figure 15:
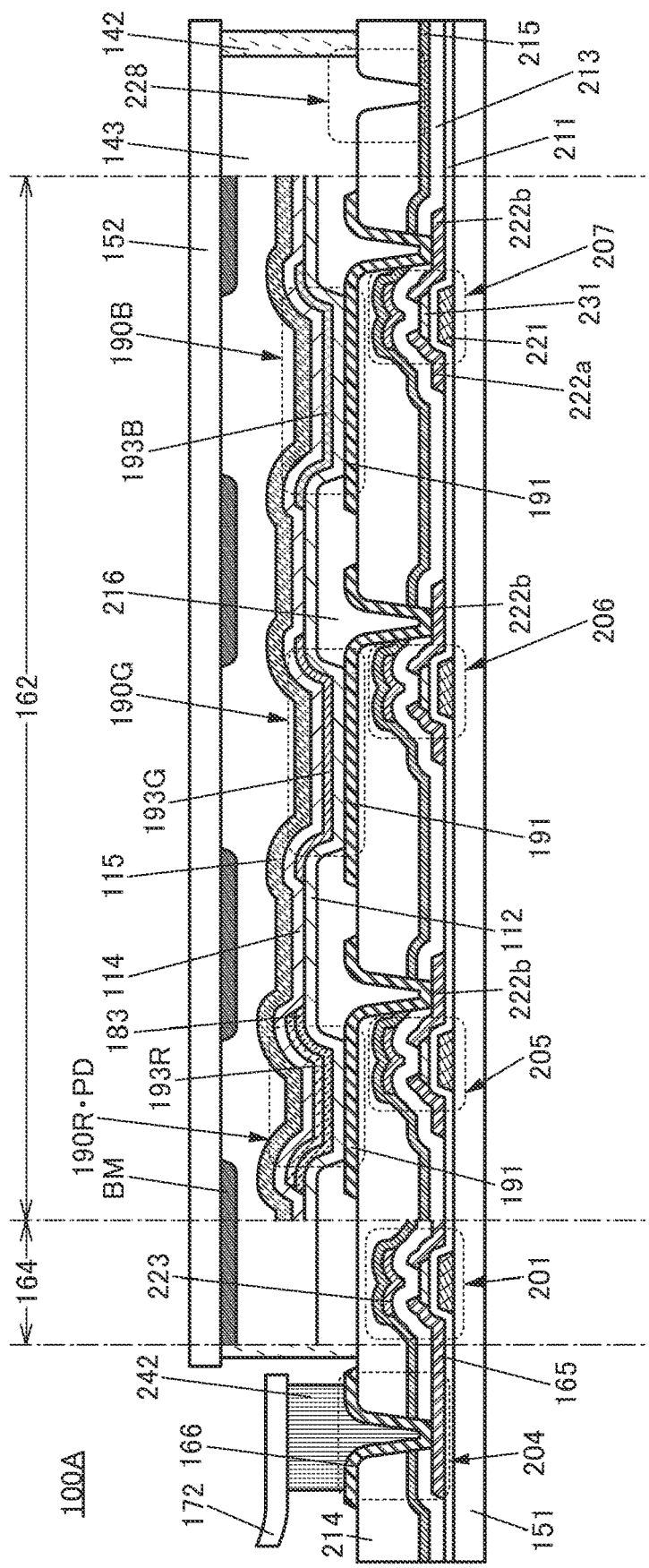
FIG. 15 is a cross-sectional view illustrating an example of the display apparatus.

FIG. 14 illustrates a perspective view of a display apparatus 100A, and FIG. 15 illustrates a cross-sectional view of the display apparatus 100A.

The display apparatus 100A has a structure in which the substrate 152 and the substrate 151 are bonded to each other. In FIG. 14, the substrate 152 is denoted by a dashed line.

The display apparatus 100A includes a display portion 162, a circuit 164, a wiring 165, and the like. FIG. 14 illustrates an example in which the display apparatus 100A is provided with an IC (integrated circuit) 173 and an FPC 172. Thus, the structure illustrated in FIG. 14 can be regarded as a display module including the display apparatus 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or from the IC 173.

FIG. 14 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display apparatus 100A and the display module may have a structure not including an IC. The IC may be mounted on the FPC by a COF method or the like.

FIG. 15 illustrates an example of cross sections of part of a region including the FPC 172, part of a region including the circuit 164, part of a region including the display portion 162, and part of a region including an end portion of the display apparatus 100A illustrated in FIG. 14.

The display apparatus 100A illustrated in FIG. 15 includes a transistor 201, a transistor 205, a transistor 206, a transistor 207, the light-emitting device 190B, the light-emitting device 190G, the light-emitting and light-receiving device 190R·PD, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting device 190B, the light-emitting device 190G, and the light-emitting and light-receiving device 190R·PD. In FIG. 15, a hollow sealing structure is employed in which a space 143 surrounded by the substrate 152, the adhesive layer 142, and the insulating layer 214 is filled with an inert gas (e.g., nitrogen or argon). The adhesive layer 142 may overlap with the light-emitting device 190B, the light-emitting device 190G, and the light-emitting and light-receiving device 190R·PD. The space 143 surrounded by the substrate 152, the adhesive layer 142, and the insulating layer 214 may be filled with a resin different from that of the adhesive layer 142.

The light-emitting device 190B has a stacked-layer structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222b included in the transistor 207 through an opening provided in the insulating layer 214. The transistor 207 has a function of controlling the driving of the light-emitting device 190B. An end portion of the pixel electrode 191 is covered with the partition 216. The pixel electrode 191 contains a material that reflects visible light, and the common electrode 115 contains a material that transmits visible light.

The light-emitting device 190G has a stacked-layer structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222b included in the transistor 206 through an opening provided in the insulating layer 214. The transistor 206 has a function of controlling the driving of the light-emitting device 190G.

The light-emitting and light-receiving device 190R·PD has a stacked-layer structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222b included in the transistor 205 through an opening provided in the insulating layer 214. The transistor 205 has a function of controlling the driving of the light-emitting and light-receiving device 190R·PD.

Light emitted from the light-emitting device 190B, the light-emitting device 190G, and the light-emitting and light-receiving device 190R·PD is emitted toward the substrate 152. Light enters the light-emitting and light-receiving device 190R·PD through the substrate 152 and the space 143. For the substrate 152, a material that has high transmittance with respect to visible light is preferably used.

The pixel electrodes 191 can be formed using the same material in the same step. The common layer 112, the common layer 114, and the common electrode 115 are shared by the light-emitting device 190B, the light-emitting device 190G, and the light-emitting and light-receiving device 190R·PD. The light-emitting and light-receiving device 190R·PD has the structure of the red-light-emitting device to which the active layer 183 is added. The light-emitting device 190B, the light-emitting device 190G, and the light-emitting and light-receiving device 190R·PD can have a common structure except for the active layer 183 and the light-emitting layer 193 of each color. Thus, the display portion 162 of the display apparatus 100A can have a light-receiving function without a significant increase in the number of manufacturing steps.

The light-blocking layer BM is provided on a surface of the substrate 152 on the substrate 151 side. The light-blocking layer BM includes openings in the positions overlapping with the light-emitting device 190B, the light-emitting device 190G, and the light-emitting and light-receiving device 190R·PD. Providing the light-blocking layer BM can control the range where the light-emitting and light-receiving device 190R·PD detects light. Furthermore, with the light-blocking layer BM, light can be inhibited from directly entering the light-emitting and light-receiving device 190R·PD from the light-emitting device 190 without through an object. Hence, a sensor with less noise and high sensitivity can be obtained.

The transistor 201, the transistor 205, the transistor 206, and the transistor 207 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that an end portion of the organic insulating film is positioned on the inner side than the end portion of the display apparatus 100A is, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 15, an opening is formed in the insulating layer 214. This can inhibit entry of impurities into the display portion 162 from the outside through the insulating layer 214 even when an organic insulating film is used as the insulating layer 214. Thus, the reliability of the display apparatus 100A can be increased.

Each of the transistor 201, the transistor 205, the transistor 206, and the transistor 207 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, the transistor 206, and the transistor 207. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that does not overlap with the substrate 152. In the connection portion 204, the wiring 165 is electrically connected to the FPC 172 via a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer surface of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outside of the substrate 152.

For each of the substrate 151 and the substrate 152, glass, quartz, ceramic, sapphire, resin, or the like can be used. When a flexible material is used for the substrate 151 and the substrate 152, the flexibility of the display apparatus can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

As materials that can be used for a gate, a source, and a drain of a transistor and conductive layers such as a variety of wirings and electrodes included in a display apparatus, metals such as aluminum, titanium, chromium, nickel, copper, yttrium, zirconium, molybdenum, silver, tantalum, or tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes included in the display apparatus, and conductive layers (conductive layers functioning as pixel electrodes or common electrodes) included in the light-emitting device and the light-emitting and light-receiving device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Apparatus 100B]

Figure 16:
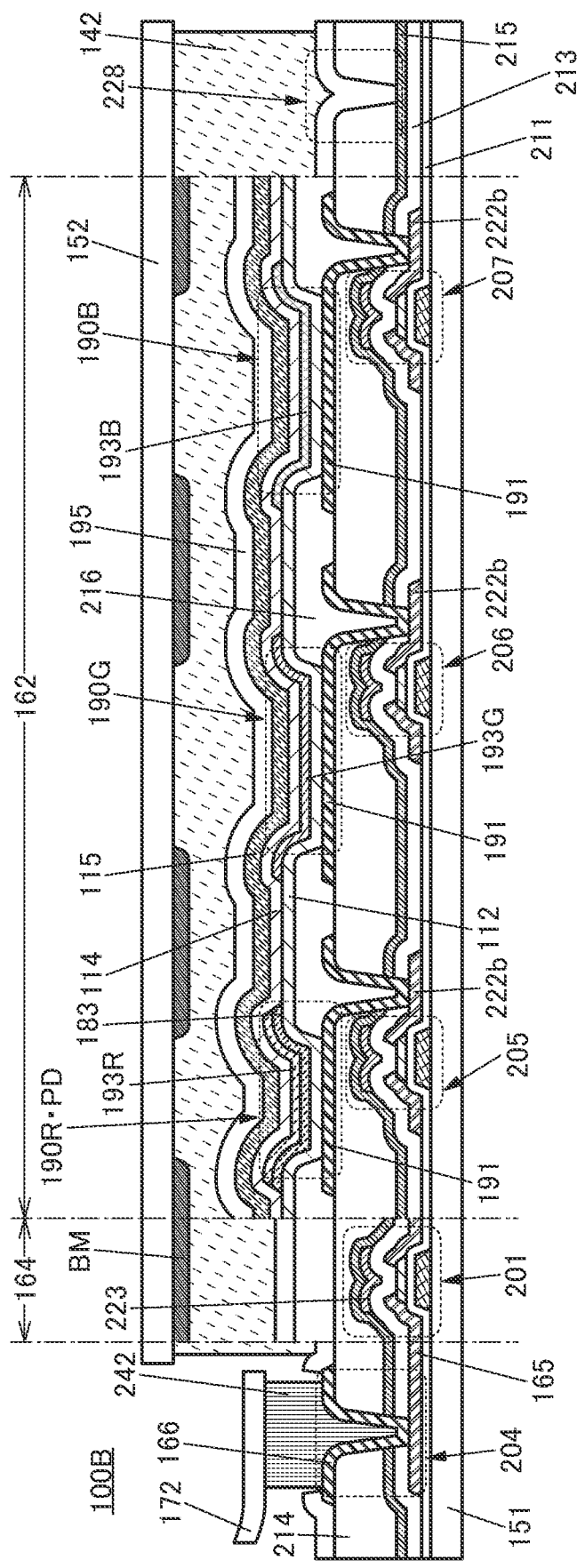
FIG. 16 is a cross-sectional view illustrating an example of a display apparatus.

FIG. 16 illustrates a cross-sectional view of a display apparatus 100B.

The display apparatus 100B is different from the display apparatus 100A mainly in including the protective layer 195. Detailed description of a structure similar to that of the display apparatus 100A is omitted.

When the protective layer 195 covering the light-emitting device 190B, the light-emitting device 190G, and the light-emitting and light-receiving device 190R•PD is provided, impurities such as water can be inhibited from entering the light-emitting device 190B, the light-emitting device 190G, and the light-emitting and light-receiving device 190R•PD, so that the reliabilities of the light-emitting device 190B, the light-emitting device 190G, and the light-emitting and light-receiving device 190R•PD can be increased.

In the region 228 in the vicinity of an end portion of the display apparatus 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Thus, the reliability of the display apparatus 100B can be increased.

The protective layer 195 may have a single-layer structure or a stacked-layer structure; for example, the protective layer 195 may have a three-layer structure that includes an inorganic insulating layer over the common electrode 115, an organic insulating layer over the inorganic insulating layer, and an inorganic insulating layer over the organic insulating layer. In that case, an end portion of the inorganic insulating film preferably extends beyond an end portion of the organic insulating film.

Furthermore, a lens may be provided in a region overlapping with the light-emitting and light-receiving device 190R•PD. Thus, the sensitivity and accuracy of the sensor using the light-emitting and light-receiving device 190R•PD can be increased.

The lens preferably has a refractive index of greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens. Alternatively, zinc sulfide and the like can be used for the lens.

In the display apparatus 100B, the protective layer 195 and the substrate 152 are bonded to each other with the adhesive layer 142. The adhesive layer 142 is provided to overlap with each of the light-emitting device 190B, the light-emitting device 190G, and the light-emitting and light-receiving device 190R•PD; that is, the display apparatus 100B employs a solid sealing structure.

[Display Apparatus 100C]

Figure 17A:
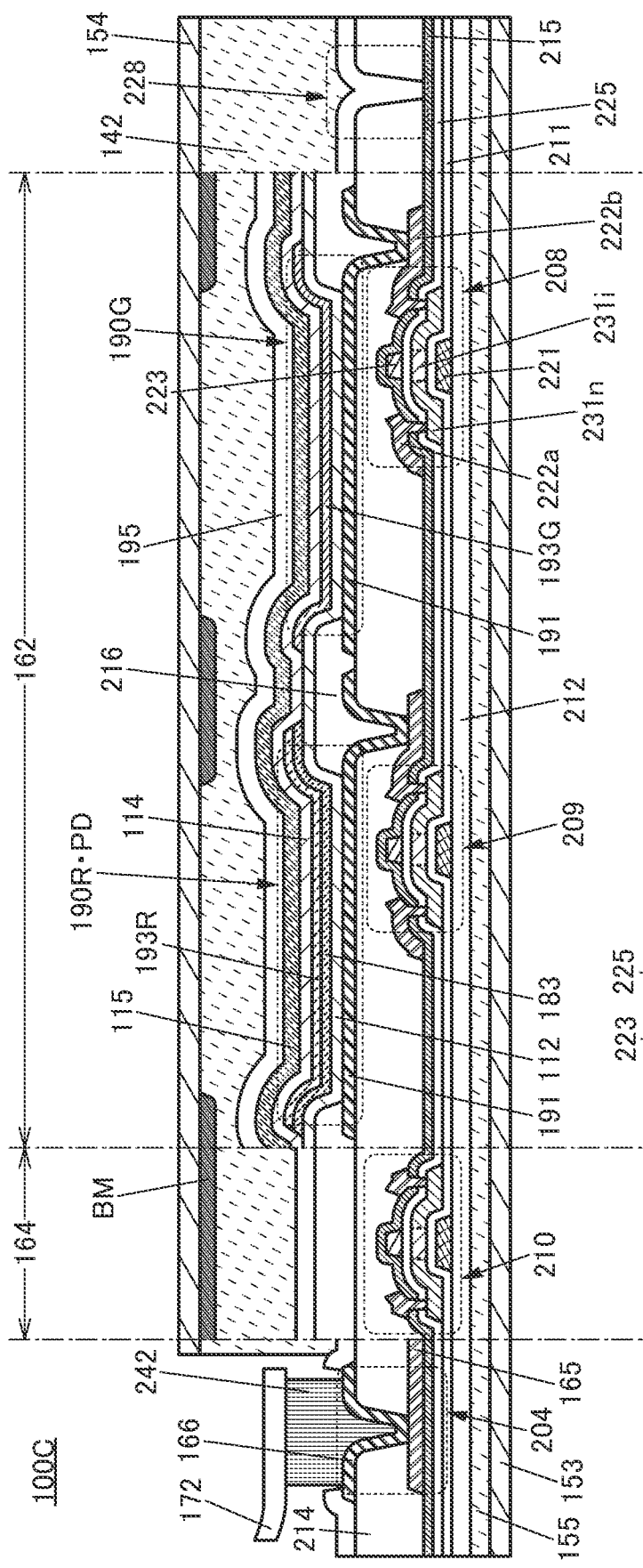
FIG. 17A is a cross-sectional view illustrating an example of a display apparatus.

FIG. 17A illustrates a cross-sectional view of a display apparatus 100C.

The display apparatus 100C is different from the display apparatus 100B in transistor structures.

The display apparatus 100C includes a transistor 208, a transistor 209, and a transistor 210 over the substrate 151.

Each of the transistor 208, the transistor 209, and the transistor 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 225 and the insulating layer 215. One of the conductive layer 222a and the conductive layer 222b serves as a source, and the other serves as a drain.

The pixel electrode 191 of the light-emitting device 190G is electrically connected to one of the pair of low-resistance regions 231n of the transistor 208 through the conductive layer 222b.

The pixel electrode 191 of the light-emitting and light-receiving device 190R•PD is electrically connected to the other of the pair of low-resistance regions 231n of the transistor 209 through the conductive layer 222b.

Figure 17B:
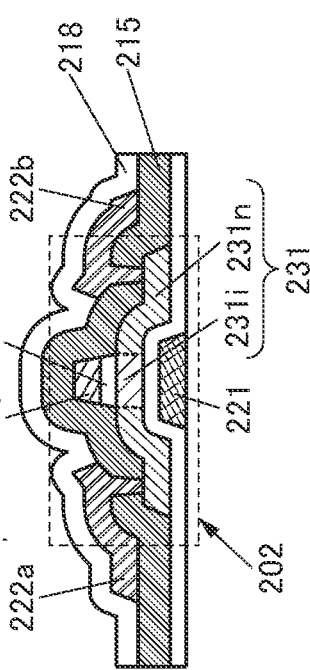
FIG. 17B is a cross-sectional view illustrating an example of a transistor.

FIG. 17A illustrates an example in which the insulating layer 225 covers a top surface and a side surface of the semiconductor layer. Meanwhile, in FIG. 17B, the insulating layer 225 overlaps with the channel formation region 231i of the semiconductor layer 231 and does not overlap with the low-resistance regions 231n. The structure illustrated in FIG. 17B can be manufactured by processing the insulating layer 225 using the conductive layer 223 as a mask, for example. In FIG. 17B, the insulating layer 215 is provided to cover the insulating layer 225 and the conductive layer 223, and the conductive layer 222a and the conductive layer 222b are connected to the corresponding low-resistance regions 231n through the openings in the insulating layer 215. Furthermore, an insulating layer 218 that covers the transistor may be provided over the conductive layer 222a and the conductive layer 222b.

In addition, the display apparatus 100C is different from the display apparatus 100B in that neither the substrate 151 nor the substrate 152 is included and the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The display apparatus 100C is formed in such a manner that the insulating layer 212, the transistor 208, the transistor 209, the transistor 210, the light-emitting and light-receiving device 190R•PD, the light-emitting device 190G, and the like which are formed over a formation substrate are transferred onto the substrate 153. The substrate 153 and the substrate 154 preferably have flexibility. Accordingly, the flexibility of the display apparatus 100C can be increased.

The inorganic insulating film that can be used as the insulating layer 211 and the insulating layer 215 can be used as the insulating layer 212.

In the display apparatus of this embodiment, a subpixel exhibiting any color includes a light-emitting and light-receiving device instead of a light-emitting device as described above. The light-emitting and light-receiving device functions as both a light-emitting device and a light-receiving device, whereby the pixel can have a light-receiving function without an increase in the number of subpixels included in the pixel. Furthermore, the pixel can be provided with a light-receiving function without a reduction in the resolution of the display apparatus or a reduction in the aperture ratio of each subpixel.

This embodiment can be combined with the other embodiments as appropriate.

Embodiment 3

In this embodiment, a light-emitting device that can be used for the display apparatus of one embodiment of the present invention will be described with reference to FIG. 18.

Figure 18A:
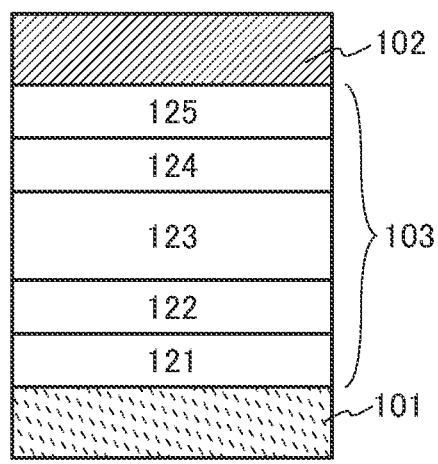
FIG. 18A to FIG. 18D are cross-sectional views illustrating examples of light-emitting devices.

A light-emitting device illustrated in FIG. 18A includes an anode 101, an EL layer 103, and a cathode 102. The light-emitting device illustrated in FIG. 18A has a single structure in which one EL layer is positioned between a pair of electrodes. The EL layer 103 includes a hole-injection layer 121, a hole-transport layer 122, a light-emitting layer 123, an electron-transport layer 124, and an electron-injection layer 125 from the anode 101 side. Although not illustrated in FIG. 18A to FIG. 18D, the light-emitting devices may each include an optical adjustment layer.

The anode 101, the cathode 102, the hole-injection layer 121, the hole-transport layer 122, the light-emitting layer 123, the electron-transport layer 124, and the electron-injection layer 125 may each have a single-layer structure or a stacked-layer structure.

Figure 18B:
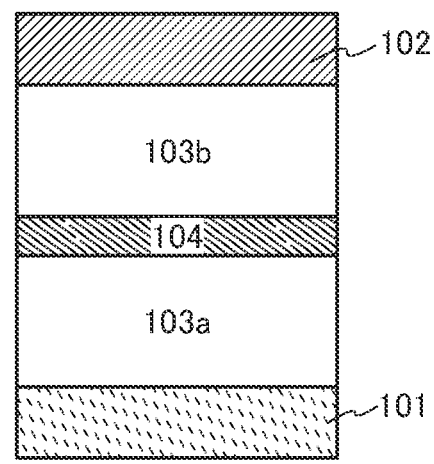

A light-emitting device illustrated in FIG. 18B includes the anode 101, an EL layer 103a, a charge-generation layer 104, an EL layer 103b, and the cathode 102. The light-emitting device illustrated in FIG. 18B has a tandem structure including the charge generation-layer 104 between the two EL layers.

Figure 18C:
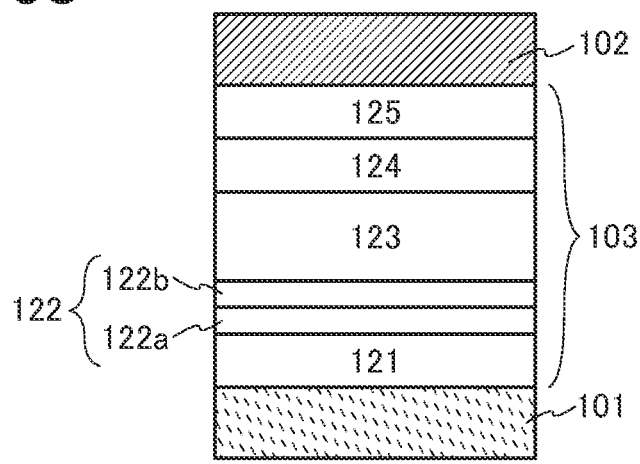
Figure 18D:
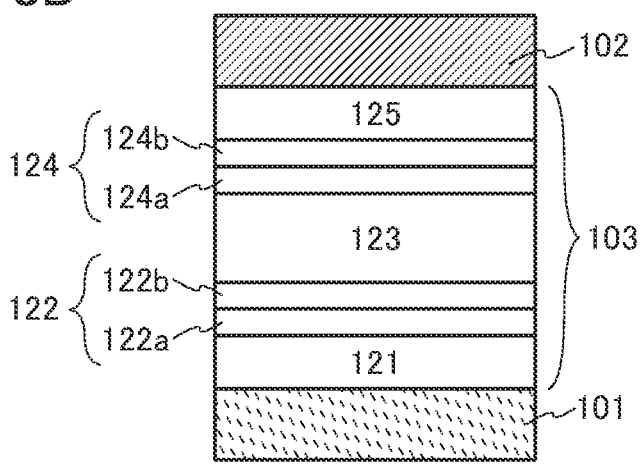

Each of the EL layers in the light-emitting device with a tandem structure can have a structure similar to that of an EL layer in any of light-emitting devices with a single structure illustrated in FIG. 18A, FIG. 18C, and FIG. 18D, for example.

The charge-generation layer 104 has a function of injecting electrons into one of the EL layer 103a and the EL layer 103b and injecting holes into the other of the EL layers when voltage is applied to the anode 101 and the cathode 102. Thus, in FIG. 18B, when voltage is applied such that the potential of the anode 101 is higher than that of the cathode 102, the charge-generation layer 104 injects electrons into the EL layer 103a and injects holes into the EL layer 103b.

Different emission colors of EL layers in a light-emitting device with a tandem structure makes it possible for the light-emitting device as a whole to obtain light emission of an intended color. For example, in a light-emitting device including two EL layers, when red light and green light are emitted from one of the EL layers and blue light is emitted from the other EL layer, the light-emitting device as a whole can emit while light. As another example, in a light-emitting device including three EL layers, when blue light is emitted from a first EL layer, green light is emitted from a second EL layer, and red light is emitted from a third EL layer, the light-emitting device as a whole can emit while light. As another example, in a light-emitting device including three EL layers, when blue light is emitted from a first EL layer, yellow, yellowish green, or green light and red light are emitted from a second EL layer over the first EL layer, and blue light is emitted from a third EL layer over the second EL layer, the light-emitting device as a whole can emit while light. As another example, in a light-emitting device including four EL layers, when blue light is emitted from a first EL layer, yellow, yellowish green, or green light is emitted from one of a second EL layer and a third EL layer over the first EL layer, red light is emitted from the other of the second EL layer and the third EL layer, and blue light is emitted from a fourth EL layer over the second EL layer and the third EL layer, the light-emitting device as a whole can emit while light.

The hole-transport layer 122 included in each of the light-emitting devices illustrated in FIG. 18C and FIG. 18D has a two-layer structure of a hole-transport layer 122a on the hole-injection layer 121 side and a hole-transport layer 122b on the light-emitting layer 123 side.

The electron-transport layer 124 included in the light-emitting device illustrated in FIG. 18D has a two-layer structure of an electron-transport layer 124a on the light-emitting layer 123 side and an electron-transport layer 124b on the electron-injection layer 125 side.

At least one of the hole-injection layer, the hole-transport layer, the electron-transport layer, and the electron-injection layer included in the light-emitting device of this embodiment can be a layer common to the light-emitting and light-receiving device. Consequently, the number of manufacturing steps can be reduced as compared to the case where the light-emitting device and the light-emitting and light-receiving device are separately formed, and the light-emitting device and the light-emitting and light-receiving device can be formed on the same plane.

Materials that can be used for the light-emitting device are described below.

<Electrode>

As a material that forms the pair of electrodes of the light-emitting device, a metal, an alloy, an electrically conductive compound, a mixture thereof, and the like can be used as appropriate. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals. It is also possible to use an element belonging to Group 1 or Group 2 in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, and the like.

In the case of manufacturing a light-emitting device having a microcavity structure, a reflective electrode and a transflective electrode are used. Thus, a single layer or stacked layers can be formed using one or more desired conductive materials. For fabrication of the electrodes, a sputtering method or a vacuum evaporation method can be used.

<Hole-Injection Layer>

The hole-injection layer 121 contains a first compound and a second compound.

The first compound is an electron-accepting material (an acceptor material) and has a property of accepting electrons from the second compound.

The second compound is a hole-transport material. The hole-transport material has a hole-transport property higher than an electron-transport property.

The highest occupied molecular orbital level (HOMO level) of the second compound is preferably relatively low (deep). Specifically, the HOMO level of the second compound is preferably higher than or equal to −5.7 eV and lower than or equal to −5.4 eV. A relatively low HOMO level of the second compound is preferable because hole injection into the hole-transport layer 122 can be easily performed.

As the first compound, an organic compound having an electron-withdrawing group (particularly a cyano group or a halogen group such as a fluoro group) can be used.

For example, as the first compound, organic acceptors such as a quinodimethane derivative, a chloranil derivative, and a hexaazatriphenylene derivative can be used.

The second compound preferably has a hole-transport skeleton. A carbazole skeleton, a dibenzofuran skeleton, a dibenzothiophene skeleton, and an anthracene skeleton, with which the HOMO levels of the hole-transport materials do not become too high (shallow), are preferably used as the hole-transport skeleton.

The second compound preferably has at least one of a carbazole skeleton, a dibenzofuran skeleton, a dibenzothiophene skeleton, and an anthracene skeleton. The second compound may be an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group.

The second compound having an N,N-bis(4-biphenyl) amino group is preferred because a light-emitting device having a long lifetime can be manufactured.

<Hole-Transport Layer>

The hole-transport layer 122 is a layer that transports holes injected by the hole-injection layer 121, to the light-emitting layer 123.

The hole-transport layer 122 preferably contains a third compound.

The third compound is a hole-transport material. As the hole-transport material, a hole-transport material that can be used as the second compound can be used.

The HOMO level of the third compound is preferably a value lower than or equal to the HOMO level of the second compound. The difference between the HOMO level of the third compound and the HOMO level of the second compound is preferably 0.2 eV or less.

The second compound and the third compound each preferably have at least one of a carbazole skeleton, a dibenzofuran skeleton, a dibenzothiophene skeleton, and an anthracene skeleton.

It is preferable that the second compound and the third compound have the same hole-transport skeleton (particularly a dibenzofuran skeleton), in which case holes can be injected smoothly.

It is further preferable that the second compound and the third compound be the same compound, in which case holes can be injected smoothly.

In the case where the hole-transport layer 122 has a stacked-layer structure, each of the layers included in the hole-transport layer 122 is a layer that transports holes to the light-emitting layer 123.

The hole-transport layer 122a in FIG. 18C and FIG. 18D can have a structure similar to that of the hole-transport layer 122 in FIG. 18A.

The hole-transport layer 122b in FIG. 18C and FIG. 18D (i.e., the layer in the hole-transport layer 122 which is positioned closest to the light-emitting layer 123) preferably has a function of an electron-blocking layer.

The hole-transport layer 122b preferably contains a fourth compound.

The fourth compound is a hole-transport material. As the hole-transport material, a hole-transport material that can be used as the second compound can be used.

The HOMO level of the fourth compound is preferably lower than the HOMO level of the third compound. A difference between the HOMO level of the fourth compound and the HOMO level of the third compound is preferably 0.2 eV or less.

The second compound, the third compound, and the fourth compound each preferably have at least one of a carbazole skeleton, a dibenzofuran skeleton, a dibenzothiophene skeleton, and an anthracene skeleton.

It is preferable that the second compound, the third compound, and the fourth compound have the same hole-transport skeleton (particularly a dibenzofuran skeleton), in which case holes can be injected smoothly.

When the second compound and the third compound (and also the fourth compound) have a small difference in the HOMO level or have a hole-transport skeleton (preferably the same hole-transport skeleton) as described above, holes are smoothly injected into the hole-injection layer and the hole transport layer, thereby preventing an increase in driving voltage and deficiency of holes in the light-emitting layer 123.

<Light-Emitting Layer>

The light-emitting layer is a layer containing a light-emitting substance. As the light-emitting layer, the material and structure that can be used for the light-emitting layer of the light-emitting and light-receiving device in Embodiment 1 can be used.

<Electron-Transport Layer>

The electron-transport layer 124 is a layer that transports electrons injected from the cathode 102, to the light-emitting layer 123.

The electron-transport layer 124 contains an electron-transport material and a first substance.

The electron-transport material has an electron-transport property higher than a hole-transport property.

The electron-transport material used for the electron-transport layer 124 preferably has a highest occupied molecular orbital level (HOMO level) higher than or equal to −6.0 eV.

The electron mobility of the electron-transport material used for the electron-transport layer 124 is preferably higher than or equal to $1 \times 10^{-7}$ cm$^2$/Vs and lower than or equal to $1 \times 10^{-5}$ cm$^2$/Vs, further preferably higher than or equal to $1 \times 10^{-7}$ cm$^2$/Vs and lower than or equal to $5 \times 10^{-5}$ cm$^2$/Vs when the square root of electric field strength [V/cm] is 600.

The electron mobility of the electron-transport material used for the electron-transport layer 124 when the square root of the electric field strength [V/cm] is 600 is preferably lower than the electron mobility of the host material of the light-emitting layer 123 when the square root of the electric field strength [V/cm] is 600. The amount of electrons injected into the light-emitting layer 123 can be controlled by reduction in the electron-transport property of the electron-transport layer 124, whereby the light-emitting layer 123 can be prevented from having excess electrons.

The electron-transport material used for the electron-transport layer 124 preferably has an anthracene skeleton, and further preferably has an anthracene skeleton and a heterocyclic skeleton. The heterocyclic skeleton is preferably a nitrogen-containing five-membered ring skeleton. It is particularly preferable that the nitrogen-containing five-membered ring skeleton include two heteroatoms in a ring, like a pyrazol ring, an imidazole ring, an oxazole ring, or, a thiazole ring.

The first substance is a metal, a metallic salt, a metal oxide, or an organometallic salt.

Examples of the metal include an alkali metal, an alkaline earth metal, and a rare earth metal. Specific examples include Li, Na, K, Rb, Cs, Mg, Ca, Sr, and Ba.

Examples of the metallic salt include halides of the above metals and carbonates of the above metals. Specific examples include LiF, NaF, KF, RbF, CsF, MgF$_2$, CaF$_2$, SrF$_2$, BaF$_2$, LiCl, NaCl, KCl, RbCl, CsCl, MgCl$_2$, CaCl$_2$, SrCl$_2$, BaCl$_2$, Li$_2$CO$_3$, and Cs$_2$CO$_3$.

Examples of the metal oxide are oxides of the above metals. Specific examples include Li$_2$O, Na$_2$O, Cs$_2$O, MgO, and CaO.

Examples of the organometallic salt include organometallic complexes.

The first substance is preferably an organometallic complex containing an alkali metal or an alkaline earth metal.

The first substance is preferably an organometallic complex including a ligand containing nitrogen and oxygen, and an alkali metal or an alkaline earth metal.

The first substance is preferably an organometallic complex including a quinolinol ligand, and an alkali metal or an alkaline earth metal.

Examples of the organometallic complex include 8-quinolinolato lithium (abbreviation: Liq), 8-quinolinolato sodium (abbreviation: Naq), 8-quinolinolato potassium (abbreviation: Kq), bis(8-quinolinolato)magnesium (abbreviation: Mgq$_2$), and bis(8-quinolinolato)zinc (abbreviation: Znq$_2$).

As the first substance, Liq is particularly preferable.

As illustrated in FIG. 18D, the electron-transport layer 124 may include the electron-transport layer 124a on the light-emitting layer 123 side and the electron-transport layer 124b on the cathode 102 side. The electron-transport layer 124a and the electron-transport layer 124b preferably differ in the concentration ratio of the electron-transport material to the first substance. For example, the concentration of the first substance is preferably higher in the electron-transport layer 124a than in the electron-transport layer 124b.

<Electron-Injection Layer>

The electron-injection layer 125 is a layer that increases the injection efficiency of electrons from the cathode 102. The difference between the work function of the material of the cathode 102 and the LUMO level of the material used for the electron-injection layer 125 is preferably small (0.5 eV or less).

<Charge-Generation Layer>

The charge-generation layer 104 has a function of injecting electrons into the EL layer 103a and injecting holes into the EL layer 103b when voltage is applied between the anode 101 and the cathode 102.

The charge-generation layer 104 may contain a hole-transport material and an acceptor material or may contain an electron-transport material and a donor material. Forming the charge-generation layer 104 with such a structure can inhibit an increase in the driving voltage that would be caused by stacking EL layers.

[Light Emission Model in Light-Emitting Device]

A light emission model of the light-emitting device of this embodiment will be described.

Here, a light emission model of a light-emitting device is described using the hole-transport layer 122, the light-emitting layer 123, and the electron-transport layer 124 illustrated in FIG. 18A. The structure of the light-emitting device is not limited to FIG. 18A, and the light emission model can also be applied to another structure.

Figure 19A:
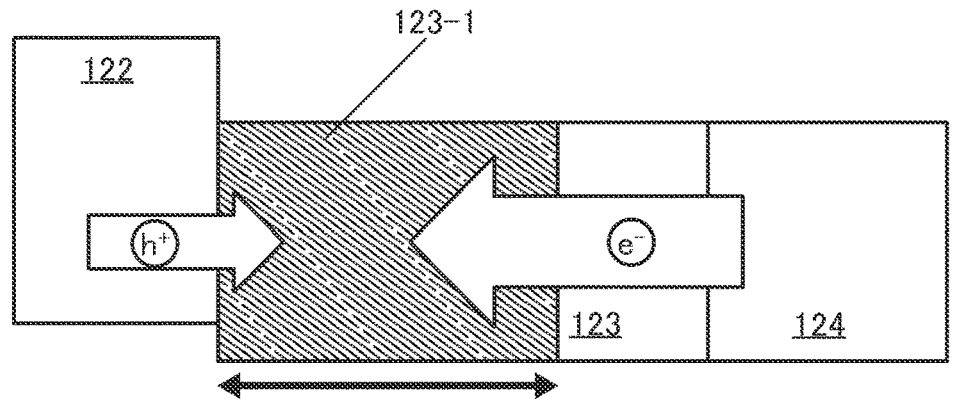
FIG. 19A to FIG. 19C are conceptual diagrams illustrating light-emitting models of a light-emitting device.

When the light-emitting layer 123 has excess electrons, a light-emitting region 123-1 is formed in a limited region of the light-emitting layer 123, as illustrated in FIG. 19A. In other words, the width of the light-emitting region 123-1 in the light-emitting layer 123 is small. Therefore, electrons ($e^-$) and holes ($h^+$) are recombined intensively in the limited region of the light-emitting layer 123, which accelerates degradation. In addition, the lifetime or emission efficiency may be reduced when electrons that have not been recombined in the light-emitting layer 123 pass through the light-emitting layer 123.

Figure 19B:
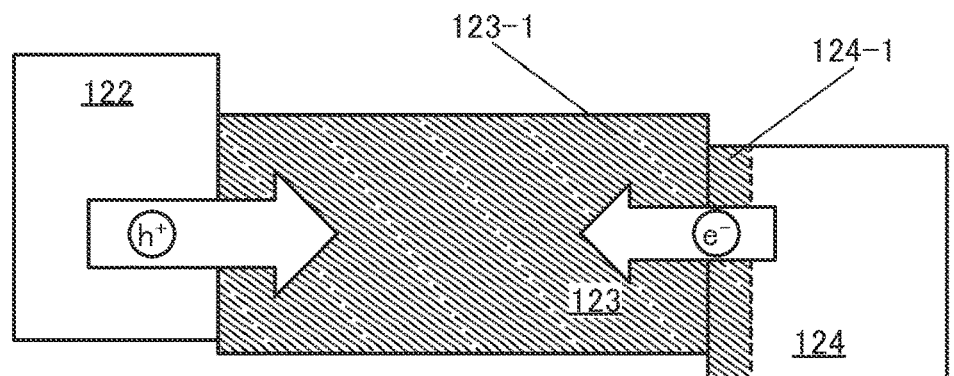
Figure 19C:
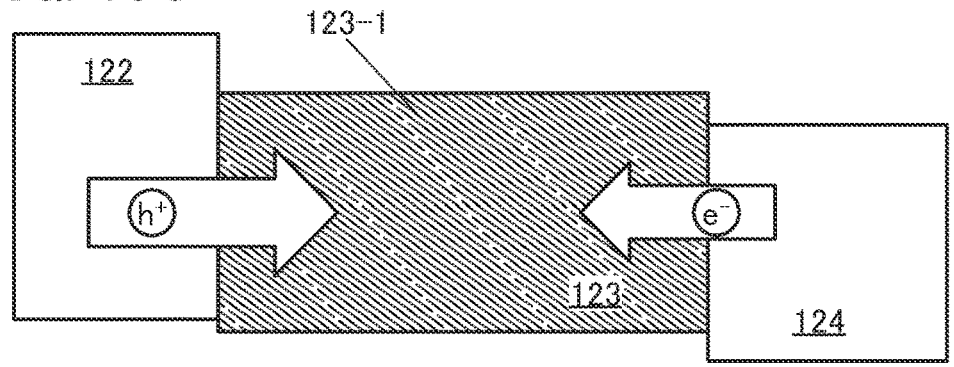

Meanwhile, in the light-emitting device of one embodiment of the present invention, the width of the light-emitting region 123-1 in the light-emitting layer 123 can be increased because of a low electron-transport property of the electron-transport layer 124 (FIG. 19B and FIG. 19C). Increasing the width of the light-emitting region 123-1 enables an electron-hole recombination region in the light-emitting layer 123 to be dispersed. Accordingly, a light-emitting device having a long lifetime and high emission efficiency can be provided.

At the initial driving stage of the light-emitting device of one embodiment of the present invention, a recombination region may extend to the electron-transport layer 124, as illustrated in FIG. 19B. In FIG. 19B, a recombination region in the electron-transport layer 124 is denoted by a region 124-1. Specifically, in the light-emitting device of one embodiment of the present invention, the light-emitting region 123-1 (i.e., the recombination region) may be formed in the entire light-emitting layer 123 and the recombination region may also be formed in the electron-transport layer 124, because a hole injection barrier is small at the initial driving stage and the electron-transport property of the electron-transport layer 124 is relatively low.

Since the HOMO level of the electron-transport material contained in the electron-transport layer 124 is higher than or equal to −6.0 eV, which is relatively high, some holes reach the electron-transport layer 124 to cause recombination also in the electron-transport layer 124 in some cases. Note that this phenomenon sometimes occurs when the difference in the HOMO level between the host material (or the assist material) contained in the light-emitting layer 123 and the electron-transport material contained in the electron-transport layer 124 is 0.2 eV or less.

As illustrated in FIG. 19C, the carrier balance changes over the driving time of the light-emitting device of one embodiment of the present invention, and thus recombination is less likely to occur in the electron-transport layer 124. The recombination in the electron-transport layer 124 is inhibited while the light-emitting region 123-1 is formed in the entire light-emitting layer 123, whereby the energy of recombined carriers can contribute effectively to light emission. Accordingly, the luminance may increase compared to that at the initial driving stage. This luminance increase cancels out the rapid luminance decrease that appears at the initial driving stage of the light-emitting device, which is known as the initial decay; thus, the light-emitting device can have a long driving lifetime with a small initial decay. Note that in this specification and the like, the structure of the above-described light-emitting device is referred to as a Recombination-Site Tailoring Injection structure (ReSTI structure) in some cases.

Figure 19D:
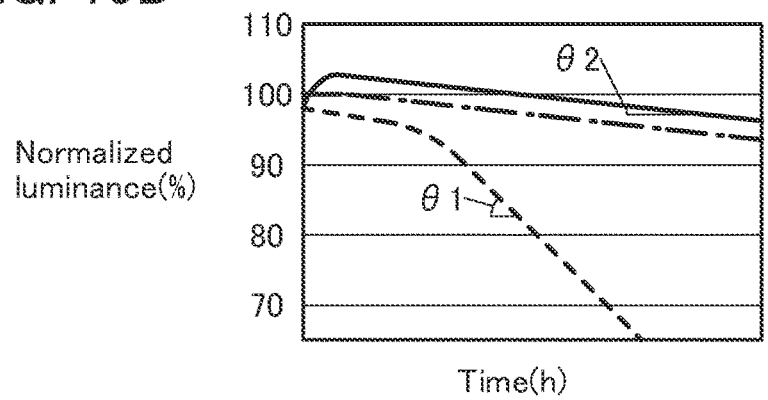
FIG. 19D is a diagram showing normalized luminance over time of the light-emitting device.

Here, normalized luminance with time of the light-emitting device of this embodiment and a comparative light-emitting device is described with reference to FIG. 19D. In FIG. 19D, a thick solid line and a thick dashed-dotted line are each a decay curve of normalized luminance of the light-emitting device of this embodiment, and a thick dashed line is a decay curve of normalized luminance of the comparative light-emitting device.

As shown in FIG. 19D, the slope of the decay curve of normalized luminance is different between the light-emitting device of this embodiment and the comparative light-emitting device. Specifically, a slope $\theta 2$ of the decay curve of the light-emitting device of this embodiment is smaller than a slope $\theta 1$ of the decay curve of the comparative light-emitting device.

As shown in FIG. 19D, the light-emitting device of one embodiment of the present invention may have a local maximum value in the decay curve of luminance (the thick solid line) obtained in a driving test under a condition with a fixed current density. In other words, the light-emitting device of one embodiment of the present invention may show a behavior of luminance increase with time. This behavior can cancel out rapid degradation at the initial driving stage (i.e., initial decay). Note that the light-emitting device of one embodiment of the present invention is not limited to the above; for example, as indicated by the thick dashed-dotted line in FIG. 19D, the luminance does not have a local maximum value, that is, the slope of the decay curve can be smaller without the luminance increase. Thus, when a light-emitting device has the structure showing the behavior, the light-emitting device can have a small initial decay and an extremely long driving lifetime.

A differential value of such a decay curve having a local maximum value is 0 in a part. Therefore, a light-emitting device having a decay curve whose differential value is 0 in a part can be referred to as a light-emitting device of one embodiment of the present invention.

In the light-emitting device of one embodiment of the present invention, the electron-transport layer 124 preferably includes a portion where the mixture ratio (concentrations) of the electron-transport material and the first substance varies in the thickness direction. Specifically, the electron-transport layer 124 preferably includes a portion where the mixture ratio (concentrations) of the electron-transport material and a metal, a metallic salt, a metal oxide, or an organometallic complex varies.

The concentration of the first substance in the electron-transport layer 124 can be estimated from the amount of atoms and molecules detected by time-of-flight secondary ion mass spectrometry (ToF-SIMS). In portions that contain the same two kinds of materials with different mixture ratios, values measured by ToF-SIMS analysis correspond to the amounts of target atoms or molecules. Therefore, comparing the detected amounts of the electron-transport material and the organometallic complex allows estimation of their mixture ratio.

The content of the first substance in the electron-transport layer 124 is preferably smaller on the cathode 102 side than on the anode 101 side. In other words, the electron-transport layer 124 is preferably formed such that the concentration of the first substance increases from the cathode 102 side to the anode 101 side. That is, the electron-transport layer 124 includes a portion with a low concentration of the electron-transport material on a side closer to the light-emitting layer 123 than a portion with a high concentration of the electron-transport material is. In other words, the electron-transport layer 124 includes a portion with a high concentration of the first substance on a side closer to the light-emitting layer 123 than a portion with a low concentration of the first substance is.

In the electron-transport layer 124, the electron mobility of the portion with a high concentration of the electron-transport material (the portion with a low concentration of the first substance) is preferably higher than or equal to $1 \times 10^{-7}$ cm$^2$/Vs and lower than or equal to $5 \times 10^{-5}$ cm$^2$/Vs when the square root of the electric field strength [V/cm] is 600.

Figure 20A:
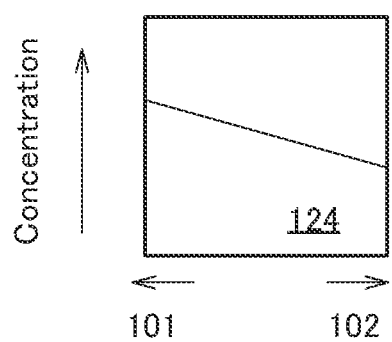
FIG. 20A to FIG. 20D are diagrams showing the concentration of a first substance in an electron-transport layer.
Figure 20B:
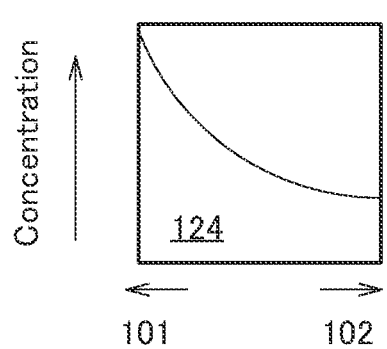
Figure 20C:
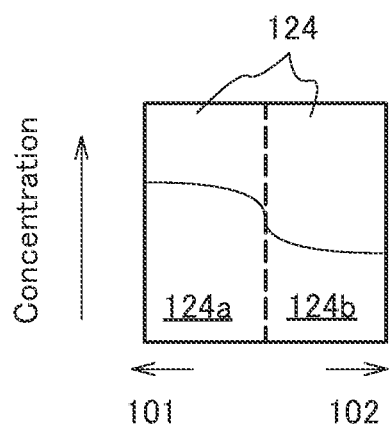
Figure 20D:
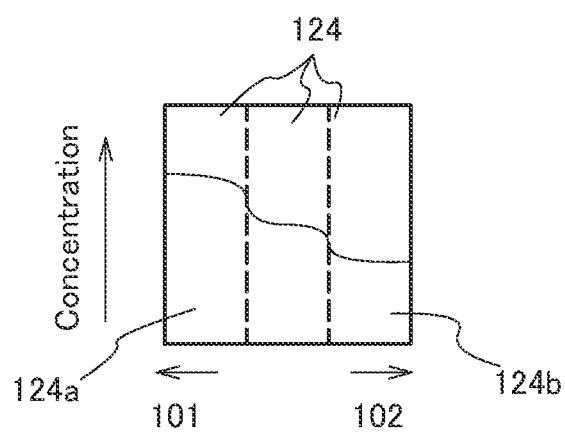

For example, the content (concentration) of the first substance in the electron-transport layer 124 can be as shown in each of FIG. 20A to FIG. 20D. Note that FIG. 20A and FIG. 20B show the case where no clear boundary exists in the electron-transport layer 124, and FIG. 20C and FIG. 20D show the case where a clear boundary exists in the electron-transport layer 124.

In the case where no clear boundary exists in the electron-transport layer 124, the concentrations of the electron-transport material and the first substance change continuously as shown in FIG. 20A and FIG. 20B. Meanwhile, in the case where a clear boundary exists in the electron-transport layer 124, the concentrations of the electron-transport material and the first substance change in a step-like manner as shown in FIG. 20C and FIG. 20D. The case where the concentrations of the electron-transport material and the first substance change in a step-like manner suggests that the electron-transport layer 124 is formed of a plurality of layers. For example, FIG. 20C shows the case where the electron-transport layer 124 has a two-layer structure, and FIG. 20D shows the case where the electron-transport layer 124 has a three-layer structure. Note that in FIG. 20C and FIG. 20D, a dashed line indicates a boundary region between a plurality of layers.

A change in carrier balance in the light-emitting device of one embodiment of the present invention is probably caused by a change in electron mobility of the electron-transport layer 124.

In the light-emitting device of one embodiment of the present invention, there is a concentration difference of the first substance in the electron-transport layer 124. The electron-transport layer 124 includes a region with a high concentration of the first substance between a region with a low concentration of the first substance and the light-emitting layer 123. That is, the region with a low concentration of the first substance is positioned closer to the cathode 102 than the region with a high concentration is.

The light-emitting device of one embodiment of the present invention having the above structure has an extremely long lifetime. In particular, the time taken for the luminance to decrease to 95% with the initial luminance being 100% (the time can also be referred to as LT95) can be extremely long.

This embodiment can be combined with the other embodiments as appropriate.

Embodiment 4

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

A crystal structure of a film or a substrate can be analyzed with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is presumed that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. Furthermore, a pentagonal or heptagonal lattice arrangement, for example, is included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (On/Off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{out}$), high field-effect mobility ($\mu$), and excellent switching operation can be achieved.

A transistor using a CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. Thus, a transistor using an oxide semiconductor containing nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 5

In this embodiment, electronic devices of embodiments of the present invention will be described with reference to FIG. 21 to FIG. 23.

An electronic device in this embodiment includes a display apparatus of one embodiment of the present invention. For example, the display apparatus of one embodiment of the present invention can be used in a display portion of the electronic device. The display apparatus of one embodiment of the present invention has a function of detecting light, and thus can perform biological authentication with the display portion or detect touch (contact or a near touch) on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 21A:
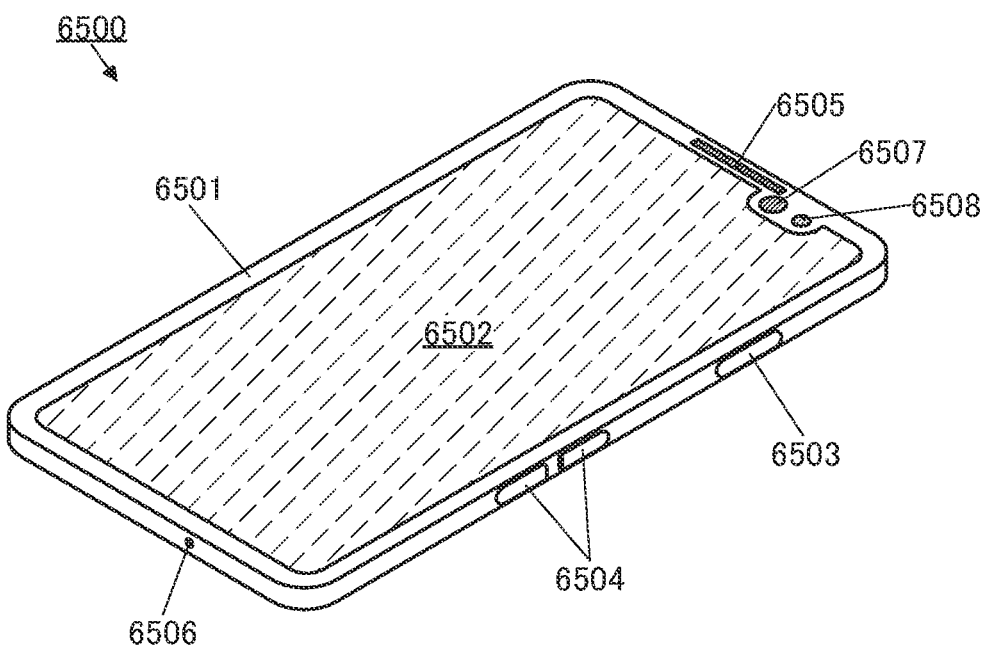
FIG. 21A and FIG. 21B are diagrams illustrating an example of an electronic device.

An electronic device 6500 illustrated in FIG. 21A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 21B:
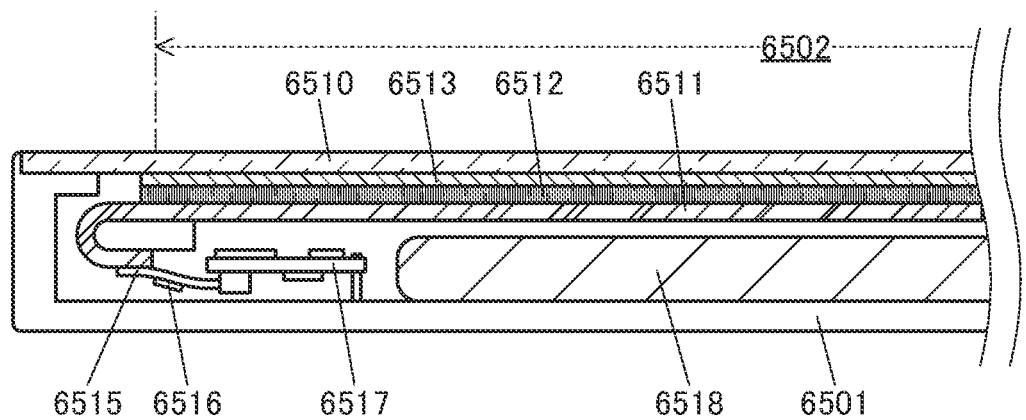

FIG. 21B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Using the display apparatus of one embodiment of the present invention as the display panel 6511 allows image capturing on the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 22A:
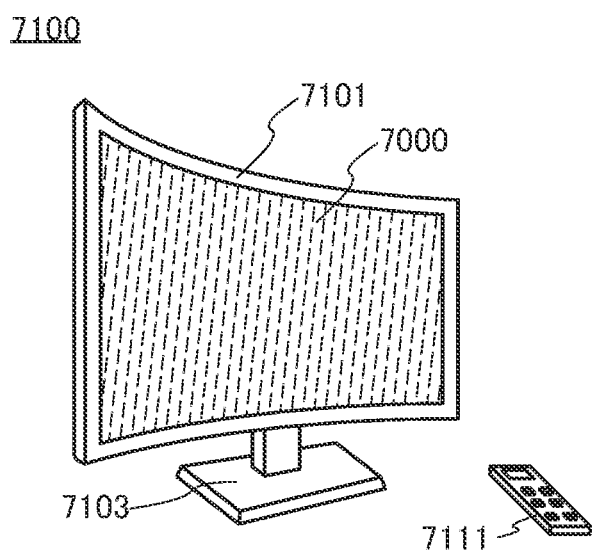
FIG. 22A to FIG. 22D are diagrams illustrating examples of electronic devices.

FIG. 22A illustrates an example of a television device. In a television device 7100, a display portion 7000 is incorporated in a housing 7101. Here, a structure in which the housing 7101 is supported by a stand 7103 is illustrated.

A display device of one embodiment of the present invention can be used in the display portion 7000.

Operation of the television device 7100 illustrated in FIG. 22A can be performed with an operation switch provided in the housing 7101 or a separate remote controller 7111. Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 22B:
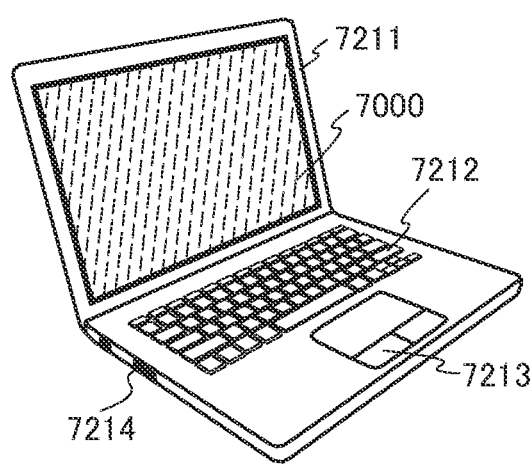

FIG. 22B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

A display apparatus of one embodiment of the present invention can be used in the display portion 7000.

Figure 22C:
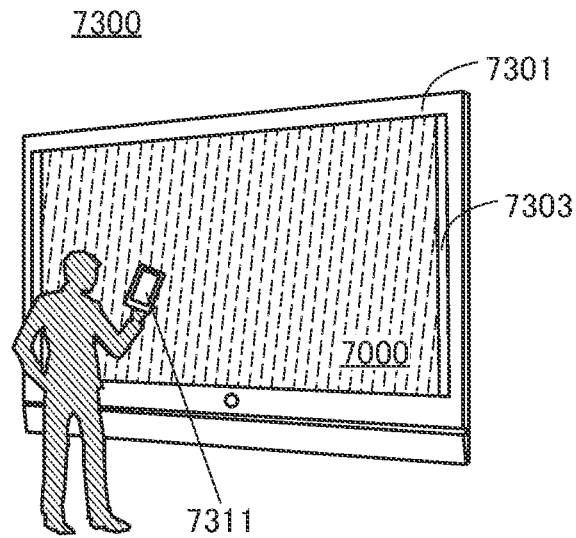
Figure 22D:
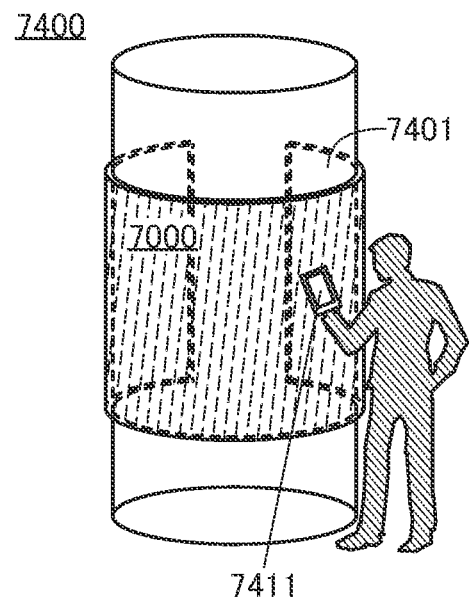

FIG. 22C and FIG. 22D illustrate examples of digital signage.

Digital signage 7300 illustrated in FIG. 22C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 22D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 22C and FIG. 22D.

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 22C and FIG. 22D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 23A to FIG. 23F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIG. 23A to FIG. 23F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 23A to FIG. 23F are described below.

Figure 23A:
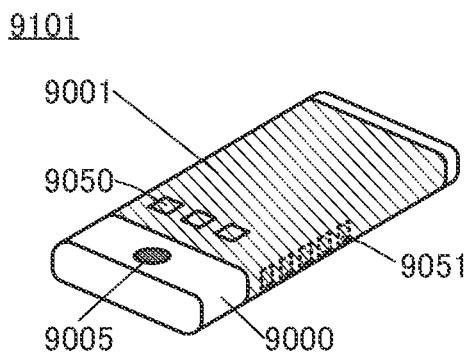
FIG. 23A to FIG. 23F are diagrams illustrating examples of electronic devices.

FIG. 23A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, and the like. The portable information terminal 9101 can display characters and image information on its plurality of surfaces. FIG. 23A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 23B:
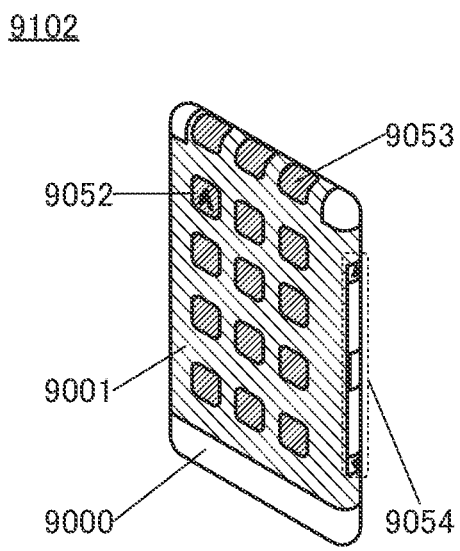

FIG. 23B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 23C:
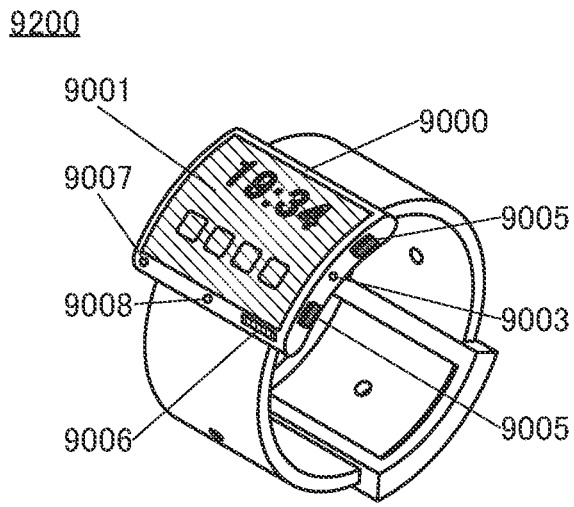

FIG. 23C is a perspective view illustrating a watch-type portable information terminal 9200. For example, the portable information terminal 9200 can be used as a smartwatch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 23D:
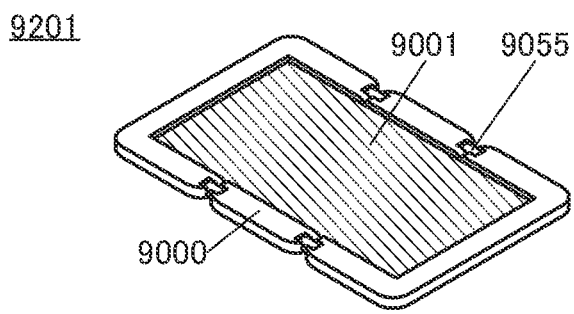
Figure 23E:
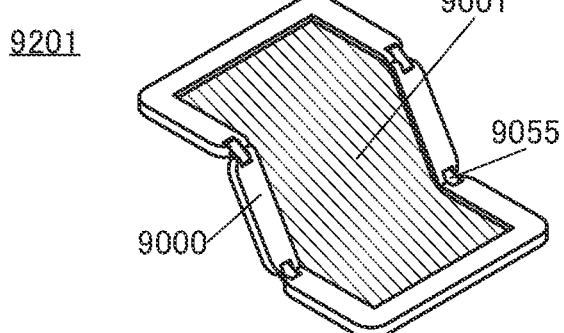
Figure 23F:
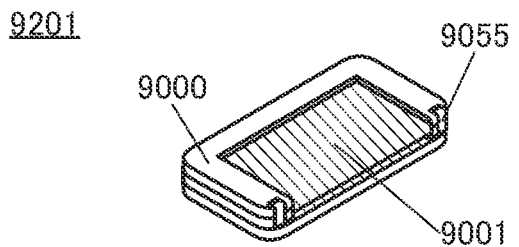

FIG. 23D to FIG. 23F are perspective views illustrating a foldable portable information terminal 9201. FIG. 23D is a perspective view of an opened state of the portable information terminal 9201, FIG. 23F is a perspective view of a folded state thereof, and FIG. 23E is a perspective view of a state in the middle of change from one of FIG. 23D and FIG. 23F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

This embodiment can be combined with the other embodiments as appropriate.

REFERENCE NUMERALS

C1$b$: capacitor, C1$g$: capacitor, C1$r$: capacitor, C2$b$: capacitor, C2$g$: capacitor, C2$r$: capacitor, Cf: capacitor, GL1: wiring, GL2: wiring, M1B: transistor, M1G: transistor, M1R: transistor, M2B: transistor, M2G: transistor, M2R: transistor, M3B: transistor, M3G: transistor, M3R: transistor, M4B: transistor, M4G: transistor, M4R: transistor, M11: transistor, M12: transistor, M13: transistor, M14: transistor, RS: wiring, SE: wiring, SLB: wiring, SLG: wiring, SLR: wiring, TX: wiring, V0: wiring, VCP: wiring, VPI: wiring, VRS: wiring, WX: wiring, 10A: display apparatus, 10B: display apparatus, 10C: display apparatus, 21B: light, 21G: light, 21R: light, 22: light, 23: light, 24: reflected light, 42: transistor, 47B: light-emitting device, 47G: light-emitting device, 47R: light-emitting and light-receiving device, 50A: display apparatus, 50B: display apparatus, 51: substrate, 52: finger, 53: layer including light-emitting and light-receiving device, 55: layer including transistor, 57: layer including light-emitting device, 59: substrate, 100A: display apparatus, 100B: display apparatus, 100C: display apparatus, 101: anode, 102: cathode, 103: EL layer, 103$a$: EL layer, 103$b$: EL layer, 104: charge-generation layer, 112: common layer, 114: common layer, 115: common electrode, 121: hole-injection layer, 122: hole-transport layer, 122$a$: hole-transport layer, 122$b$: hole-transport layer, 123: light-emitting layer, 123-1: light-emitting region, 124: electron-transport layer, 124-1: region, 124$a$: electron-transport layer, 124$b$: electron-transport layer, 125: electron-injection layer, 142: adhesive layer, 143: space, 151: substrate, 152: substrate, 153: substrate, 154: substrate, 155: adhesive layer, 162: display portion, 164: circuit, 165: wiring, 166: conductive layer, 172: FPC, 173: IC, 180: first electrode, 181: hole-injection layer, 182: hole-transport layer, 182B: hole-transport layer, 182G: hole-transport layer, 182R: hole-transport layer, 183: active layer, 184: electron-transport layer, 185: electron-injection layer, 186: layer serving as both light-emitting layer and active layer, 189: second electrode, 190: light-emitting device, 190B: light-emitting device, 190G: light-emitting device, 190R•PD: light-emitting and light-receiving device, 191: pixel electrode, 192: buffer layer, 192B: buffer layer, 192G: buffer layer, 192R: buffer layer, 193: light-emitting layer, 193B: light-emitting layer, 193G: light-emitting layer, 193R: light-emitting layer, 194: buffer layer, 194B: buffer layer, 194G: buffer layer, 194R: buffer layer, 195: protective layer, 201: transistor, 204: connection portion, 205: transistor, 206: transistor, 207: transistor, 208: transistor, 209: transistor, 210: transistor, 211: insulating layer, 212: insulating layer, 213: insulating layer, 214: insulating layer, 215: insulating layer, 216: partition, 217: partition, 218: insulating layer, 221: conductive layer, 222$a$: conductive layer, 222$b$: conductive layer, 223: conductive layer, 225: insulating layer, 228: region, 231: semiconductor layer, 231$i$: channel formation region, 231$n$: low-resistance region, 242: connection layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:
1. A display apparatus comprising:
a pixel;
a first wiring;
a second wiring; and
a third wiring,
wherein the pixel comprises a first subpixel,
wherein the first subpixel comprises first to eighth transistors, a first capacitor, and a light-emitting and light-receiving device,
wherein one of a source and a drain of the first transistor is electrically connected to the first wiring, and the other of the source and the drain of the first transistor is electrically connected to a gate of the second transistor and a first electrode of the first capacitor,
wherein a first electrode of the light-emitting and light-receiving device is electrically connected to one of a source and a drain of the second transistor, one of a source and a drain of the third transistor, and one of a source and a drain of the fifth transistor,
wherein one of a source and a drain of the fourth transistor is electrically connected to the second wiring, and the other of the source and the drain of the fourth transistor is electrically connected to the other of the source and the drain of the third transistor and a second electrode of the first capacitor,
wherein the other of the source and the drain of the fifth transistor is electrically connected to one of a source and a drain of the sixth transistor and a gate of the seventh transistor,
wherein one of a source and a drain of the seventh transistor is electrically connected to one of a source and a drain of the eighth transistor,
wherein the other of the source and the drain of the eighth transistor is electrically connected to the third wiring, and
wherein the light-emitting and light-receiving device is configured to emit light of a first color and receive light of a second color.

2. The display apparatus according to claim 1,
wherein the first wiring is configured to be supplied with a first data potential,
wherein the second wiring is configured to be supplied with a second data potential in a first period and a reset potential in a second period, and
wherein the third wiring is configured to be supplied with a potential corresponding to charge generated in the light-emitting and light-receiving device.

3. The display apparatus according to claim 1, further comprising fourth to eighth wirings,
wherein a gate of the first transistor and a gate of the third transistor are electrically connected to the fourth wiring,
wherein a gate of the fourth transistor is electrically connected to the fifth wiring,
wherein a gate of the fifth transistor is electrically connected to the sixth wiring,
wherein a gate of the sixth transistor is electrically connected to the seventh wiring, and
wherein a gate of the eighth transistor is electrically connected to the eighth wiring.

4. The display apparatus according to claim 1,
wherein the first subpixel further comprises a second capacitor,
wherein a first electrode of the second capacitor is electrically connected to the other of the source and the drain of the first transistor, the gate of the second transistor, and the first electrode of the first capacitor, and
wherein a second electrode of the second capacitor is electrically connected to the first electrode of the light-emitting and light-receiving device, the one of the source and the drain of the second transistor, the one of the source and the drain of the third transistor, and the one of the source and the drain of the fifth transistor.

5. The display apparatus according to claim 1, further comprising a ninth wiring,
wherein the pixel further comprises a second subpixel,
wherein the second subpixel comprises ninth to eleventh transistors and a light-emitting device,
wherein one of a source and a drain of the ninth transistor is electrically connected to the ninth wiring and the other of the source and the drain of the ninth transistor is electrically connected to a gate of the tenth transistor,
wherein a first electrode of the light-emitting device is electrically connected to one of a source and a drain of the tenth transistor and one of a source and a drain of the eleventh transistor, and
wherein the light-emitting device is configured to emit light of the second color.

6. The display apparatus according to claim 5,
wherein the second subpixel further comprises a twelfth transistor, and
wherein one of a source and a drain of the twelfth transistor is electrically connected to the second wiring and the other of the source and the drain of the twelfth transistor is electrically connected to the other of the source and the drain of the eleventh transistor.

7. The display apparatus according to claim 5,
wherein the other of the source and the drain of the eleventh transistor is electrically connected to the second wiring.

8. The display apparatus according to claim 5,
wherein the light-emitting and light-receiving device and the light-emitting device are provided on the same plane.

9. The display apparatus according to claim 5,
wherein the light-emitting device comprises a hole-injection layer, a light-emitting layer, and an electron transport layer,
wherein the hole-injection layer contains a first compound and a second compound,
wherein the electron-transport layer contains an electron-transport material,
wherein the first compound has a property of accepting an electron from the second compound,
wherein the second compound has a HOMO level higher than or equal to −5.7 eV and lower than or equal to −5.4 eV, and
wherein the electron-transport material has a HOMO level higher than or equal to −6.0 eV and an electron mobility higher than or equal to $1 \times 10^{-7}$ cm$^2$/Vs and lower than or equal to $5 \times 10^{-5}$ cm$^2$/Vs when the square root of electric field strength [V/cm] is 600.

10. The display apparatus according to claim 5,
wherein the light-emitting device comprises a light-emitting layer and an electron-transport layer,
wherein the electron-transport layer contains an electron-transport material and a first substance,
wherein the first substance comprises one of a metal, a metallic salt, a metal oxide, and an organometallic complex, wherein the electron-transport layer comprises a first region and a second region, and wherein the first region and the second region differ in a concentration of the first substance.

11. The display apparatus according to claim 1, further comprising a substrate having flexibility, and wherein the first to eighth transistors are positioned over the substrate.

12. A display module comprising the display apparatus according to claim 1 and a connector or an integrated circuit.

13. An electronic device comprising the display module according to claim 12 and at least one of an antenna, a battery, a housing, a camera, a speaker, a microphone, and an operation button.

* * * * *